United States Patent
Takizawa et al.

(10) Patent No.: US 9,069,246 B2
(45) Date of Patent: Jun. 30, 2015

(54) ACTINIC RAY-SENSITIVE OR RADIATION-SENSITIVE RESIN COMPOSITION, PATTERN FORMING METHOD AND RESIST FILM USING THE COMPOSITION, AND ELECTRONIC DEVICE MANUFACTURING METHOD AND ELECTRONIC DEVICE USING THESE

(71) Applicant: FUJIFILM CORPORATION, Tokyo (JP)

(72) Inventors: Hiroo Takizawa, Shizuoka (JP); Tomotaka Tsuchimura, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/458,660

(22) Filed: Aug. 13, 2014

(65) Prior Publication Data

US 2014/0349221 A1    Nov. 27, 2014

Related U.S. Application Data

(63) Continuation of application No. PCT/JP2013/050675, filed on Jan. 16, 2013.

(30) Foreign Application Priority Data

Feb. 16, 2012    (JP) ................... 2012-032099

(51) Int. Cl.
G03F 7/004 (2006.01)
G03F 7/027 (2006.01)
G03F 7/038 (2006.01)
G03F 7/039 (2006.01)

(52) U.S. Cl.
CPC ............. *G03F 7/027* (2013.01); *G03F 7/004* (2013.01); *G03F 7/038* (2013.01); *G03F 7/039* (2013.01); *G03F 7/0045* (2013.01); *G03F 7/0046* (2013.01); *G03F 7/0382* (2013.01); *G03F 7/0397* (2013.01)

(58) Field of Classification Search
CPC ....... G03F 7/004; G03F 7/038; G03F 7/0382; G03F 7/039; G03F 7/0392
USPC ..................... 430/270.1, 325, 326
See application file for complete search history.

(56) References Cited

U.S. PATENT DOCUMENTS

| | | | |
|---|---|---|---|
| 2005/0053861 A1* | 3/2005 | Yoneda et al. | ......... 430/270.1 |
| 2007/0141512 A1 | 6/2007 | Wada et al. | |
| 2011/0008735 A1 | 1/2011 | Ohsawa et al. | |
| 2011/0318542 A1 | 12/2011 | Mori et al. | |

FOREIGN PATENT DOCUMENTS

| | | |
|---|---|---|
| JP | 2007-199692 A | 8/2007 |
| JP | 2010-150367 A | 7/2010 |
| JP | 2011-16746 A | 1/2011 |

OTHER PUBLICATIONS

International Search Report dated Feb. 19, 2013 issued in International Application No. PCT/JP2013/050675 (PCT/ISA/210).
Written Opinion dated Feb. 19, 2013 issued in International Application No. PCT/JP2013/050675 (PCT/ISA/237).
Communication from the Japanese Patent Office dated Sep. 9, 2014, in a counterpart Japanese application No. 2012-032099.

\* cited by examiner

*Primary Examiner* — John A McPherson
(74) *Attorney, Agent, or Firm* — Sughrue Mion, PLLC

(57) ABSTRACT

An actinic ray-sensitive or radiation-sensitive resin composition containing a compound capable of generating an acid upon irradiation with an actinic ray or radiation, represented by the formula (Z1), and the formula (Z1) is defined as herein,

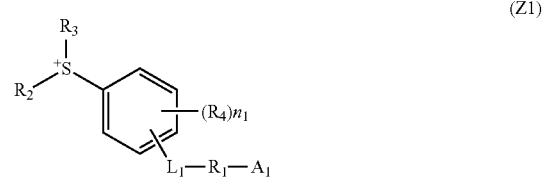

(Z1)

and a resist film formed using the actinic ray-sensitive or radiation-sensitive resin composition, a pattern forming method comprising a step of forming a film by using the actinic ray-sensitive or radiation-sensitive resin composition, a step of exposing the film, and a step of developing the exposed film, a method for manufacturing an electronic device, comprising the pattern forming method, and an electronic device manufactured by the method for manufacturing an electronic device.

14 Claims, No Drawings

ACTINIC RAY-SENSITIVE OR RADIATION-SENSITIVE RESIN COMPOSITION, PATTERN FORMING METHOD AND RESIST FILM USING THE COMPOSITION, AND ELECTRONIC DEVICE MANUFACTURING METHOD AND ELECTRONIC DEVICE USING THESE

CROSS REFERENCE TO RELATED APPLICATION

This is a continuation of International Application No. PCT/JP2013/050675 filed on Jan. 16, 2013, and claims priority from Japanese Patent Application No. 2012-032099 filed on Feb. 16, 2012, the entire disclosures of which are incorporated therein by reference.

TECHNICAL FIELD

The present invention relates to an actinic ray-sensitive or radiation-sensitive resin composition capable of undergoing a reaction upon irradiation with an actinic ray or radiation to cause a change in the property, a pattern forming method and a resist film using the composition, and an electronic device manufacturing method and an electronic device using the composition, method or film. More specifically, the present invention relates to an actinic ray-sensitive or radiation-sensitive resin composition for use in the production process of a semiconductor such as IC, in the production of a liquid crystal device or a circuit board such as thermal head, in the fabrication of an imprint mold structure, in other photo-fabrication processes, or in a lithographic printing plate or an acid-curable composition, a pattern forming method and a resist film using the composition, and an electronic device manufacturing method and an electronic device using the composition, method or film.

BACKGROUND ART

A chemical amplification resist composition is a pattern forming material for forming a pattern on a substrate by producing an acid in the exposed area upon irradiation with radiation such as far ultraviolet light and through a reaction using the acid as a catalyst, changing the developer solubility of the area irradiated with an actinic ray and that of the non-irradiated area.

In the case of using a KrF excimer laser as the exposure light source, a resin having small absorption in the wavelength region of 248 nm and having a basic framework of poly(hydroxystyrene) is predominantly used as the main component, and this is an excellent system capable of forming a good pattern with high sensitivity and high resolution, compared with the conventional naphthoquinone diazide/novolak resin system.

On the other hand, in the case where a light source of emitting light at a shorter wavelength, for example, an ArF excimer laser (193 nm), is used as the exposure light source, a satisfactory pattern cannot be formed even by the above-described chemical amplification system, because the compound having an aromatic group substantially has large absorption in the region of 193 nm.

In order to solve this problem, a resist composition for ArF excimer laser, containing a resin having an alicyclic hydrocarbon structure, has been developed.

As a photoacid generator that is a major constituent component of the chemical amplification resist composition, a triphenylsulfonium salt is generally known.

Furthermore, in the case of using a light source of electron beam, X-ray, EUV or the like, the exposure is performed under vacuum and therefore, an outgassing problem that a low-boiling-point compound such as solvent or a resist material decomposed by high energy volatizes and contaminates the exposure apparatus, becomes serious. Various studies for reducing outgassing are recently proceeding, and improvements have been also proposed on the photoacid generator. In addition, it is demanded to develop a photosensitive composition enhanced in the sensitivity, resolution, pattern profile, roughness performance and the like by not only reducing outgassing but also improving the photoacid generator.

For example, from the standpoint of enhancing the sensitivity, dissolution contrast, exposure latitude, roughness performance and the like, Patent Document 1 describes a photoacid generator capable of being decomposed by an acid, but more improvements are demanded in terms of dissolution contrast, developability and the like.

Among others, as the pattern dimension is smaller, the roughness property and resolution become more important. In this connection, lithography with an X-ray, an electron beam or EUV aims at forming a fine pattern of several tens of nm and therefore, the composition is required to be excellent particularly in the resolution and roughness performance.

For example, in Patent Document 2, from the standpoint of, despite low sensitivity, enhancing the resolution, roughness performance, exposure latitude and the like, a sulfonium salt having a specific betaine structure is disclosed as a photoacid generator.

However, there is a problem in the sensitivity and accordingly, in the aging stability of sensitivity.

With respect to sensitivity, an elevation of the sensitivity is a very important issue for shortening the wafer processing time, but when higher sensitivity is pursued, the pattern profile or resolution indicated by a limiting resolution line width is deteriorated, and it is strongly desired to develop a resist composition satisfying all of these properties at the same time.

High sensitivity is in a trade-off relationship with high resolution and good pattern profile, and an important issue is how to satisfy these properties at the same time. This issue needs to be solved.

RELATED ART

Patent Document

Patent Document 1: JP-A-2007-199692 (the term "JP-A" as used herein means an "unexamined published Japanese patent application")
Patent Document 2: JP-A-2011-16746

SUMMARY OF THE INVENTION

Problems that the Invention is to Solve

An object of the present invention is to provide an actinic ray-sensitive or radiation-sensitive resin composition excellent in sensitivity, resolution, roughness performance and aging stability and less likely to cause outgassing, a pattern forming method and a resist film using the composition, and an electronic device manufacturing method and an electronic device using the composition, method or film.

Means for Solving the Problems

The above-described issue can be solved by the present invention characterized in the following configurations.

[1] An actinic ray-sensitive or radiation-sensitive resin composition containing a compound capable of generating an acid upon irradiation with an actinic ray or radiation, represented by the following formula (Z1):

[Chem.1]

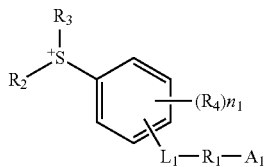

(Z1)

in formula (Z1),
$L_1$ represents —O—, —S—, —OS(=O)$_2$—, —S(=O)$_2$O—, —OC(=O)—, —C(=O)O—, —S(=O)—, —S(=O)$_2$—, —C(=O)—, —N($R_7$)C(=O)—, —C(=O)N($R_7$)—, —N($R_7$)S(=O)$_2$— or —S(=O)$_2$N($R_7$)— (in all of these, the right side is the $R_1$ side), wherein $R_7$ represents a hydrogen atom, an alkyl group or a cycloalkyl group;

$R_1$ represents an alkylene group, a cycloalkylene group, an arylene group or a divalent group formed by the combination thereof, and —O—, —C(=O)—, —S(=O)$_2$— or —S— may be inserted between the groups;

$A_1$ represents —SO$_3^-$, —SO$_2$N$^-$SO$_2$R$_8$ or —SO$_2$C$^-$(SO$_2$R$_9$)$_2$, wherein $R_8$ represents an alkyl group, a cycloalkyl group or an aryl group, $R_9$ represents an alkyl group, a cycloalkyl group or an aryl group, and two $R_9$ may be the same or different;

each of $R_2$ and $R_3$ independently represents an alkyl group, an alkenyl group, a cycloalkyl group, an aryl group or a heterocyclic group;

$R_4$ represents a monovalent substituent, $n_1$ represents an integer of 0 to 4, and when $n_1$ is 2 or more, each $R_4$ may be the same as or different from every other $R_4$; and $R_2$ and $R_3$, $R_2$ and $R_4$, $R_3$ and $R_4$, $R_2$ and the benzene ring in formula (Z1), $R_3$ and the benzene ring, or $R_4$ and $R_4$ when $n_1$ is 2 or more, may combine with each other to form a ring, provided that with respect to the benzene ring in formula (Z1), when -$L_1$-$R_1$-$A_1$ is substituted at the para-position relative to sulfonium (S$^+$), $L_1$ is not an oxygen atom (—O—).

[2] The actinic ray-sensitive or radiation-sensitive resin composition as described in [1], wherein the compound represented by formula (Z1) is a compound represented by the following formula (Z2):

[Chem. 2]

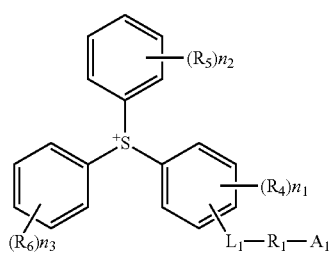

(Z2)

in formula (Z2),
$L_1$, $R_1$, $A_1$, $R_4$ and $n_1$ have the same meanings as $L_1$, $R_1$, $A_1$, $R_4$ and $n_1$ in formula (Z1);

each of $R_5$ and $R_6$ independently represents a monovalent substituent, and each of $n_2$ and $n_3$ independently represents an integer of 0 to 5; and the plurality of $R_4$ when $n_1$ is 2 or more, the plurality of $R_5$ when $n_2$ is 2 or more, or the plurality of $R_6$ when $n_3$ is 2 or more, may be the same or different and may combine with each other to form a ring, $R_4$ and $R_5$, $R_5$ and $R_6$, or $R_4$ and $R_6$ may combine with each other to form a ring, and in this case, each of $R_4$, $R_5$ and $R_6$ may be a single bond;

provided that with respect to the benzene ring in formula (Z2) to which -$L_1$-$R_1$-$A_1$ is bonded, when -$L_1$-$R_1$-$A_1$ is substituted at the para-position relative to S$^+$, $L_1$ is not —O—.

[3] The actinic ray-sensitive or radiation-sensitive resin composition as described in [1] or [2],
wherein with respect to the benzene ring in formula (Z1) or (Z2) to which -$L_1$-$R_1$-$A_1$ is bonded, when -$L_1$-$R_1$-$A_1$ is substituted at the para-position relative to S$^+$, $L_1$ is —S—, —OS(=O)$_2$—, —S(=O)$_2$O—, —OC(=O)—, —C(=O)O—, —S(=O)—, —S(=O)$_2$—, —C(=O)—, —N($R_7$)C(=O)—, —C(=O)N($R_7$)—, —N($R_7$)S(=O)$_2$— or —S(=O)$_2$N($R_7$)—.

[4] The actinic ray-sensitive or radiation-sensitive resin composition as described in [3],
wherein with respect to the benzene ring in formula (Z1) or (Z2) to which -$L_1$-$R_1$-$A_1$ is bonded, -$L_1$-$R_1$-$A_1$ is substituted at the para-position relative to S$^+$ and $L_1$ is —S—, —OS(=O)$_2$—, —S(=O)$_2$O—, —OC(=O)— or —C(=O)O—.

[5] The actinic ray-sensitive or radiation-sensitive resin composition as described in [1] or [2],
wherein with respect to the benzene ring in formula (Z1) or (Z2) to which -$L_1$-$R_1$-$A_1$ is bonded, -$L_1$-$R_1$-$A_1$ is substituted at the meta- or ortho-position relative to S$^+$.

[6] The actinic ray-sensitive or radiation-sensitive resin composition as described in any one of [1] to [5],
wherein $A_1$ in formula (Z1) or (Z2) is —SO$_3^-$.

[7] The actinic ray-sensitive or radiation-sensitive resin composition as described in any one of [1] to [6], further containing a resin capable of decomposing by an action of an acid to increase the solubility in an alkali developer.

[8] The actinic ray-sensitive or radiation-sensitive resin composition as described in any one of [1] to [6], further containing a resin soluble in an alkali developer and an acid crosslinking agent that is caused to crosslink with the resin soluble in an alkali developer by an action of an acid.

[9] A resist film formed using the actinic ray-sensitive or radiation-sensitive resin composition described in any one of [1] to [8].

[10] A pattern forming method comprising a step of forming a film by using the actinic ray-sensitive or radiation-sensitive resin composition described in any one of [1] to [8], a step of exposing the film, and a step of developing the exposed film.

[11] The pattern forming method as described in [10], wherein the exposure is performed using an X-ray, an electron beam or EUV.

[12] A method for manufacturing an electronic device, comprising the pattern forming method described in [10] or [11].

[13] An electronic device manufactured by the method for manufacturing an electronic device described in [12].

The present invention preferably further includes the following configurations.

[14] The actinic ray-sensitive or radiation-sensitive resin composition as described in any one of [1] to [8], wherein $R_1$ in formula (Z1) or (Z2) is an alkylene group, a partially or wholly fluorinated alkylene group, an arylene group, or a partially or wholly fluorinated arylene group.

[15] The actinic ray-sensitive or radiation-sensitive resin composition as described in any one of [1] to [8] and [14], wherein the monovalent substituent $R_4$, $R_5$ or $R_6$ in formula (Z1) or (Z2) is an alkyl group, a cycloalkyl group, an aryl group, a halogen atom, a hydroxyl group, an alkoxy group, an alkoxycarbonyl group or an arylthio group.

[16] The actinic ray-sensitive or radiation-sensitive resin composition as described in [7], wherein the resin capable of decomposing by an action of an acid to increase the solubility in an alkali developer contains a repeating unit having an acid-decomposable group.

Advantage of the Invention

According to the present invention, an actinic ray-sensitive or radiation-sensitive resin composition excellent in sensitivity, resolution, roughness performance and aging stability and less likely to cause outgassing, a pattern forming method and a resist film using the composition, and an electronic device manufacturing method and an electronic device using the composition, method or film, can be provided.

MODE FOR CARRYING OUT THE INVENTION

The present invention is described in detail below.

In the description of the present invention, when a group (atomic group) is denoted without specifying whether substituted or unsubstituted, the group encompasses both a group having no substituent and a group having a substituent. For example, "an alkyl group" encompasses not only an alkyl group having no substituent (unsubstituted alkyl group) but also an alkyl group having a substituent (substituted alkyl group).

The term "actinic ray" or "radiation" as used in the description of the present invention means, for example, a bright line spectrum of mercury lamp, a far ultraviolet ray typified by excimer laser, an extreme-ultraviolet ray (EUV light), an X-ray, or an electron beam (EB). Also, in the present invention, the "light" means an actinic ray or radiation.

In addition, unless otherwise indicated, the "exposure" as used in the description of the present invention encompasses not only exposure to a mercury lamp, a far ultraviolet ray typified by excimer laser, an extreme-ultraviolet ray, an X-ray, EUV light or the like but also lithography with a particle beam such as electron beam and ion beam.

The actinic ray-sensitive or radiation-sensitive resin composition of the present invention contains, as an acid generator, a compound capable of generating an acid upon irradiation with an actinic ray or radiation, represented by the following formula (Z1) (hereinafter, sometimes simply referred to as "acid generator (A1)", "photoacid generator (A1)" or "compound (A1)"):

[Chem. 3]

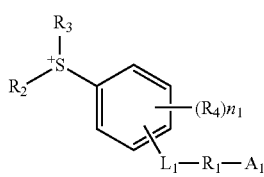

In formula (Z1),
$L_1$ represents —O—, —S—, —OS(=O)$_2$—, —S(=O)$_2$O—, —OC(=O)—, —C(=O)O—, —S(=O)—, —S(=O)$_2$—, —C(=O)—, —N(R$_7$)C(=O)—, —C(=O)N(R$_7$)—, —N(R$_7$)S(=O)$_2$— or —S(=O)$_2$N(R$_7$)— (in all of these, the right side is the $R_1$ side), wherein $R_7$ represents a hydrogen atom, an alkyl group or a cycloalkyl group.

However, with respect to the benzene ring in formula (Z1), when -L$_1$-R$_1$-A$_1$ is substituted at the para-position relative to sulfonium (S$^+$), $L_1$ is not an oxygen atom (—O—).

$R_1$ represents an alkylene group, a cycloalkylene group, an arylene group or a divalent group formed by the combination thereof, and —O—, —C(=O)—, —S(=O)$_2$— or —S— may be inserted between the groups.

$A_1$ represents —SO$_3^-$, —SO$_2$N$^-$SO$_2$R$_8$ or —SO$_2$C$^-$(SO$_2$R$_9$)$_2$, wherein $R_8$ represents an alkyl group, a cycloalkyl group or an aryl group, $R_9$ represents an alkyl group, a cycloalkyl group or an aryl group, and two $R_9$ may be the same or different.

Each of $R_2$ and $R_3$ independently represents an alkyl group, an alkenyl group, a cycloalkyl group, an aryl group or a heterocyclic group.

$R_4$ represents a monovalent substituent, $n_1$ represents an integer of 0 to 4, and when $n_1$ is 2 or more, each $R_4$ may be the same as or different from every other $R_4$.

$R_2$ and $R_3$, $R_2$ and $R_4$, $R_3$ and $R_4$, $R_2$ and the benzene ring in formula (Z1), $R_3$ and the benzene ring, or $R_4$ and $R_4$ when $n_1$ is 2 or more, may combine with each other to form a ring.

As to the conventional photoacid generator, a resist composition using a photoacid generator having a betaine structure described in Patent Document 2 (the compound recited in JP-A-2011-16746)) has a problem that the sensitivity is poor, particularly, the aging stability of sensitivity is poor. The reason therefor is not clearly known but is presumed to be that probably due to low solubility of the photoacid generator for the solvent in the resist composition, the decomposition efficiency (acid generation efficiency) of the photoacid generator during exposure is low.

On the other hand, the reason why the actinic ray-sensitive or radiation-sensitive resin composition of the present invention containing (A1) a compound having a specific betaine structure and generating an acid upon irradiation with an actinic ray or radiation is excellent in the sensitivity, resolution, roughness performance and aging stability and less likely to cause outgassing is not clearly known but presumed as follows.

The compound (A1) represented by formula (Z1) of the present invention is configured to have a specific betaine structure of not allowing $L_1$ to be an oxygen atom when -L$_1$-R$_1$-A$_1$ is substituted at the para-position relative to S$^+$, whereby the decomposition efficiency (acid generation efficiency) of the compound (A1) during exposure can be enhanced, the solubility of the compound (A1) for the solvent in the composition can be increased, the compound (A1) can be prevented from precipitating in the resist composition during storage and exhibit excellent aging stability (little variation of sensitivity after aging), and because of high acid generation efficiency, a large amount of acid can be generated, resulting in high sensitivity and low LER.

Furthermore, it is considered that the compound (A1) according to the present invention has a betaine structure having an anion moiety and a cation moiety in the same molecule and thanks to this configuration, the cation moiety decomposes during exposure to reduce the molecular weight, as a result, the solubility of the exposed area for an alkali developer is enhanced to increase the dissolution contrast, making it possible to achieve high resolution.

In addition, as described above, the compound (A1) represented by formula (Z1) decomposes upon irradiation with an actinic ray or radiation to generate an acid, but it is foreseen that outgassing due to decomposition is less likely to occur, though the reason is not clearly known.

The actinic ray-sensitive or radiation-sensitive resin composition of the present invention containing the photoacid generator (A1) is, in one embodiment, a positive actinic ray-sensitive or radiation-sensitive resin composition and, in another embodiment, a negative actinic ray-sensitive or radiation-sensitive resin composition.

The positive actinic ray-sensitive or radiation-sensitive resin composition (preferably a positive resist composition) of the present invention may contain (A1) a photoacid generator and (B) a resin capable of decomposing by an action of an acid to increase the solubility in an alkali developer.

The negative actinic ray-sensitive or radiation-sensitive resin composition (preferably a negative resist composition) of the present invention may contain (A1) a photoacid generator, (C) a resin soluble in an alkali developer, and (D) an acid crosslinking agent that is caused to crosslink with the resin soluble in an alkali developer by an action of an acid.

[1] Compound Capable of Generating an Acid Upon Irradiation with an Actinic Ray or Radiation, Represented by Formula (Z1) (Photoacid Generator (A1))

In formula (Z1), $L_1$ represents —O—, —S—, —OS(=O)$_2$—, —S(=O)$_2$O—, —OC(=O)—, —C(=O)O—, —S(=O)—, —S(=O)$_2$—, —C(=O)—, —N(R$_7$)C(=O)—, —C(=O)N(R$_7$)—, —N(R$_7$)S(=O)$_2$— or —S(=O)$_2$N(R$_7$)— (in all of these, the right side is the $R_1$ side) and is preferably —O—, —S—, —OS(=O)$_2$—, —S(=O)$_2$O—, —OC(=O)— or —C(=O)O—.

However, from the standpoint of increasing the solubility of the compound (A1) for the solvent in the composition, improving the aging stability and enhancing the decomposition efficiency (acid generation efficiency) of the compound (A1) during exposure to achieve high sensitivity and low LER, with respect to the benzene ring in formula (Z1), when -$L_1$-$R_1$-$A_1$ is substituted at the para-position relative to S$^+$, $L_1$ is not —O—, and with respect to the benzene ring in formula (Z1) to which -$L_1$-$R_1$-$A_1$ is bonded, when -$L_1$-$R_1$-$A_1$ is substituted at the para-position relative to S$^+$, $L_1$ is preferably —S—, —OS(=O)$_2$—, —S(=O)$_2$O—, —OC(=O)—, —C(=O)O—, —S(=O)—, —S(=O)$_2$—, —C(=O)—, —N(R$_7$)C(=O)—, —C(=O)N(R$_7$)—, —N(R$_7$)S(=O)$_2$— or —S(=O)$_2$N(R$_7$)—, more preferably —S—, —OS(=O)$_2$—, —S(=O)$_2$O—, —OC(=O)— or —C(=O)O—.

From the standpoint of increasing the solubility of the compound (A1) for the solvent in the composition, improving the aging stability and enhancing the decomposition efficiency (acid generation efficiency) of the compound (A1) during exposure to achieve high sensitivity and low LER, with respect to the benzene ring in formula (Z1) to which -$L_1$-$R_1$-$A_1$ is bonded, -$L_1$-$R_1$-$A_1$ is preferably substituted at the meta- or ortho-position relative to S$^+$.

$R_7$ represents a hydrogen atom, an alkyl group or a cycloalkyl group and is preferably a hydrogen atom or an alkyl group.

The alkyl group of $R_7$ may be linear or branched, may have a substituent, and is preferably an alkyl group having a carbon number of 1 to 20, and examples thereof include a methyl group, an ethyl group, a propyl group, a butyl group, an i-propyl group, a tert-butyl group, a benzyl group, and a hydroxyethyl group.

The cycloalkyl group of $R_7$ may have a substituent and is preferably a cycloalkyl group having a carbon number of 3 to 20, and examples thereof include a cyclopropyl group, a cyclopentyl group, a cyclohexyl group, a 4-methylcyclohexyl group, a norbornyl group, and an adamantyl group.

$R_1$ represents an alkylene group, a cycloalkylene group, an arylene group or a divalent group formed by the combination thereof, and —O—, —C(O)—, —S(O$_2$)— or —S— may be inserted between the groups.

The alkylene group of $R_1$ may be linear or branched, may have a substituent, and is preferably an alkylene group having a carbon number of 1 to 20.

The cycloalkylene group of $R_1$ may have a substituent and is preferably a cycloalkylene group having a carbon number of 3 to 20.

The substituent that may be substituted on the alkylene group and cycloalkylene group of $R_1$ includes a halogen atom, an aryl group, an alkyl group, and the like and is preferably a halogen atom or an aryl group, more preferably a fluorine atom.

The alkylene group of $R_1$ includes, for example, a methylene group, an ethylene group, a propylene group, a butylene group, a methylethylene group, a benzylidene group, a phenylethylene group, —CF$_2$—, —(CF$_2$)$_2$—, —(CF$_2$)$_3$—, —(CF$_2$)$_4$—, —CH$_2$CF$_2$—, —CH$_2$CH$_2$CF$_2$CF$_2$—, and —CH(CF$_3$)CF$_2$—.

The cycloalkylene group of $R_1$ includes, for example, 1,3-cyclopentylene group and 1,4-cyclohexylene group.

The arylene group of $R_1$ may have a substituent, may be ring-fused, and is preferably an arylene group having a carbon number of 6 to 26.

The substituent that may be substituted on the arylene group of $R_1$ includes a halogen atom, an alkyl group, a cycloalkyl group, and an aryl group and is preferably a fluorine atom, an isopropyl group or a cyclohexyl group.

The arylene group of $R_1$ includes, for example, 1,2-phenylene group, 1,3-phenylene group, 1,4-phenylene group, 1,4-naphthylene group, 2,5-naphthylene group, 9,10-anthracenylene group, 2,3,5,6-tetrafluoro-1,4-phenylene group, 2,5-dimethyl-1,4-phenylene group, 3-isopropyl-1,4-phenylene group, 2-isopropyl-1,4-phenylene group, 3-cyclohexyl-1,4-phenylene group, 2-cyclohexyl-1,4-phenylene group, 3,5-diisopropyl-1,4-phenylene group, 2,6-diisopropyl-1,4-phenylene group, 3,5-dicyclohexyl-1,4-phenylene group, and 2,6-dicyclohexyl-1,4-phenylene.

The divalent group formed by combining an alkylene group, a cycloalkylene group or an arylene group and the group formed by inserting —O—, —C(=O)—, —S(=O)$_2$— or —S— between the groups, which are recited as $R_1$, include, for example, —CH$_2$C$_6$H$_4$CH$_2$—, —CH$_2$C$_6$H$_4$—, —CH$_2$CH$_2$OCH$_2$CH$_2$—, —CF$_2$CF$_2$OCF$_2$CF$_2$—, —CF$_2$CH$_2$OCH$_2$CF$_2$—, —CH$_2$CH$_2$SCH$_2$CF$_2$—, —CH$_2$C(=O)C$_6$H$_4$—, —CF$_2$CF$_2$CF$_2$S(=O)$_2$CF$_2$CF$_2$CF$_2$—, —CH$_2$C(=O)OCH(CF$_3$)CF$_2$—, and —CH$_2$CH$_2$C(=O)OCH$_2$CF$_2$—.

$R_1$ is preferably an alkylene group, a partially or wholly fluorinated alkylene group, an arylene group, or a partially or wholly fluorinated arylene group.

$A_1$ represents —SO$_3^-$, —SO$_2$N$^-$SO$_2$R$_8$ or —SO$_2$C$^-$(SO$_2$R$_9$)$_2$ and is preferably —SO$_3^-$ or —SO$_2$N$^-$SO$_2$R$_8$, more preferably —SO$_3^-$.

$R_8$ represents an alkyl group, a cycloalkyl group or an aryl group, $R_9$ represents an alkyl group, a cycloalkyl group or an aryl group, and two $R_9$ may be the same or different.

The alkyl group of $R_8$ may be linear or branched, may have a substituent, and is preferably an alkyl group having a carbon number of 1 to 20. The substituent that may be substituted on the alkyl group of $R_8$ includes an electron-withdrawing group (e.g., cyano group), a halogen atom, an aryl group, and the like and is preferably an electron-withdrawing group or a halogen atom, more preferably a fluorine atom.

The alkyl group of $R_8$ includes, for example, a methyl group, an ethyl group, an i-propyl group, a tert-butyl group, a benzyl group, a cyanomethyl group, a trifluoromethyl group, a 2,2,2-trifluoroethyl group, a perfluoropropyl group, and a perfluorobutyl group.

The cycloalkyl group of $R_8$ may have a substituent and is preferably a cycloalkyl group having a carbon number of 3 to 20.

The substituent that may be substituted on the cycloalkyl group of $R_8$ includes an electron-withdrawing group, a halogen atom, and the like.

The cycloalkyl group of $R_8$ includes, for example, a cyclopentyl group, a cyclopentyl group, a cyclohexyl group, a norbornyl group, and an adamantyl group.

The aryl group of $R_8$ may have a substituent and is preferably an aryl group having a carbon number of 6 to 26. The substituent that may be substituted on the aryl group of $R_8$ includes an electron-withdrawing group, a halogen atom, an alkyl group, a hydroxyl group, and the like and is preferably an electron-withdrawing group or a halogen atom, more preferably a fluorine atom.

The aryl group of $R_8$ includes, for example, a phenyl group, a 1-naphthyl group, a 2-naphthyl group, a pentafluorophenyl group, a 4-trifluoromethylphenyl group, a 4-cyanophenyl group, a 3-hydroxyphenyl group, and a 2-methylphenyl group.

$R_8$ is preferably an alkyl group, a partially or wholly fluorinated alkyl group, an aryl group, or a partially or wholly fluorinated aryl group.

Specific examples and preferable examples of the alkyl group, cycloalkyl group or aryl group of $R_9$ are the same as specific examples and preferable examples of the alkyl group, cycloalkyl group or aryl group or $R_8$.

Each of $R_2$ and $R_3$ independently represents an alkyl group, an alkenyl group, a cycloalkyl group, an aryl group or a heterocyclic group.

The alkyl group of $R_2$ and $R_3$ may be linear or branched, may have a substituent, and is preferably an alkyl group having a carbon number of 1 to 20. In the case of having a substituent, it is preferable to have a substituent at the 1-position (α-position) of the alkyl group. The substituent that may be substituted on the alkyl group includes an acyl group, an alkoxycarbonyl group, a cycloalkoxy group, an alkyl group, an aryl group, an arylcarbonyl group and the like and is preferably an acyl group or an alkoxycarbonyl group.

The alkyl group of $R_2$ and $R_3$ includes, for example, a methyl group, an ethyl group, a propyl group, an i-propyl group, an n-butyl group, a tert-butyl group, a benzyl group, a benzoylmethyl group, a 1-benzoylethyl group, a 1-methyl-1-benzoylethyl group, an acetylmethyl group, a cyclohexyloxymethyl group, a methoxycarbonylmethyl group, and a 1-(ethoxycarbonyl)ethyl group.

The alkenyl group of $R_2$ and $R_3$ may have a substituent and is preferably an alkenyl group having a carbon number of 2 to 20, and examples thereof include a vinyl group and an allyl group.

The cycloalkyl group of $R_2$ and $R_3$ may have a substituent and is preferably a cycloalkyl group having a carbon number of 3 to 20. In the case of having a substituent, it is preferable to have a substituent at the 1-position (α-position) of the cycloalkyl group. The substituent that may be substituted on the cycloalkyl group includes an acyl group, an alkoxycarbonyl group, an arylcarbonyl group and the like.

The cycloalkyl group of $R_2$ and $R_3$ includes, for example, a cyclopentyl group, a cyclopropyl group, a cyclohexyl group, a norbornyl group, an adamantyl group, a 1-benzoylcyclohexyl group, a 1-acetylcyclopentyl group, and a 1-(methoxycarbonyl)cyclohexyl group.

The aryl group of $R_2$ and $R_3$ may have a substituent and is preferably an aryl group having a carbon number of 6 to 26.

The substituent that may be substituted on the aryl group of $R_2$ and $R_3$ includes an alkyl group, a cycloalkyl group, an aryl group, a heterocyclic group, a nitro group, a cyano group, a halogen atom, a hydroxyl group, an alkoxy group, an aryloxy group, an acyloxy group, a carboxyl group, an alkoxycarbonyl group, an aryloxycarbonyl group, a carbamoyl group, an acyl group, an alkylthio group, an arylthio group, an alkylsulfonyl group, an arylsulfonyl group, an alkoxysulfonyl group, an aryloxysulfonyl group, and a sulfamoyl group.

The aryl group of $R_2$ and $R_3$ includes, for example, a phenyl group, a 1-naphthyl group, a 2-naphthyl group, a 9-anthranyl group, and a phenyl group substituted with the substituent above.

The heterocyclic group of $R_2$ and $R_3$ may have a substituent and is preferably a heterocyclic group having a carbon number of 2 to 20. Specific examples of the substituent that may be substituted on the heterocyclic group of $R_2$ and $R_3$ are the same as specific examples of the substituent that may be substituted on the aryl group of $R_2$ and $R_3$.

The heterocyclic group of $R_2$ and $R_3$ includes, for example, a thienyl group, a benzothienyl group, a tetrahydrothienyl group, a pyrrolyl group, an indolyl group, a carbazolyl group, a furyl group, a benzofuryl group, a tetrahydrofuryl group, a pyrimidyl group, a pyrazyl group, and a pyridazyl group.

Each of $R_2$ and $R_3$ is preferably an aryl group, an alkyl group, a 1-acylalkyl group or a 1-(alkoxycarbonyl)alkyl group, more preferably an aryl group.

$R_2$ and $R_3$ may combine with each other to form a ring. At this time, the ring may contain therein an oxygen atom, a sulfur atom, an ester bond, an amide bond, a carbonyl group, or the like. The ring formed includes a cycloheptane ring, a cyclohexane ring, a cycloheptanone ring, a cyclohexanone ring, and as the ring involving $S^+$, a tetrahydrothiophene ring, a dihydrothiophene ring, a thiophene ring, a benzothiophene ring, a dibenzothiophene ring, a thianthrene ring, a dibenzoxathiane ring, and the like.

$R_4$ represents a monovalent substituent, which includes an alkyl group, a cycloalkyl group, an aryl group, a heterocyclic group, a nitro group, a cyano group, a halogen atom, a hydroxyl group, an alkoxy group, an aryloxy group, an acyloxy group, a carboxyl group, an alkoxycarbonyl group, an aryloxycarbonyl group, a carbamoyl group, an acyl group, an alkylthio group, an arylthio group, an alkylsulfonyl group, an arylsulfonyl group, an alkoxysulfonyl group, an aryloxysulfonyl group, a sulfamoyl group and the like and is preferably an alkyl group, a cycloalkyl group, an aryl group, a halogen atom, a hydroxyl group, an alkoxy group, an alkoxycarbonyl group or an arylthio group. $n_1$ represents an integer of 0 to 4, preferably an integer of 0 to 2, more preferably 0. When $n_1$ is 2 or more, each $R_4$ may be the same as or different from every other $R_4$, and $R_4$ and $R_4$ may combine with each other to form a ring. Preferred examples of the ring formed include a benzene ring, a cyclohexane ring, and a cycloheptane ring.

In addition, $R_2$ and $R_4$, $R_3$ and $R_4$, $R_2$ and the benzene ring in formula (Z1), $R_3$ and the benzene ring, or the like may combine with each other to form a ring. Preferred examples of the ring formed are the same as those of the ring described above as the ring formed by combining $R_2$ and $R_3$.

Incidentally, the compound may be a compound having a plurality of structures represented by formula (Z1). For example, the compound may be a compound having a structure where $R_2$ or $R_3$ of a compound represented by formula (Z1) is bonded to $R_2$ or $R_3$ of another compound represented by formula (Z1) through a single bond or a linking group.

The compound (A1) represented by formula (Z1) is preferably a compound represented by the following formula (Z2):

[Chem. 4]

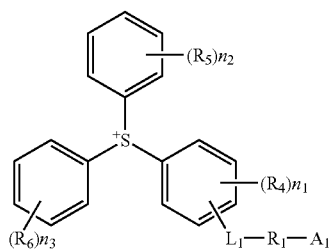

(Z2)

In formula (Z2), $L_1$, $R_1$, $A_1$, $R_4$ and $n_1$ have the same meanings as $L_1$, $R_1$, $A_1$, $R_4$ and $n_1$ in formula (Z1).

However, from the standpoint of increasing the solubility of the compound (A1) for the solvent in the composition, improving the aging stability and enhancing the decomposition efficiency (acid generation efficiency) of the compound (A1) during exposure to achieve high sensitivity and low LER, with respect to the benzene ring in formula (Z2) to which -$L_1$-$R_1$-$A_1$ is bonded, when -$L_1$-$R_1$-$A_1$ is substituted at the para-position relative to $S^+$, $L_1$ is not —O—, and with respect to the benzene ring in formula (Z2) to which -$L_1$-$R_1$-$A_1$ is bonded, when -$L_1$-$R_1$-$A_1$ is substituted at the para-position relative to $S^+$, $L_1$ is preferably —S—, —OS(=O)$_2$—, —S(=O)$_2$O—, —OC(=O)—, —C(=O)O—, —S(=O)—, —S(=O)$_2$—, —C(=O)—, —N($R_7$)C(=O)—, —C(=O)N($R_7$)—, —N($R_7$)S(=O)$_2$— or —S(=O)$_2$N($R_7$)—, more preferably —S—, —OS(=O)$_2$—, —S(=O)$_2$O—, —OC(=O)— or —C(=O)O—.

From the standpoint of increasing the solubility of the compound (A1) for the solvent in the composition, improving the aging stability and enhancing the decomposition efficiency (acid generation efficiency) of the compound (A1) during exposure to achieve high sensitivity and low LER, with respect to the benzene ring in formula (Z1) to which -$L_1$-$R_1$-$A_1$ is bonded, -$L_1$-$R_1$-$A_1$ is preferably substituted at the meta- or ortho-position relative to $S^+$.

Each of $R_5$ and $R_6$ independently represents a monovalent substituent, and specific examples and preferably examples of the monovalent substituent of $R_5$ and $R_6$ are the same as specific examples and preferable examples of the monovalent substituent of $R_4$ in formula (Z1).

Each of $n_2$ and $n_3$ independently represents an integer of 0 to 5, preferably an integer of 0 to 2, more preferably 0.

The plurality of $R_4$ when $n_1$ is 2 or more, the plurality of $R_5$ when $n_2$ is 2 or more, or the plurality of $R_6$ when $n_3$ is 2 or more, may be the same or different and may combine with each other to form a ring. Preferred examples of the ring that may be formed include a benzene ring, a cyclohexane ring, and a cycloheptane ring.

$R_4$ and $R_5$, $R_5$ and $R_6$, or $R_4$ and $R_6$ may combine with each other to form a ring. In this case, each of $R_4$, $R_5$ and $R_6$ may be a single bond, and the ring may contain therein an oxygen atom, a sulfur atom, an ester bond, an amide bond, a carbonyl group or the like. Preferable examples of the ring formed include, as the ring involving $S^+$, a tetrahydrothiophene ring, a dihydrothiophene ring, a thiophene ring, a benzothiophene ring, a dibenzothiophene ring, a thianthrene ring, and a dibenzoxathiane ring.

The compound may be a compound having a plurality of structures represented by formula (Z2). For example, the compound may be a compound having a structure where a compound represented by formula (Z2) is bonded to another compound represented by formula (Z2) through $R_5$ or $R_6$ by sharing $R_5$ or $R_6$.

Specific examples of the (A1) compound capable of generating an acid upon irradiation with an actinic ray or radiation, represented by formula (Z1), are illustrated below, but the present invention is not limited thereto.

[Chem. 5]

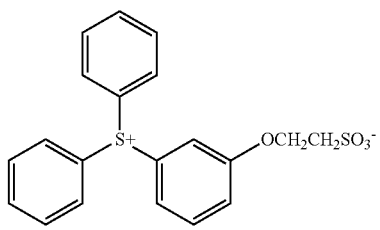

(b-1)

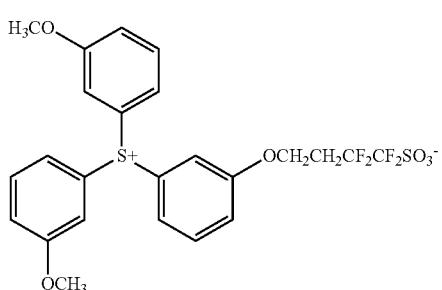

(b-2)

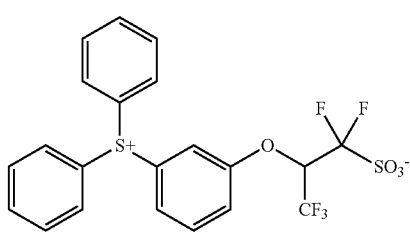

(b-3)

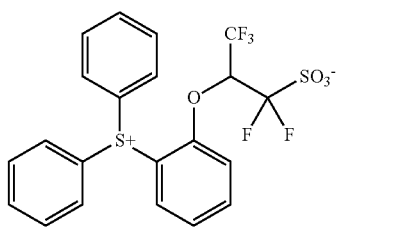

(b-4)

(b-5)
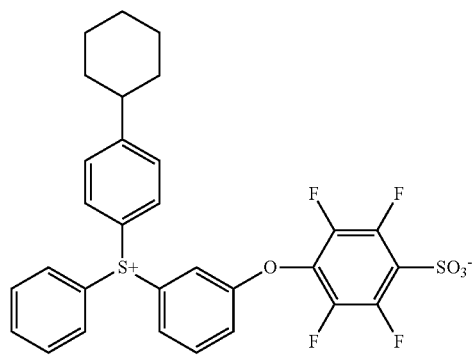
(b-6)
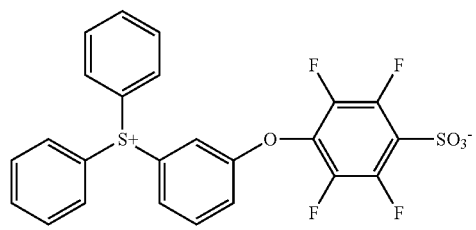
(b-7)
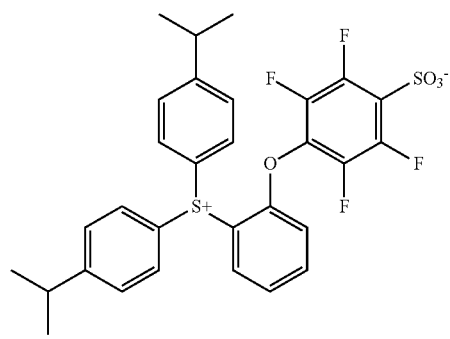
(b-8)
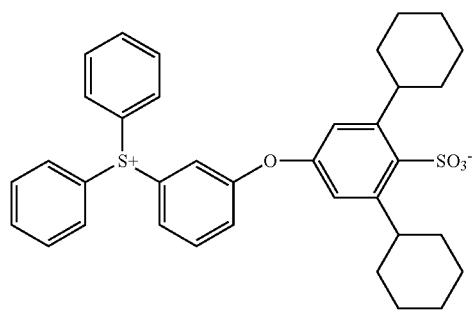
(b-9)
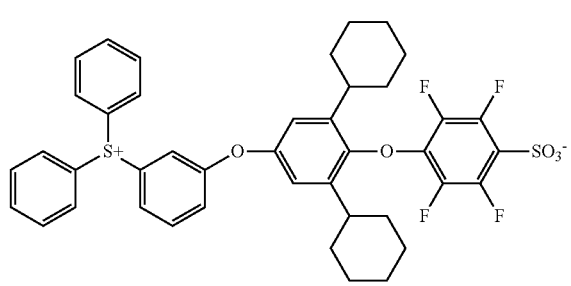
(b-10)
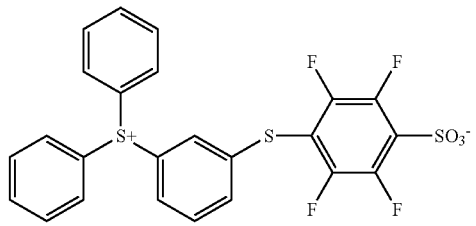
(b-11)
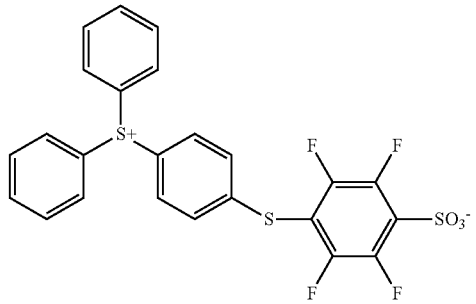
(b-12)
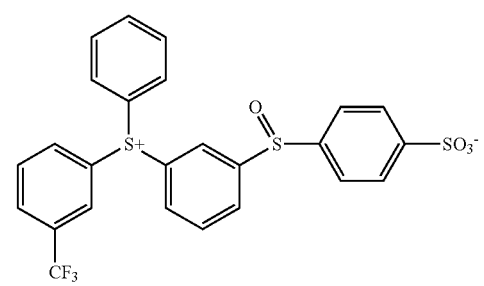
(b-13)
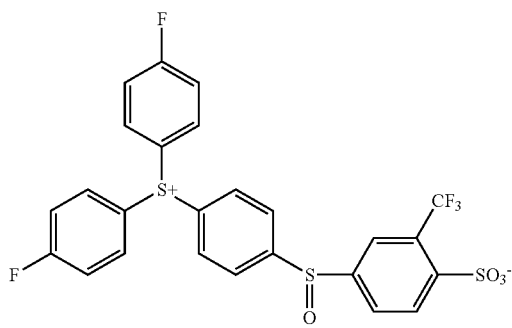
(b-14)
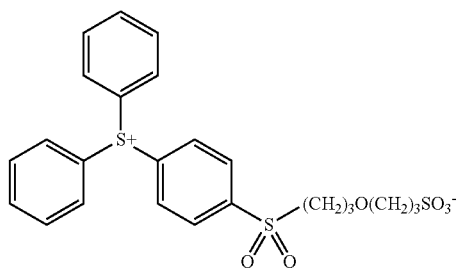

(b-15)
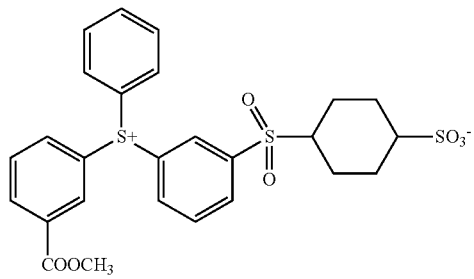
(b-16)
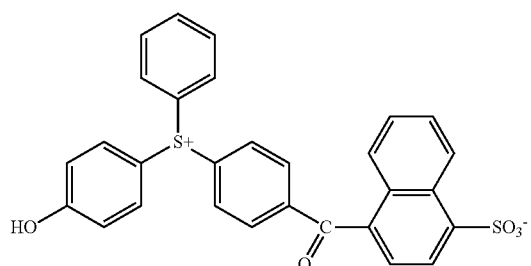
(b-17)
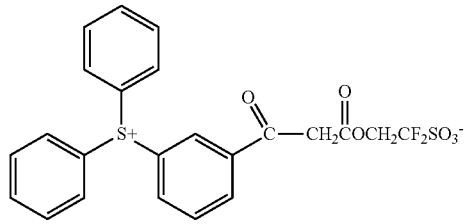
(b-18)
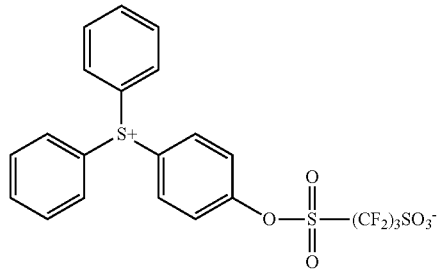
(b-19)
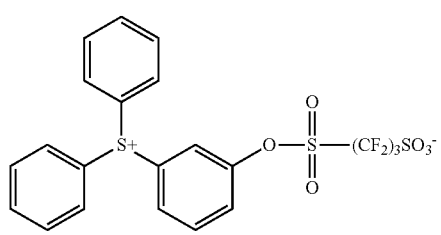
(b-20)
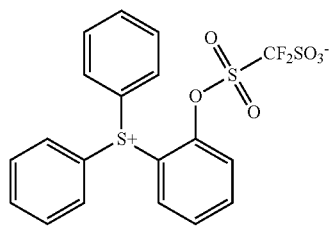
[Chem. 6]
(b-21)
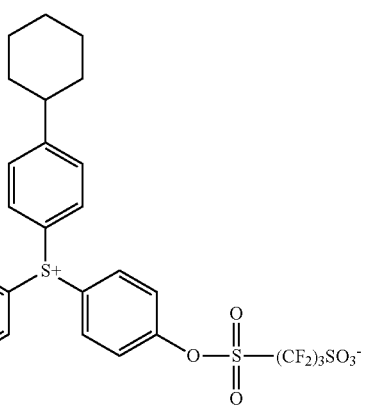
(b-22)
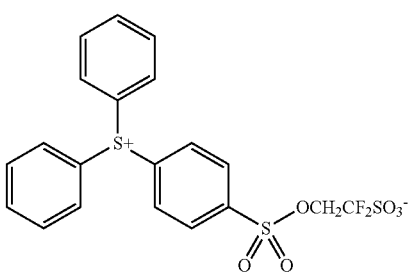
(b-23)
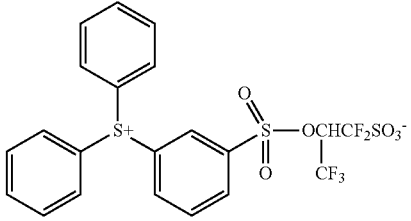
(b-24)
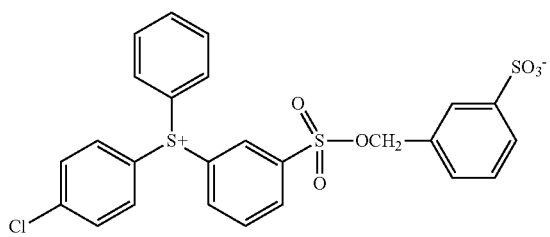
(b-25)
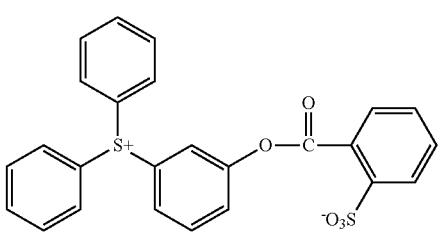

(b-26)
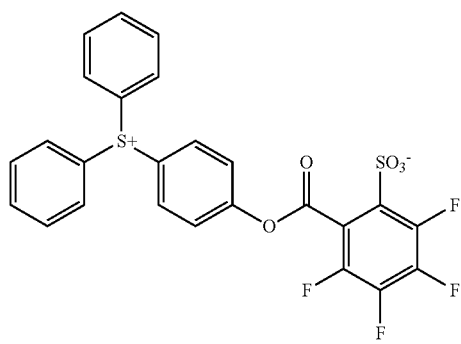
(b-27)
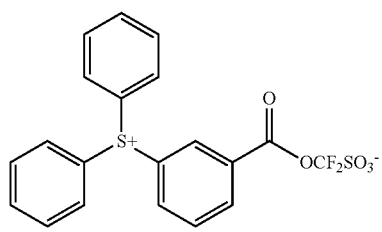
(b-28)
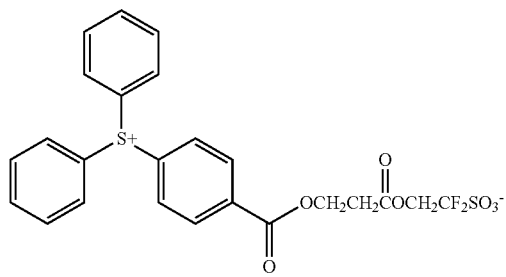
(b-29)
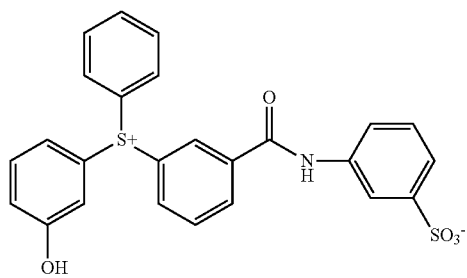
(b-30)
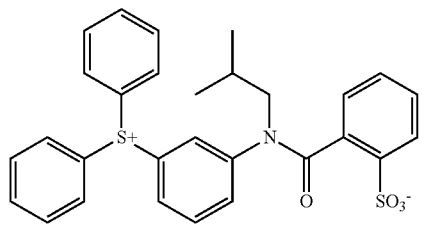
(b-31)
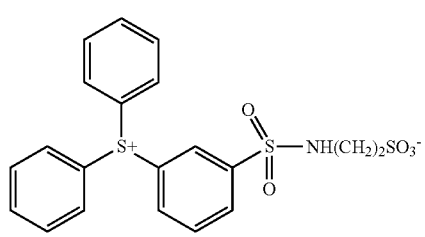
(b-32)
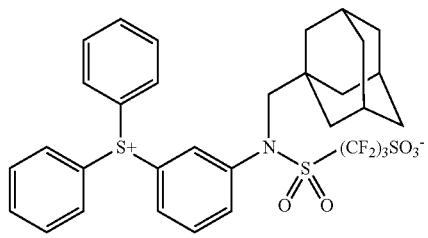
(b-33)
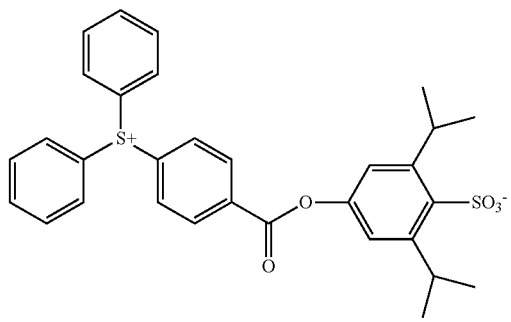
(b-34)
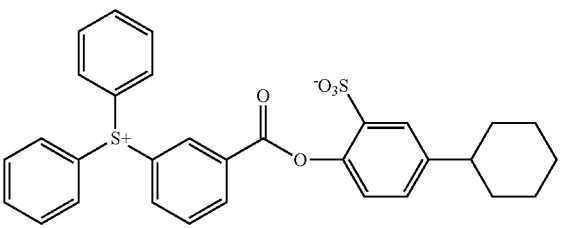
(b-35)
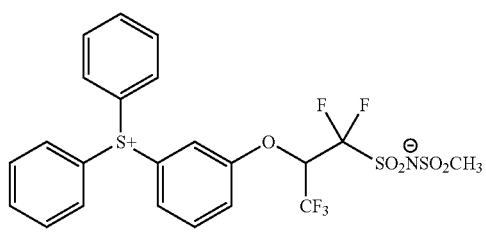
(b-36)
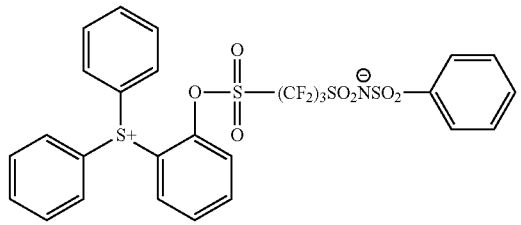
(b-37)
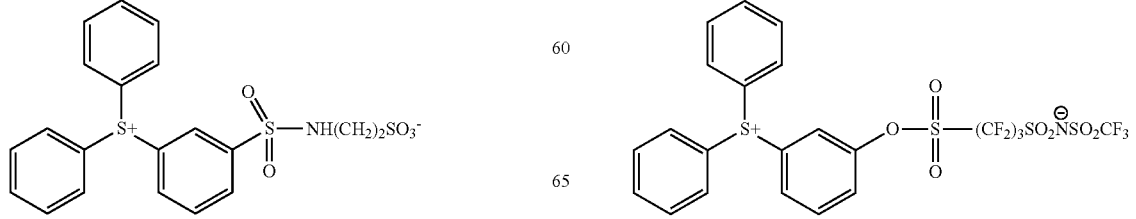

(b-38)
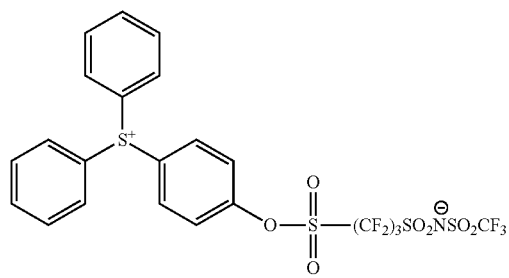
(b-39)
(b-40)
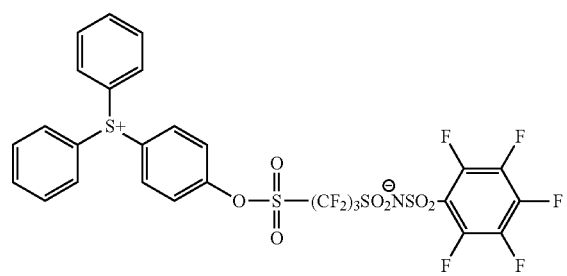
(b-41)
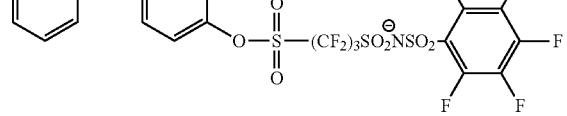
[Chem. 7]
(b-42)
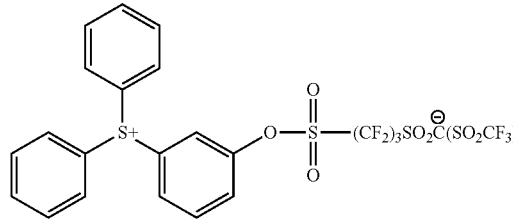
(b-43)
(b-44)
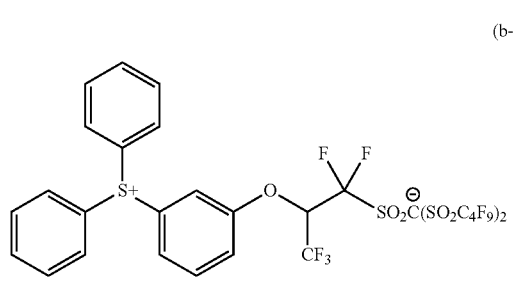
(b-45)
(b-46)
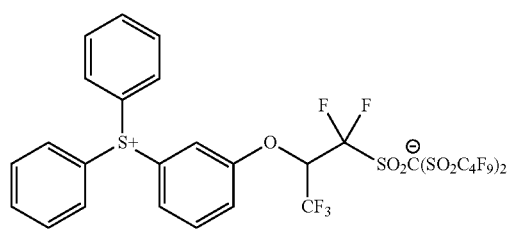
(b-47)
(b-48)
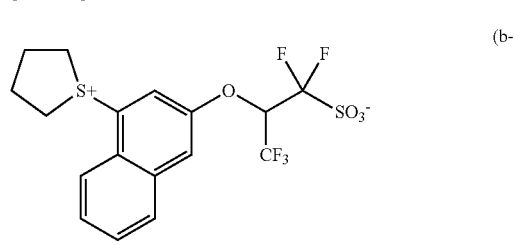
(b-49)
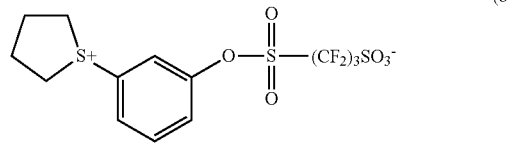

-continued
(b-50)
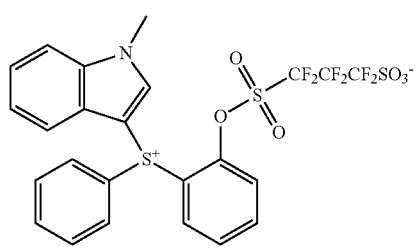
(b-51)
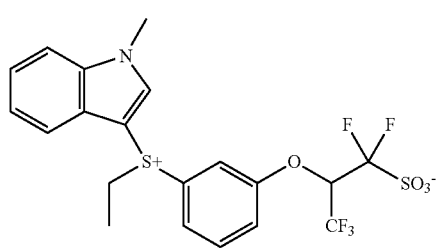
(b-52)
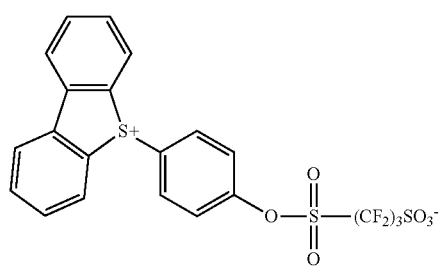
(b-53)
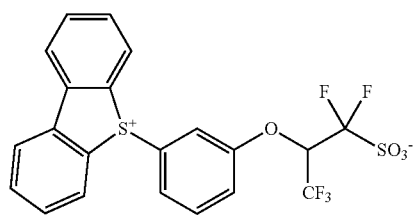
(b-54)
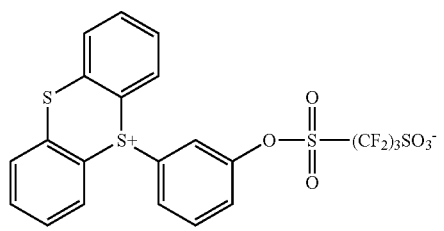
(b-55)
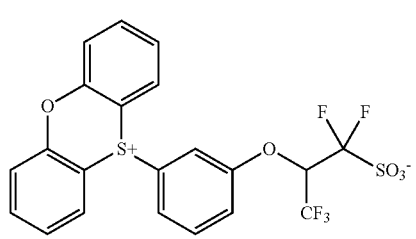
-continued
(b-56)
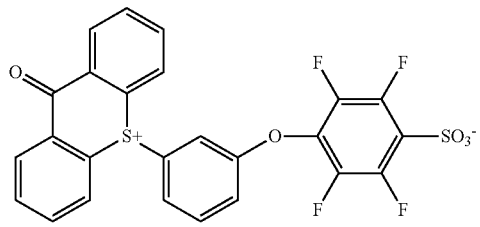
(b-57)
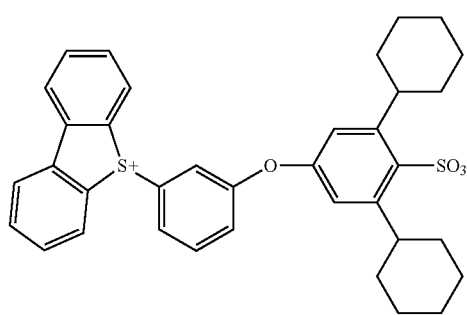
(b-58)
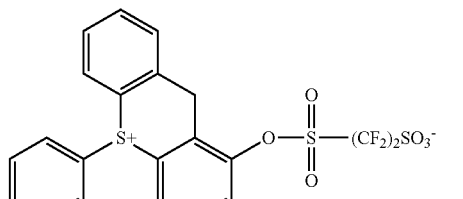
(b-59)
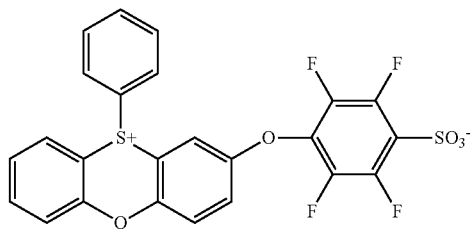
(b-60)
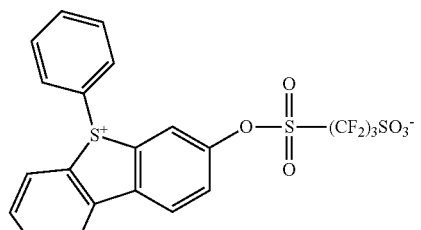

[Chem. 8]

(b-61)
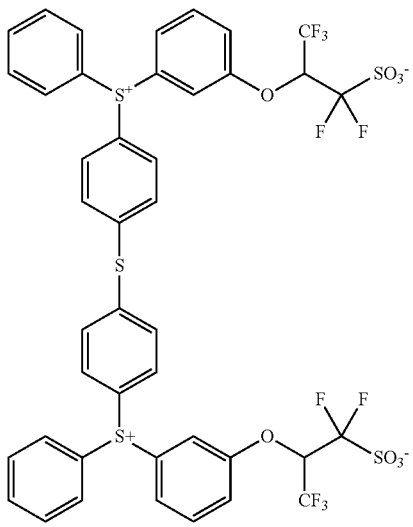

(b-62)
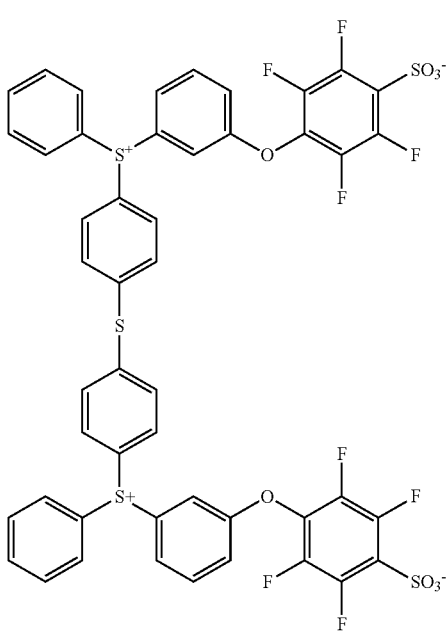

(b-63)
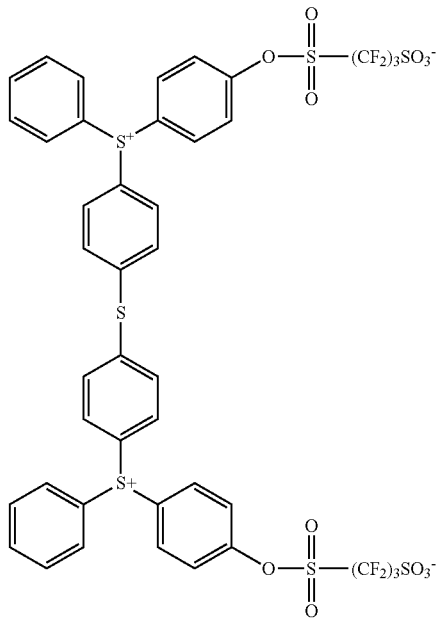

The production method of the compound represented by formula (Z1) or (Z2) is not particularly limited but may be produced, for example, by the following Synthesis Methods 1 to 4 or a combination thereof. The compound can be produced by appropriately modifying or selecting the synthesis method according to the substitution position of $-L_1-R_1-A_1$, the kind of $L_1$, or the like. The production method is described below by taking the compound represented by formula (Z2) as an example. Incidentally, out of the compounds represented by formula (Z1), compounds other than formula (Z2) may also be produced by the following Synthesis Methods 1 to 4 or a combination thereof. The production method of the compound represented by formula (Z1) or (Z2) are not limited to these methods.

In Synthesis Methods 1 to 4, $R_1$, $R_4$ to $R_6$, $n_1$ to $n_3$, $A_1$ and $L_1$ in the schemes have the same meanings as $R_1$, $R_4$ to $R_6$, $n_1$ to $n_3$, $A_1$ and $L_1$ in formula (Z1) or (Z2).

(Synthesis Method 1) Dehydration Condensation Method (Synthesis Method 1)

[Chem. 9]

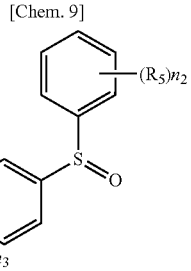

(1)

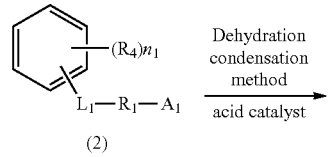

(2)

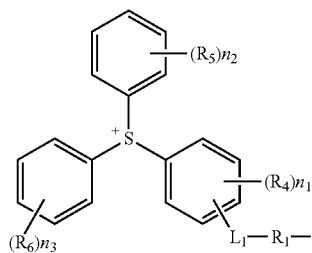

The sulfoxide (1) and the benzene derivative (2) are subjected to dehydration condensation without a solvent or in an acidic solvent, a hydrocarbon-based solvent, a halogenated hydrocarbon-based solvent or the like by using a Lewis acid catalyst such as $(CF_3SO_2)_2O$, $CH_3SO_3H$—$P_2O_5$ and $AlCl_3$, whereby the compound represented by formula (Z1) or (Z2) can be produced.

This method is useful particularly, for example, when -$L_1$-$R_1$-$A_1$ is substituted at the para-position relative to $S^+$ and $L_1$ is —S—, —N($R_7$)C(=O)—, —N($R_7$)S(=O)$_2$— or the like.

(Synthesis Method 2) Grignard Method (Synthesis Method 2)

[Chem. 10]

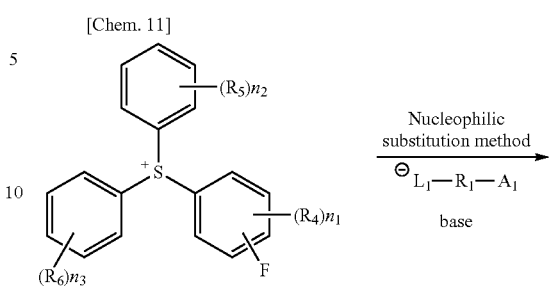

The halogen compound (3) is reacted with Mg in an ether-based solvent such as tetrahydrofuran and diethyl ether to prepare a Grignard reagent, and the Grignard reagent is reacted with the sulfoxide (1) by using TMS-Cl (trimethylsilyl chloride) or the like, whereby the compound represented by formula (Z1) or (Z2) can be produced.

The method is widely effective irrespective of the substitution position of -$L_1$-$R_1$-$A_1$ or the kind of $L_1$.

(Synthesis Method 3) Nucleophilic Substitution Method (Synthesis Method 3)

[Chem. 11]

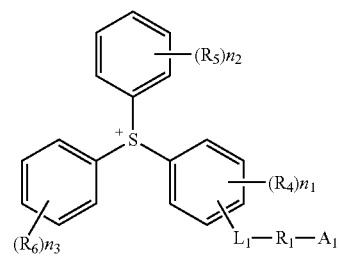

An anion $^-L_1$-$R_1$-$A_1$ is prepared by causing a base such as potassium carbonate, triethylamine, potassium tert-butoxide and sodium hydride to act on an intermediate H-$L_1$-$R_1$-$A_1$ that is commercially available or can be synthesized by a known method, in an aprotic polar solvent such as N,N-dimethylacetamide, N-ethylpyrrolidone and N,N-dimethylimidazolidinone, and then reacted with the fluoro compound (4) synthesized by (Synthesis Method 2) or a known method, whereby the compound represented by formula (Z1) or (Z2) can be produced.

This method can be applied when $L_1$ is —O—, —S— or the like, irrespective of the substitution position of -$L_1$-$R_1$-$A_1$. In addition, a compound where $L_1$ is —S(=O)—, —S(=O)$_2$— or the like can be also produced by thereafter oxidizing the compound where $L_1$ is —S—, with aqueous hydrogen peroxide-acetic acid, or the like.

(Synthesis Method 4) Condensation Coupling Method (Synthesis Method 4)

[Chem. 12]

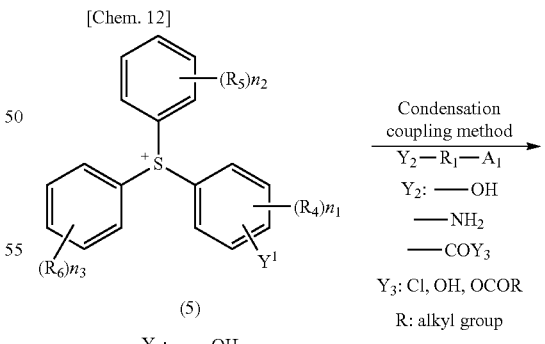

$Y_1$: —OH
—$NH_2$
—$COY_3$ $Y_3$: Cl, OH, OCOR

R: alkyl group

—$SO_2Y_4$ $Y_4$: F, Cl

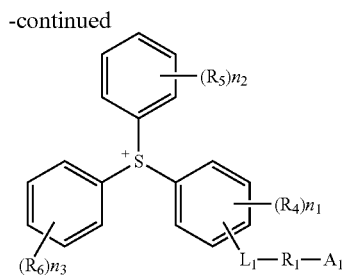

This is a production method of coupling/synthesizing the $L_1$ moiety by a condensation reaction. This method is useful and can be widely applied when $L_1$ is —OS(=O)$_2$—, —S(=O)$_2$O—, —OC(=O)—, —C(=O)O—, —N(R$_7$)C(=O)—, —C(=O)N(R$_7$)—, —N(R$_7$)S(=O)$_2$— or —S(=O)$_2$N(R$_7$)—, irrespective of the substitution position of -$L_1$-$R_1$-$A_1$. The triphenylsulfonium (5) can be generally synthesized by (Synthesis Method 1), (Synthesis Method 2) or a known method. $Y_2$—$R_1$-$A_1$ is commercially available or can be synthesized by a known method. For example, when $L_1$ is —OS(=O)$_2$—, the moiety can be synthesized by condensation-reacting $Y_1$: —OH with $Y_2$: FO$_2$S—$R_1$-$A_1$ by a known method, and when $L_1$ is —C(=O)O—, the moiety can be synthesized by condensation-reacting $Y_1$: —COOH, —COCl, etc. with $Y_2$: HO—$R_1$-$A_1$.

As for the photoacid generator (A1), one compound may be used alone, or a plurality of compounds may be used in combination.

The content of the photoacid generator (A1) is preferably from 0.1 to 70 mass %, more preferably from 0.5 to 50 mass %, still more preferably from 1 to 30 mass %, based on the total solid content of the actinic ray-sensitive or radiation-sensitive resin composition.

[Other Photoacid Generators]

In the present invention, other acid generators may be used in combination together with the photoacid generator (A1). As the photoacid generator usable in combination (hereinafter, sometimes referred to as "photoacid generator (A2)"), a photo-initiator for cationic photopolymerization, an initiator for radical photopolymerization, a photo-decoloring agent for dyes, a photo-discoloring agent, a known compound capable of generating an acid upon irradiation with an actinic ray or radiation, which is used for microresist or the like, or a mixture thereof may be appropriately selected and used. Examples thereof include a diazonium salt, a phosphonium salt, a sulfonium salt, an iodonium salt, imidosulfonate, oxime sulfonate, diazodisulfone, disulfone, and o-nitrobenzyl sulfonate.

[2] Resin Capable of Decomposing by an Action of an Acid to Increase the Solubility in an Alkali Developer The positive actinic ray-sensitive or radiation-sensitive resin composition of the present invention may contain (B) a resin capable of decomposing by an action of an acid to increase the solubility in an alkali developer. The resin (B) typically has a group capable of decomposing by an action of an acid to produce an alkali-soluble group (hereinafter, sometimes referred to as "acid-decomposable group"). This resin may have an acid-decomposable group in ether one or both of the main chain and the side chain of the resin. The resin preferably has an acid-decomposable group in the side chain.

The acid-decomposable group is preferably a group formed by replacing the hydrogen atom of an alkali-soluble group such as —COOH group and —OH group by a group capable of leaving by an action of an acid. The group capable of leaving by an action of an acid is preferably an acetal group or a tertiary ester group.

In the case where the acid-decomposable group is bonded as a side chain, the mother resin includes, for example, an alkali-soluble resin having an —OH or —COOH group in the side chain. Examples of such an alkali-soluble resin include those described later.

The alkali dissolution rate of the alkali-soluble resin is preferably 17 nm/sec or more, more preferably 33 nm/sec or more, as measured (at 23° C.) in an aqueous 2.38 mass % tetramethylammonium hydroxide (TMAH) solution.

From such a standpoint, particularly preferable alkali-soluble resins include a resin containing a hydroxystyrene structural unit, such as o-, m- or p-poly(hydroxystyrene) or a copolymer thereof, hydrogenated poly(hydroxystyrene), halogen- or alkyl-substituted poly(hydroxystyrene), partially O-alkylated or O-acylated poly(hydroxystyrene), styrene-hydroxystyrene copolymer, α-methylstyrene-hydroxystyrene copolymer and hydrogenated novolak resin; and a resin containing a repeating unit having a carboxyl group, such as (meth)acrylic acid and norbornene carboxylic acid.

The repeating unit having a preferable acid-decomposable group includes, for example, tert-butoxycarbonyloxystyrene, 1-alkoxyethoxystyrene, and tertiary alkyl(meth)acrylate. This repeating unit is more preferably 2-alkyl-2-adamantyl (meth)acrylate or dialkyl(1-adamantyl)methyl(meth)acrylate.

The resin capable of decomposing by an action of an acid to increase the solubility in an alkali developer can be obtained, for example, by reacting a resin with a precursor of a group capable of leaving by an action of an acid or by copolymerizing various monomers with an alkali-soluble resin monomer having bonded thereto a group capable of leaving by an action of an acid, as disclosed in European Patent 254853, JP-A-2-25850, JP-A-3-223860, JP-A-4-251259, etc.

In the case of irradiating the composition of the present invention with KrF excimer laser light, electron beam, X-ray or high-energy light with a wavelength of 50 nm or less (e.g., EUV), the resin above preferably has a hydroxystyrene repeating unit, and this resin is more preferably a copolymer of hydroxystyrene and hydroxystyrene protected by a group capable of leaving by an action of an acid, or a copolymer of hydroxystyrene and tertiary alkyl(meth)acrylate.

Such a resin specifically includes a resin having a repeating unit represented by the following formula (A):

[Chem. 13]

In the formula, each of $R_{01}$, $R_{02}$ and $R_{03}$ independently represents, for example, a hydrogen atom, an alkyl group, a cycloalkyl group, a halogen atom, a cyano group or an alkoxycarbonyl group. $Ar_1$ represents an alkylene group or an aromatic ring group. Also, $R_{03}$ may be an alkylene group and combine with $Ar_1$ as an aromatic ring group to form a ring together with the —C—C— chain, or $R_{03}$ and $Ar_1$ may be an alkylene group and combine with each other to form, for example, a 5- or 6-membered ring together with the —C—C— chain.

Each of n Y's independently represents a hydrogen atom or a group capable of leaving by an action of an acid. However, at least one Y represents a group capable of leaving by an action of an acid.

n represents an integer of 1 to 4 and is preferably 1 or 2, more preferably 1.

The alkyl group as $R_{01}$ to $R_{03}$ is, for example, an alkyl group having a carbon number of 20 or less and is preferably a methyl group, an ethyl group, a propyl group, an isopropyl group, an n-butyl group, a sec-butyl group, a hexyl group, a 2-ethylhexyl group, an octyl group or a dodecyl group. The alkyl group is more preferably an alkyl group having a carbon number of 8 or less. These alkyl groups may have a substituent.

As the alkyl group contained in the alkoxycarbonyl group, the same alkyl group as in $R_{01}$ to $R_{03}$ is preferred.

The cycloalkyl group may be either a monocyclic cycloalkyl group or a polycyclic cycloalkyl group. The cycloalkyl group is preferably a monocyclic cycloalkyl group having a carbon number of 3 to 8, such as cyclopropyl group, cyclopentyl group and cyclohexyl group. These cycloalkyl groups may have a substituent.

The halogen atom includes a fluorine atom, a chlorine atom, a bromine atom, and an iodine atom, with a fluorine atom being preferred.

In the case where $R_{03}$ or $Ar_1$ represents an alkylene group, the alkylene group is preferably an alkylene group having a carbon number of 1 to 8, such as methylene group, ethylene group, propylene group, butylene group, hexylene group and octylene group.

The aromatic ring group as $Ar_1$ is preferably an aromatic ring group having a carbon number of 6 to 14, and examples thereof include a benzene ring, a toluene ring, and a naphthalene ring. These aromatic rings may have a substituent.

The group Y capable of leaving by an action of an acid includes, for example, groups represented by —C($R_{36}$)($R_{37}$)($R_{38}$), —C(=O)—O—C($R_{36}$)($R_{37}$)($R_{38}$), —C($R_{01}$)($R_{02}$)(O$R_{39}$), —C($R_{01}$)($R_{02}$)—C(=O)—O—C($R_{36}$)($R_{37}$)($R_{38}$), and —CH($R_{36}$)(Ar).

In the formulae, each of $R_{36}$ to $R_{39}$ independently represents an alkyl group, a cycloalkyl group, an aryl group, an aralkyl group or an alkenyl group. $R_{36}$ and $R_{37}$ may combine with each other to form a ring structure.

Each of $R_{01}$ and $R_{02}$ independently represents a hydrogen atom, an alkyl group, a cycloalkyl group, an aryl group, an aralkyl group or an alkenyl group.

Ar represents an aryl group.

The alkyl group as $R_{36}$ to $R_{39}$, $R_{01}$ or $R_{02}$ is preferably an alkyl group having a carbon number of 1 to 8, and examples thereof include a methyl group, an ethyl group, a propyl group, an n-butyl group, a sec-butyl group, a hexyl group, and an octyl group.

The cycloalkyl group as $R_{36}$ to $R_{39}$, $R_{01}$ or $R_{02}$ may be a monocyclic cycloalkyl group or a polycyclic cycloalkyl group. The monocyclic cycloalkyl group is preferably a cycloalkyl group having a carbon number of 3 to 8, and examples thereof include a cyclopropyl group, a cyclobutyl group, a cyclopentyl group, a cyclohexyl group, and a cyclooctyl group. The polycyclic cycloalkyl group is preferably a cycloalkyl group having a carbon number of 6 to 20, and examples thereof include an adamantyl group, a norbornyl group, an isoboronyl group, a camphanyl group, a dicyclopentyl group, an α-pinel group, a tricyclodecanyl group, a tetracyclododecyl group, and an androstanyl group. Incidentally, a part of carbon atoms in the cycloalkyl group may be substituted with a heteroatom such as oxygen atom.

The aryl group as $R_{36}$ to $R_{39}$, $R_{01}$, $R_{02}$ or Ar is preferably an aryl group having a carbon number of 6 to 10, and examples thereof include a phenyl group, a naphthyl group, and an anthryl group.

The aralkyl group as $R_{36}$ to $R_{39}$, $R_{01}$ or $R_{02}$ is preferably an aralkyl group having a carbon number of 7 to 12, and preferable examples thereof include a benzyl group, a phenethyl group, and a naphthylmethyl group.

The alkenyl group as $R_{36}$ to $R_{39}$, $R_{01}$ or $R_{02}$ is preferably an alkenyl group having a carbon number of 2 to 8, and examples thereof include a vinyl group, an allyl group, a butenyl group, and a cyclohexenyl group.

The ring that may be formed by combining $R_{36}$ and $R_{37}$ with each other may be either monocyclic or polycyclic. The monocyclic ring is preferably a cycloalkane structure having a carbon number of 3 to 8, and examples thereof include a cyclopropane structure, a cyclobutane structure, a cyclopentane structure, a cyclohexane structure, a cycloheptane structure, and a cyclooctane structure. The polycyclic ring is preferably a cycloalkane structure having a carbon number of 6 to 20, and examples thereof include an adamantane structure, a norbornane structure, a dicyclopentane structure, a tricyclodecane structure, and a tetracyclododecane structure. Incidentally, a part of carbon atoms in the ring structure may be substituted with a heteroatom such as oxygen atom.

Each of the groups above may have a substituent. This substituent includes, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The resin may have a structure where a plurality of repeating units represented by formula (A) are combined with each other at the portion of the group Y capable of leaving by an action of an acid.

The group Y capable of leaving by an action of an acid is more preferably a structure represented by the following formula (B):

[Chem. 14]

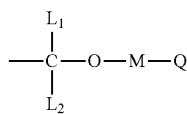

(B)

In the formula, each of $L_1$ and $L_2$ independently represents a hydrogen atom, an alkyl group, a cycloalkyl group, an aryl group or an aralkyl group.

M represents a single bond or a divalent linking group.

Q represents an alkyl group, a cycloalkyl group, a cyclic aliphatic group, an aromatic ring group, an amino group, an ammonium group, a mercapto group, a cyano group or an aldehyde group. The cyclic aliphatic group and the aromatic ring group may contain a heteroatom.

At least two members of Q, M and $L_1$ may combine with each other to form a 5- or 6-membered ring.

The alkyl group as $L_1$ and $L_2$ is, for example, an alkyl group having a carbon number of 1 to 8, and specific examples thereof include a methyl group, an ethyl group, a propyl group, an n-butyl group, a sec-butyl group, a hexyl group, and an octyl group.

The cycloalkyl group as $L_1$ and $L_2$ is, for example, a cycloalkyl group having a carbon number of 3 to 15, and specific examples thereof include a cyclopentyl group, a cyclohexyl group, a norbornyl group, and an adamantyl group.

The aryl group as $L_1$ and $L_2$ is, for example, an aryl group having a carbon number of 6 to 15, and specific examples thereof include a phenyl group, a tolyl group, a naphthyl group, and an anthryl group.

The aralkyl group as $L_1$ and $L_2$ is, for example, an aralkyl group having a carbon number of 6 to 20, and specific examples thereof include a benzyl group and a phenethyl group.

The divalent linking group as M includes, for example, an alkylene group (e.g., methylene, ethylene, propylene, butylene, hexylene, octylene), a cycloalkylene group (e.g., cyclopentylene, cyclohexylene), an alkenylene group (e.g., ethenylene, propenylene, butenylene), an arylene group (e.g., phenylene, tolylene, naphthylene), —S—, —O—, —CO—, —SO$_2$—, —N(R$_0$)—, and a combination of two or more thereof. Here, $R_0$ is a hydrogen atom or an alkyl group. The alkyl group as $R_0$ is, for example, an alkyl group having a carbon number of 1 to 8, and specific examples thereof include a methyl group, an ethyl group, a propyl group, an n-butyl group, a sec-butyl group, a hexyl group, and an octyl group.

Examples of the alkyl group and cycloalkyl group as Q are the same as those of respective groups as $L_1$ and $L_2$.

The cyclic aliphatic group and aromatic ring group as Q includes, for example, the above-described cycloalkyl group and aryl group as $L_1$ and $L_2$. These cycloalkyl group and aryl group are preferably a group having a carbon number of 3 to 15.

The heteroatom-containing cyclic aliphatic group or aromatic ring group as Q includes, for example, a group having a heterocyclic structure, such as thiirane, cyclothiolane, thiophene, furan, pyrrole, benzothiophene, benzofuran, benzopyrrole, triazine, imidazole, benzimidazole, triazole, thiadiazole, thiazole and pyrrolidone, but the ring is not limited thereto as long as it is a ring composed of carbon and a heteroatom or a ring composed of only a heteroatom.

The ring structure that may be formed by combining at least two members of Q, M and $L_1$ with each other includes, for example, a 5- or 6-membered ring structure where a propylene group or a butylene group is formed by the members above. Incidentally, this 5- or 6-membered ring structure contains an oxygen atom.

Each of the groups represented by $L_1$, $L_2$, M and Q in formula (2) may have a substituent. This substituent includes, for example, an alkyl group, a cycloalkyl group, an aryl group, an amino group, an amido group, a ureido group, a urethane group, a hydroxyl group, a carboxyl group, a halogen atom, an alkoxy group, a thioether group, an acyl group, an acyloxy group, an alkoxycarbonyl group, a cyano group, and a nitro group. The carbon number of the substituent is preferably 8 or less.

The group represented by -(M-Q) is preferably a group having a carbon number of 1 to 30, more preferably a group having a carbon number of 5 to 20. Above all, from the standpoint of outgassing reduction, a group having a carbon number of 6 or more is preferred.

The content of the repeating unit represented by formula (A) in the resin (B) is preferably from 10 to 90 mol %, more preferably from 10 to 70 mol %, still more preferably from 20 to 60 mol %, based on all repeating units.

Other preferable resins include a resin containing a repeating unit represented by the following formula (X):

[Chem. 15]

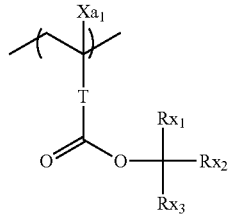

(X)

In formula (X), $Xa_1$ represents a hydrogen atom, a methyl group, a trifluoromethyl group or a hydroxymethyl group. T represents a single bond or a divalent linking group.

Each of $Rx_1$ to $Rx_3$ independently represents a linear or branched alkyl group or a monocyclic or polycyclic cycloalkyl group. At least two members of $Rx_1$ to $Rx_3$ may combine with each other to form a monocyclic or polycyclic cycloalkyl group.

The divalent linking group as T includes, for example, an alkylene group, a —(COO-Rt)- group and a —(O-Rt)- group, wherein Rt represents an alkylene group or a cycloalkylene group.

T is preferably a single bond or a —(COO-Rt)- group. Rt is preferably an alkylene group having a carbon number of 1 to 5, more preferably a —CH$_2$— group, —(CH$_2$)$_2$— group or a —(CH$_2$)$_3$— group.

The alkyl group as $Rx_1$ to $Rx_3$ is preferably an alkyl group having a carbon number of 1 to 4, such as methyl group, ethyl group, n-propyl group, isopropyl group, n-butyl group, isobutyl group and tert-butyl group.

The cycloalkyl group as $Rx_1$ to $Rx_3$ is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group.

The cycloalkyl group that may be formed by combining two members of $Rx_1$ to $Rx_3$ with each other is preferably a monocyclic cycloalkyl group such as cyclopentyl group and cyclohexyl group, or a polycyclic cycloalkyl group such as norbornyl group, tetracyclodecanyl group, tetracyclododecanyl group and adamantyl group, more preferably a monocyclic cycloalkyl group having a carbon number of 5 to 6.

Among others, an embodiment where $Rx_1$ is a methyl group or an ethyl group and $Rx_2$ and $Rx_3$ are combined with each other to form the above-described cycloalkyl group, is preferred.

Each of the groups above may have a substituent. The substituent includes, for example, an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6), and the carbon number thereof is preferably 8 or less.

Specific examples of the repeating unit having an acid-decomposable group are illustrated below, but the present invention is not limited thereto.

[Chem.16]
(In the formulae, Rx represents H, CH₃, CF₃ or CH₂OH, and each of Rxa and Rxb represents an alkyl group having a carbon number of 1 to 4.)
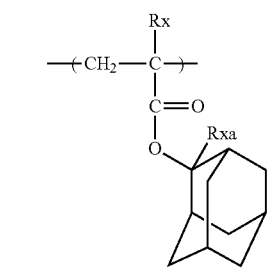
1
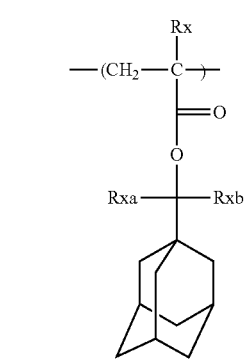
2
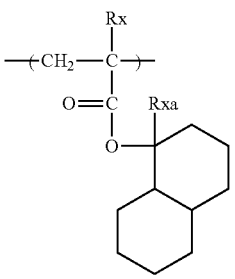
3
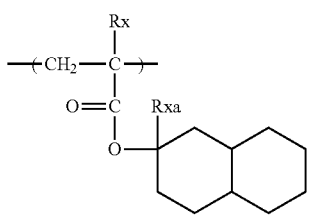
4
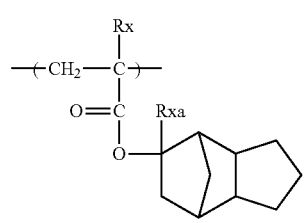
5
-continued
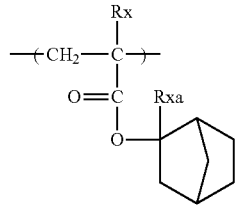
6
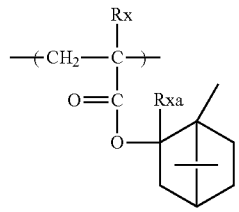
7
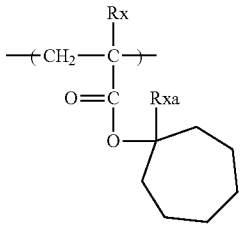
8
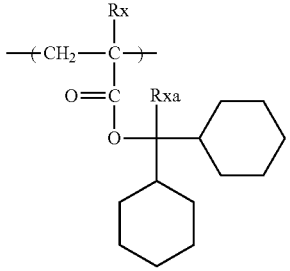
9
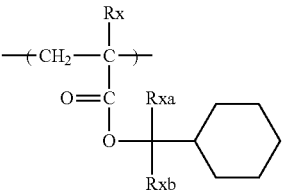
10
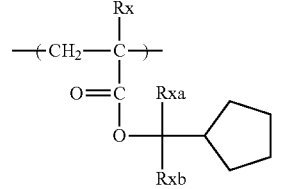
11
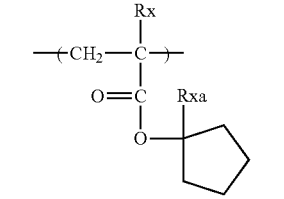
12

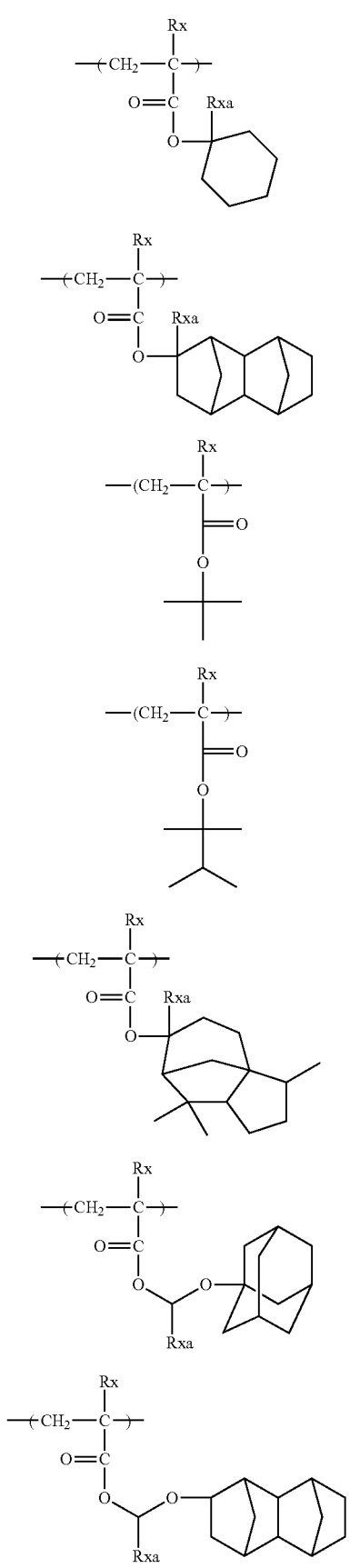
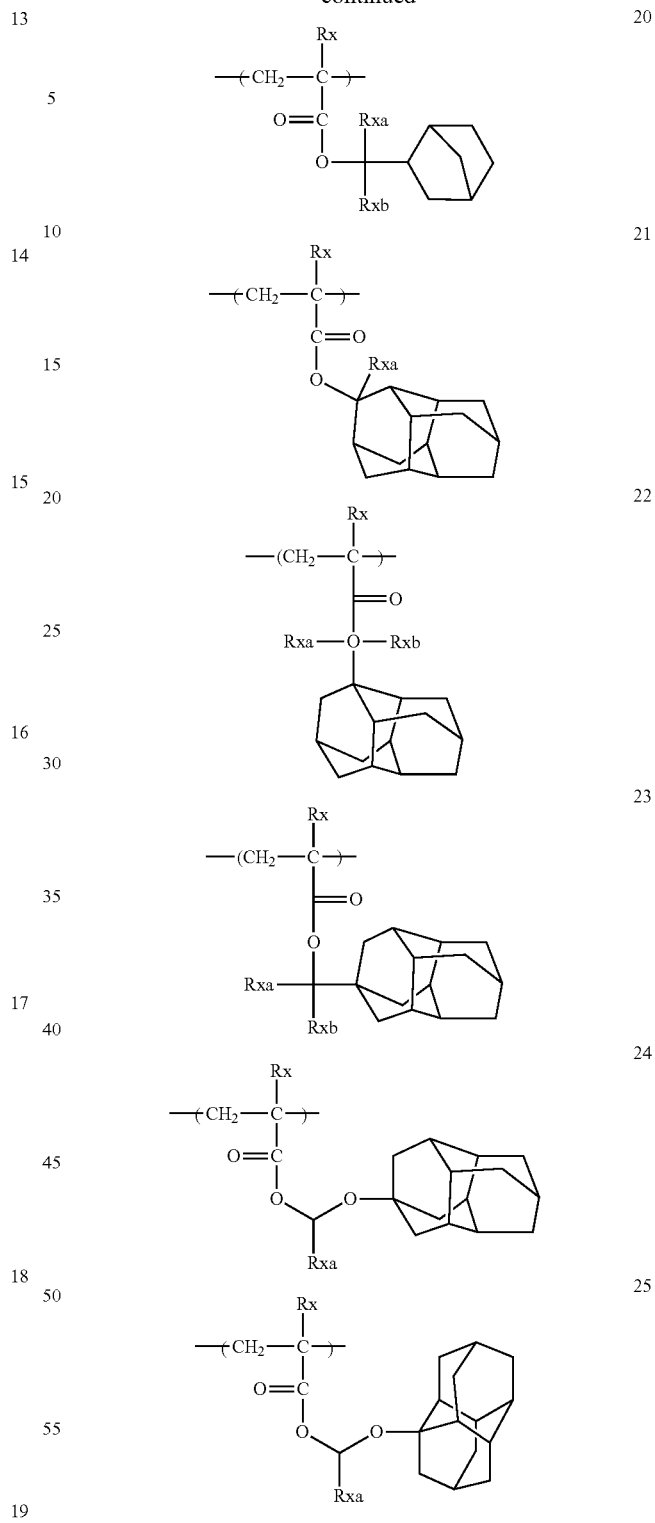

The content of the repeating unit represented by formula (X) in the resin is preferably from 30 to 90 mol %, more preferably from 5 to 80 mol %, still more preferably from 7 to 70 mol %, based on all repeating units.

The content ratio of the group capable of decomposing by an action of an acid is calculated according to formula B/(B+ S) by using the number (B) of groups capable of decomposing by an action of an acid in the resin and the number (S) of alkali-soluble groups not protected by a group capable of leaving by an action of an acid. The content ratio is preferably from 0.01 to 0.7, more preferably from 0.05 to 0.50, still more preferably from 0.05 to 0.40.

In the case of irradiating the composition of the present invention with ArF excimer laser light, the resin preferably has a monocyclic or polycyclic alicyclic hydrocarbon structure. Hereinafter, this resin is referred to as "alicyclic hydrocarbon-based acid-decomposable resin".

The alicyclic hydrocarbon-based acid-decomposable resin is preferably a resin containing at least one repeating unit selected from the group consisting of a repeating unit having an alicyclic hydrocarbon-containing partial structure represented by the following formulae (pI) to (pV), and a repeating unit represented by the following formula (II-AB):

[Chem. 17]

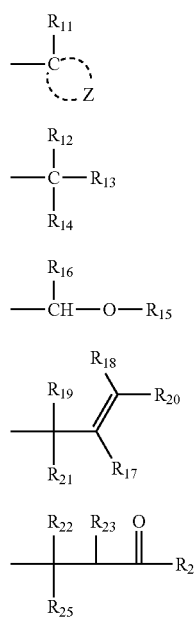

(pI)

(pII)

(pIII)

(pIV)

(pV)

In formulae (pI) to (pV), $R_{11}$ represents a methyl group, an ethyl group, an n-propyl group, an isopropyl group, an n-butyl group, an isobutyl group or a sec-butyl group. Z represents an atomic group necessary for forming a cycloalkyl group together with the carbon atom.

Each of $R_{12}$ to $R_{16}$ independently represents a linear or branched alkyl group having a carbon number of 1 to 4 or a cycloalkyl group, provided that at least one of $R_{12}$ to $R_{14}$ represents a cycloalkyl group and that either $R_{15}$ or $R_{16}$ represents a cycloalkyl group.

Each of $R_{17}$ to $R_{21}$ independently represents a hydrogen atom, a linear or branched alkyl group having a carbon number of 1 to 4, or a cycloalkyl group, provided that at least one of $R_{17}$ to $R_{21}$ represents a cycloalkyl group and that either $R_{19}$ or $R_{21}$ represents a linear or branched alkyl group having a carbon number of 1 to 4 or a cycloalkyl group.

Each of $R_{22}$ to $R_{25}$ independently represents a hydrogen atom, a linear or branched alkyl group having a carbon number of 1 to 4, or a cycloalkyl group, provided that at least one of $R_{22}$ to $R_{25}$ represents a cycloalkyl group. $R_{23}$ and $R_{24}$ may combine with each other to form a ring structure.

[Chem. 18]

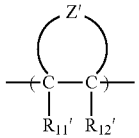

(II-AB)

In formula (II-AB), each of $R_{11}'$ and $R_{12}'$ independently represents a hydrogen atom, a cyano group, a halogen atom or an alkyl group.

Z' represents an atomic group necessary for forming an alicyclic structure together with two carbon atoms (C—C) to which Z' is bonded.

Formula (II-AB) is preferably the following formula (II-AB1) or (II-AB2):

[Chem. 19]

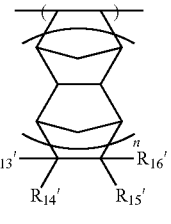

(II-AB1)

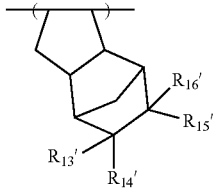

(II-AB2)

In formulae (II-AB1) and (II-AB2), each of $R_{13}'$ to $R_{16}'$ independently represents a hydrogen atom, a halogen atom, a cyano group, a hydroxyl group, —COOH, —COOR$_5$, a group capable of decomposing by an action of an acid, —C(=O)—X-A'-R$_{17}'$, an alkyl group or a cycloalkyl group. Here, $R_5$ represents an alkyl group, a cycloalkyl group or a group having a lactone structure. X represents an oxygen atom, a sulfur atom, —NH—, —NHSO$_2$— or —NHSO$_2$NH—. A' represents a single bond or a divalent linking group. $R_{17}'$ represents —COOH, —COOR$_5$, —CN, a hydroxyl group, an alkoxy group, —CO—NH—R$_6$, —CO—NH—SO$_2$—R$_6$ or a group having a lactone structure, wherein $R_6$ represents an alkyl group or a cycloalkyl group. At least two members of $R_{13}'$ to $R_{16}'$ may combine with each other to form a ring structure.

n represents 0 or 1.

In formulae (pI) to (pV), the alkyl group of $R_{12}$ to $R_{25}$ is preferably a linear or branched alkyl group having a carbon number of 1 to 4, and examples thereof include a methyl group, an ethyl group, a propyl group, an n-butyl group, a sec-butyl group, and a tert-butyl group.

The cycloalkyl group of $R_{12}$ to $R_{25}$ or the cycloalkyl group formed by Z together with the carbon atom may be a monocyclic cycloalkyl group or a polycyclic cycloalkyl group. Specific examples thereof include a group having a monocyclo, bicyclo, tricyclo or tetracyclo structure and having a carbon number of 5 or more. The carbon number thereof is preferably from 6 to 30, more preferably from 7 to 25.

Preferable cycloalkyl groups include, for example, an adamantyl group, a noradamantyl group, a decalin residue group, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. An adamantyl group, a norbornyl group, a cyclohexyl group, a cyclopentyl group, a tetracyclododecanyl group, and a tricyclodecanyl group are more preferred.

These alkyl group and cycloalkyl group may have a substituent. This substituent includes, for example, an alkyl group (having a carbon number of 1 to 4), a halogen atom, a hydroxyl group, an alkoxy group (having a carbon number of 1 to 4), a carboxyl group, and an alkoxycarbonyl group (having a carbon number of 2 to 6). These substituents may have a further substituent. The further substituent includes, for example, a hydroxyl group, a halogen atom, and an alkoxy group.

The structures represented by formulae (pI) to (pV) may be used for the protection of an alkali-soluble group. The alkali-soluble group includes various groups known in this technical field.

Specific examples thereof include structures where the hydrogen atom of a carboxylic acid group, sulfonic acid group, phenol group or thiol group is substituted by a structure represented by formulae (pI) to (pV). A structure where the hydrogen atom of a carboxylic acid group or sulfonic acid group is substituted by a structure represented by formulae (pI) to (pV) is preferred.

The repeating unit having an alkali-soluble group protected by a structure represented by formulae (pI) to (pV) is preferably a repeating unit represented by the following formula (pA):

[Chem. 20]

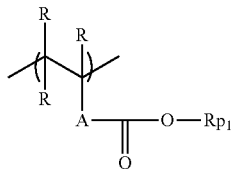

(pA)

In formula (pA), R represents a hydrogen atom, a halogen atom or a linear or branched alkyl group having from a carbon number of 1 to 4, and each R may be the same as or different from every other R.

A is selected from the group consisting of a single bond, an alkylene group, an ether group, a thioether group, a carbonyl group, an ester group, an amido group, a sulfonamide group, a urethane group, a urea group, and a combination of two or more thereof, and is preferably a single bond.

$Rp_1$ is a group represented by any one of formulae (pI) to (pV).

The repeating unit represented by formula (pA) is most preferably a repeating unit composed of a 2-alkyl-2-adamantyl(meth)acrylate or a dialkyl(1-adamantyl)methyl(meth)acrylate.

Specific examples of the repeating unit represented by formula (pA) are the same as those described above as the repeating unit represented by formula (X), and other specific examples of the repeating unit represented by formula (pA) are illustrated below.

[Chem. 21]

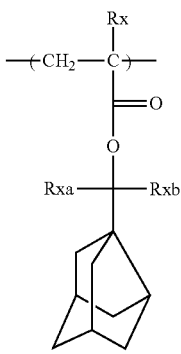

1

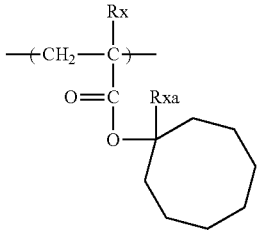

2

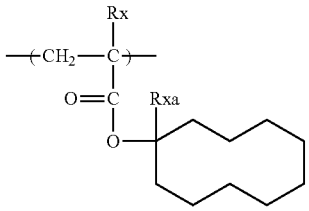

3

In the structural formulae above, Rx represents H, $CH_3$, $CF_3$ or $CH_2OH$, and each of Rxa and Rxb independently represents an alkyl group having a carbon number of 1 to 4.

The halogen atom as $R_{11}'$ or $R_{12}'$ in formula (II-AB) includes, for example, a chlorine atom, a bromine atom, a fluorine atom, and an iodine atom.

The alkyl group as $R_{11}'$ or $R_{12}'$ is preferably a linear or branched alkyl group having a carbon number of 1 to 10, and examples thereof include a methyl group, an ethyl group, an n-propyl group, an isopropyl group, and a linear or branched butyl, pentyl, hexyl or heptyl group.

The atomic group represented by Z' is an atomic group for forming, in the resin, an alicyclic hydrocarbon repeating unit that may have a substituent. The atomic group is preferably an atomic group for forming a crosslinked alicyclic hydrocarbon repeating unit.

Examples of the framework of the alicyclic hydrocarbon formed are the same as those of the cycloalkyl group of $R_{12}$ to $R_{25}$ in formulae (pI) to (pVI).

The framework of the alicyclic hydrocarbon may have a substituent, and the substituent includes, for example, $R_{13}'$ to $R_{16}'$ in formulae (II-AB1) and (II-AB2).

In the alicyclic hydrocarbon-based acid-decomposable resin, the group capable of decomposing by an action of an acid may be contained in at least one repeating unit out of a repeating unit having an alicyclic hydrocarbon-containing partial structure represented by formulae (pI) to (pV), a repeating unit represented by formula (II-AB), and a repeating unit composed of the later-described copolymerization component.

Each of the substituents $R_{13}'$ to $R_{16}'$ in formulae (II-AB1) and (II-AB2) may work out to a substituent of the atomic group Z' for forming an alicyclic structure or a crosslinked alicyclic structure in formula (II-AB).

Specific examples of the repeating units represented by formulae (II-AB 1) and (II-AB2) are illustrated below, but the present invention is not limited to these examples.

[Chem. 22]

[II-1]
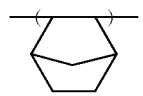

[II-2]
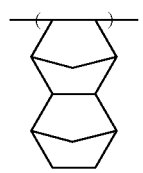

[II-3]
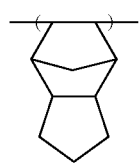

[II-4]
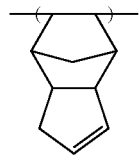

[II-5]
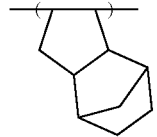

[II-6]
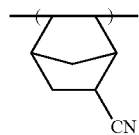

[II-7]
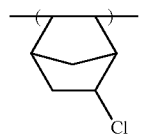

[II-8]
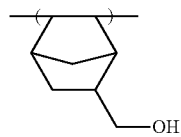

[II-9]
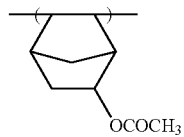

[II-10]
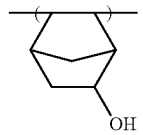

[II-11]
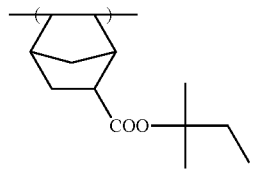

[II-12]
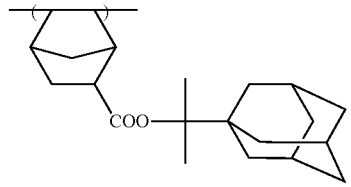

[II-13]
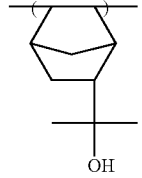

[II-14]
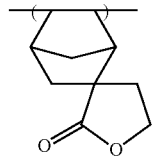

[II-15]
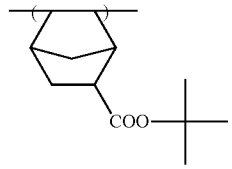

[II-16]
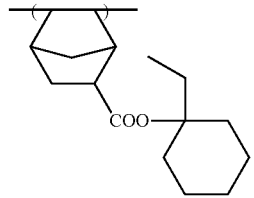

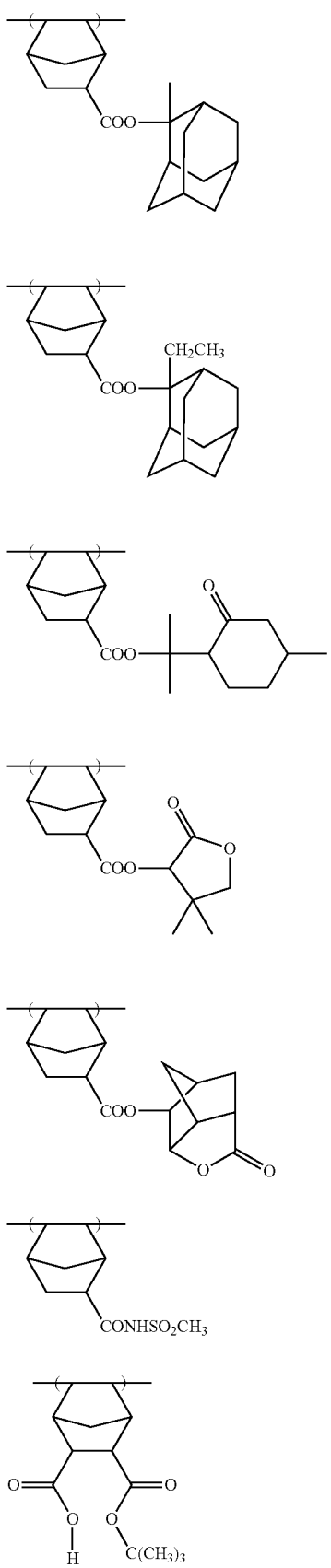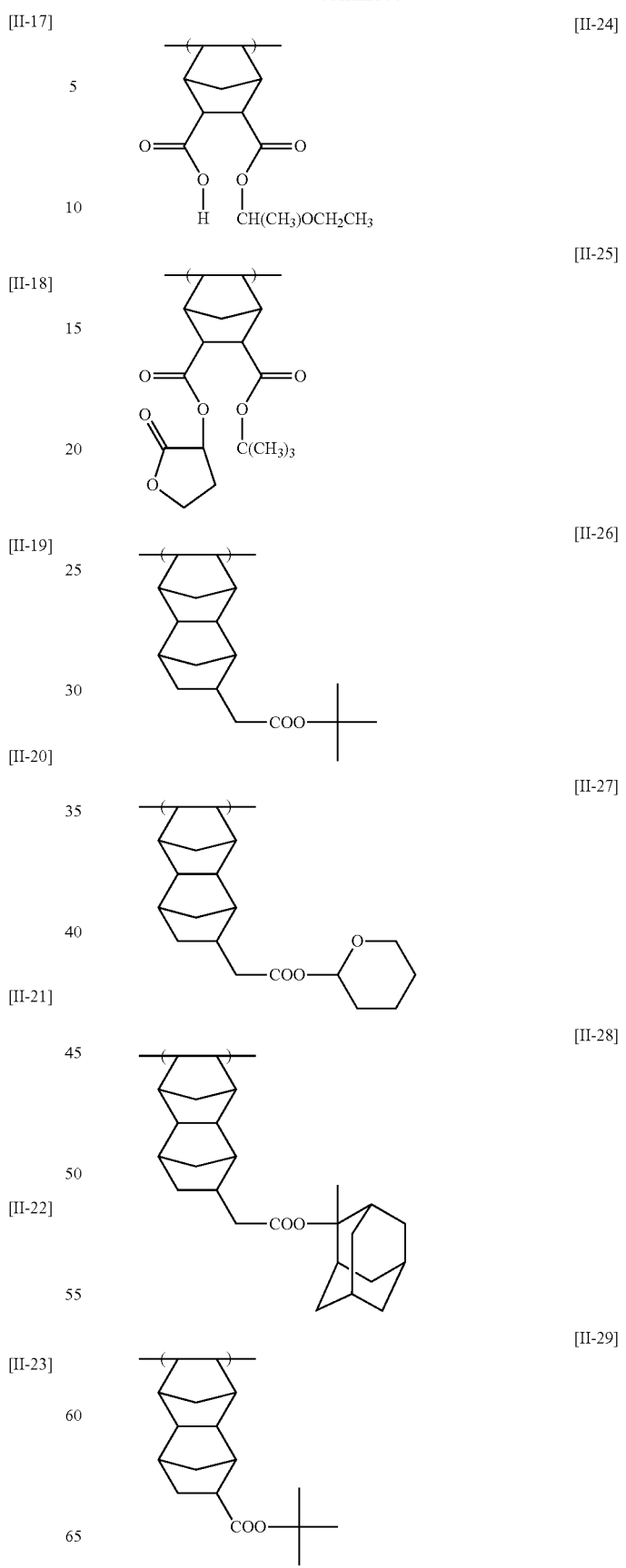

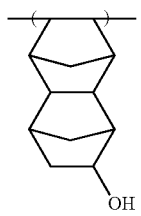
[II-30]

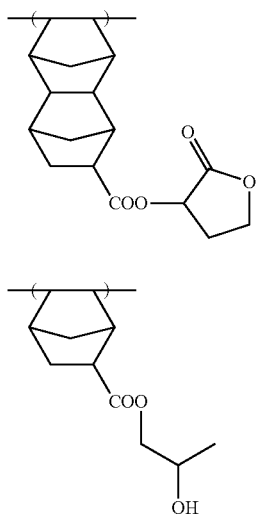
[II-31]

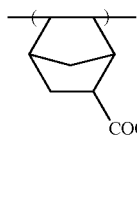
[II-32]

The resin (B) preferably contains a repeating unit having a lactone group. The lactone group is preferably a group having a 5- to 7-membered ring lactone structure, more preferably a 5- to 7-membered ring lactone structure to which another ring structure is fused in the form of forming a bicyclo or spiro structure.

The resin (B) more preferably contains a repeating unit having a group containing a lactone structure represented by any one of the following formulae (LC1-1) to (LC1-17). The group having a lactone structure may be bonded directly to the main chain. Preferable lactone structures include (LC1-1), (LC1-4), (LC1-5), (LC1-6), (LC1-13), (LC1-14) and (LC1-17). By virtue of using a specific lactone structure, the line edge roughness and development defect can be more reduced.

[Chem. 23]

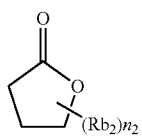
LC1-1

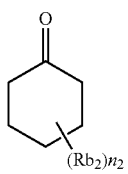
LC1-2

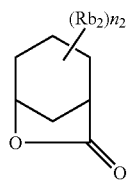
LC1-3

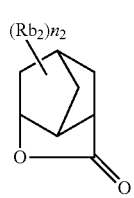
LC1-4

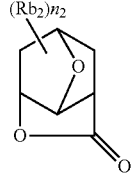
LC1-5

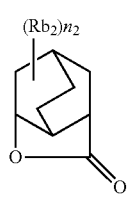
LC1-6

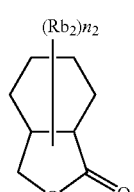
LC1-7

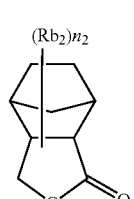
LC1-8

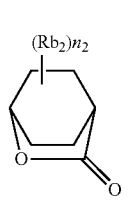
LC1-9

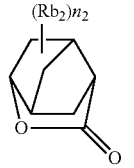
LC1-10

LC1-11
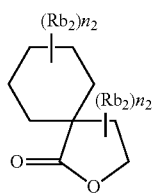

LC1-12
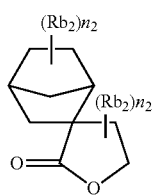

LC1-13
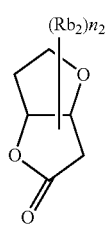

LC1-14
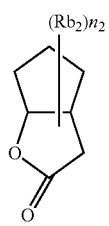

LC1-15
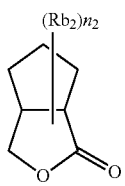

LC1-16
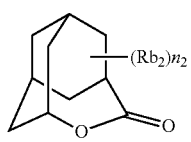

LC1-17
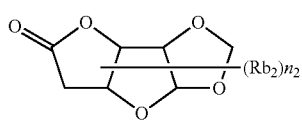

The lactone structure moiety may or may not have a substituent ($Rb_2$). Preferable substituents ($Rb_2$) include, for example, an alkyl group having a carbon number of 1 to 8, a cycloalkyl group having a carbon number of 3 to 7, an alkoxy group having a carbon number of 1 to 8, an alkoxycarbonyl group having a carbon number of 2 to 8, a carboxyl group, a halogen atom, a hydroxyl group, a cyano group, and an acid-decomposable group.

$n_2$ represents an integer of 0 to 4. When $n_2$ is an integer of 2 or more, each $Rb_2$ may be the same as or different from every other $Rb_2$. Also, in this case, the plurality of $Rb_2$ may combine with each other to form a ring structure.

The repeating unit having a group containing a lactone structure represented by any one of formulae (LC 1-1) to (LC 1-17) includes, for example, a repeating unit where at least one of $R_{13}'$ to $R_{16}'$ in formula (II-AB1) or (II-AB2) has a group represented by formulae (LC1-1) to (LC1-17), and a repeating unit represented by the following formula (AI). Examples of the former include a structure where $R_5$ of —$COOR_5$ is a group represented by formulae (LC1-1) to (LC1-17).

[Chem. 24]

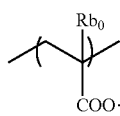

(AI)

In formula (AI), $Rb_0$ represents a hydrogen atom, a halogen atom or an alkyl group having a carbon number of 1 to 4.

The alkyl group of $Rb_0$ includes, for example, a methyl group, an ethyl group, a propyl group, an n-butyl group, a sec-butyl group, and a tert-butyl group. This alkyl group may have a substituent. The substituent includes, for example, a hydroxyl group and a halogen atom.

The halogen atom of $Rb_0$ includes a fluorine atom, a chlorine atom, a bromine atom, and an iodine atom.

$Rb_0$ is preferably a hydrogen atom or a methyl group.

Ab represents an alkylene group, a divalent linking group having a monocyclic or polycyclic alicyclic hydrocarbon structure, a single bond, an ether group, an ester group, a carbonyl group, or a combination thereof. Ab is preferably a single bond or a linking group represented by -$Ab_1$-$CO_2$—.

$Ab_1$ is a linear or branched alkylene group or a monocyclic or polycyclic cycloalkylene group, preferably a methylene group, an ethylene group, a cyclohexylene group, an adamantylene group or a norbornylene group.

V represents a group represented by any one of formulae (LC1-1) to (LC1-17).

The repeating unit having a lactone structure usually has an optical isomer, and any optical isomer may be used. One optical isomer may be used alone, or a plurality of optical isomers may be mixed and used. In the case of mainly using one optical isomer, the optical purity thereof is preferably 90% ee or more, more preferably 95% ee or more.

Particularly preferable repeating units having a lactone group include the following repeating units. By selecting an optimal lactone group, the pattern profile and the iso/dense bias are improved. In the formulae, each of Rx and R represents H, $CH_3$, $CH_2OH$ or $CF_3$.

[Chem. 25]

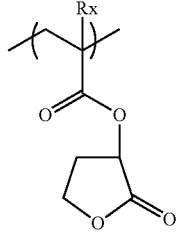 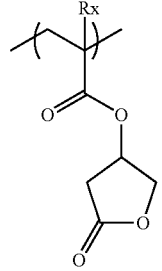

-continued
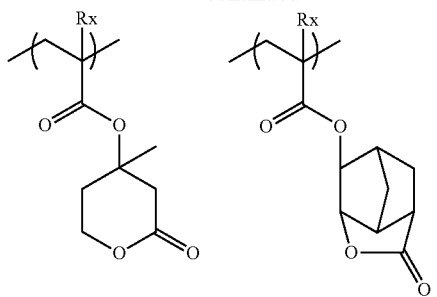
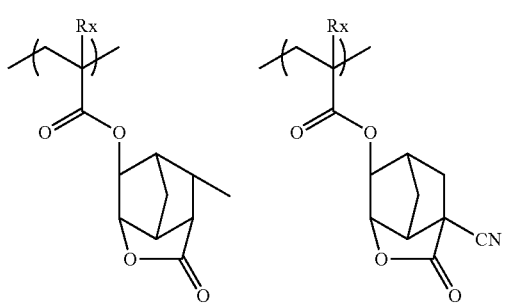
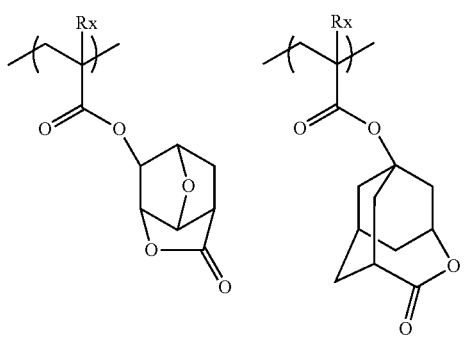
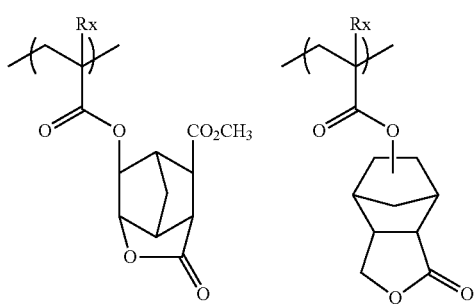
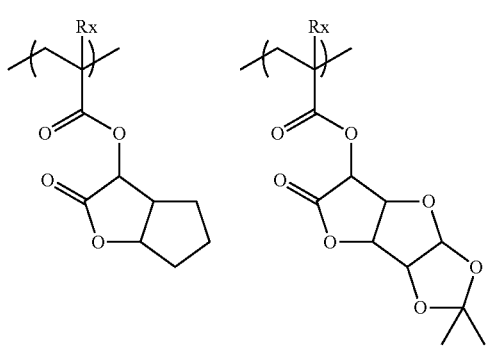
-continued
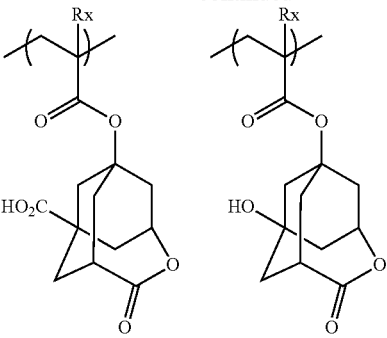
[Chem. 26]
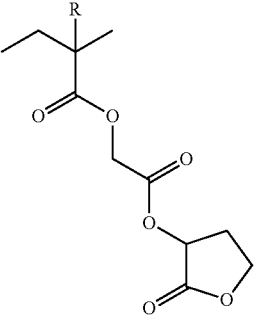
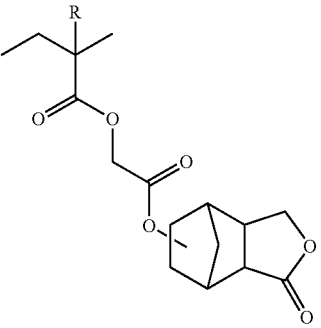
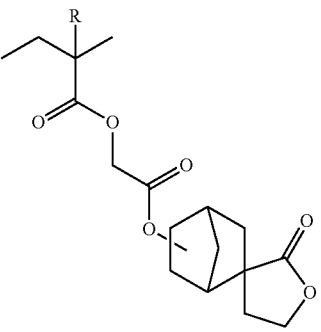
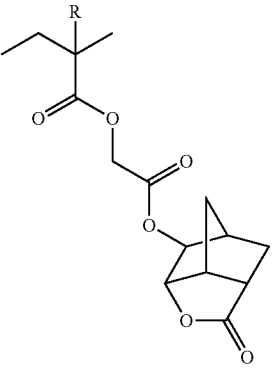

51
-continued
[Chem. 27]
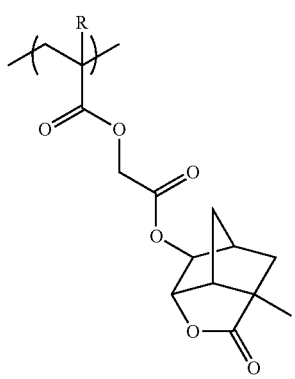
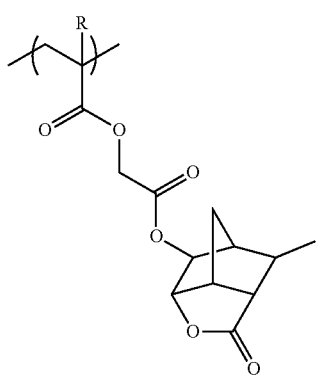
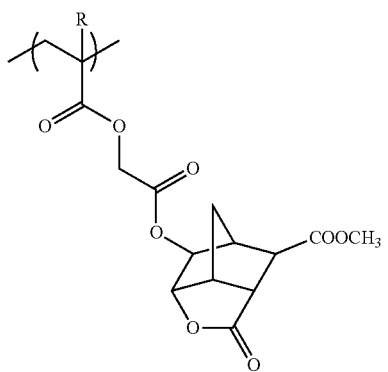
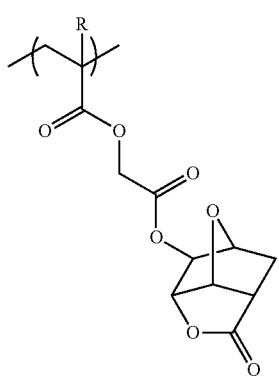
52
-continued
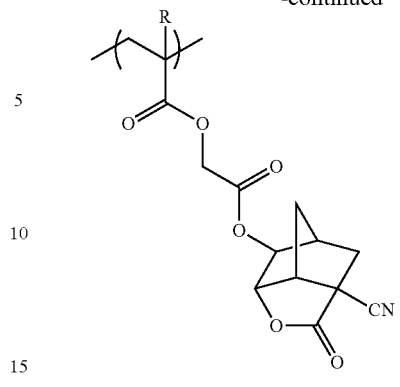
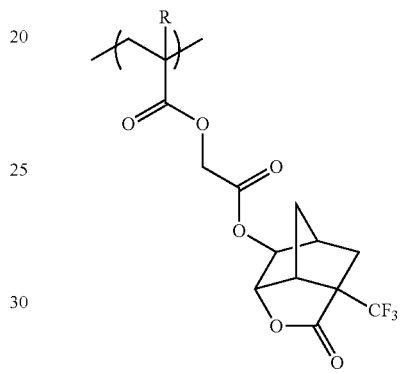
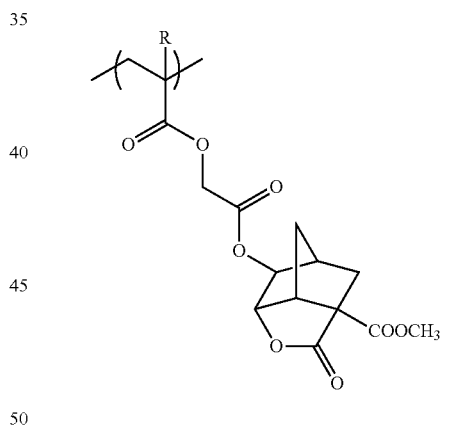
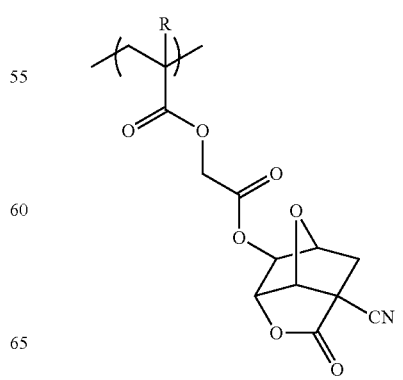

53
-continued
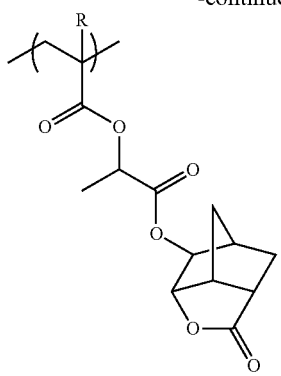
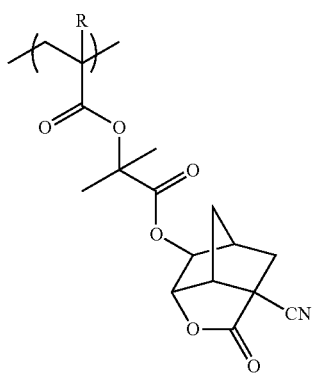
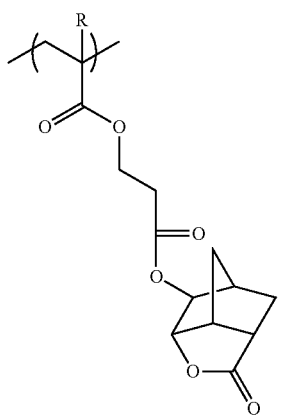
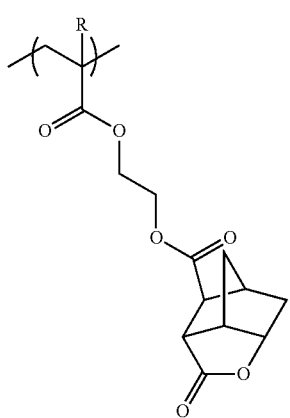
54
-continued
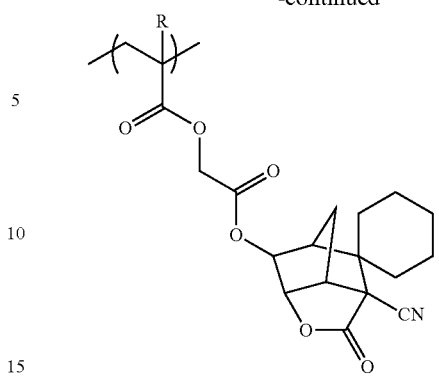
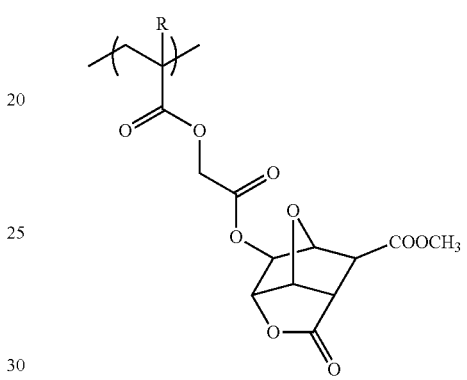
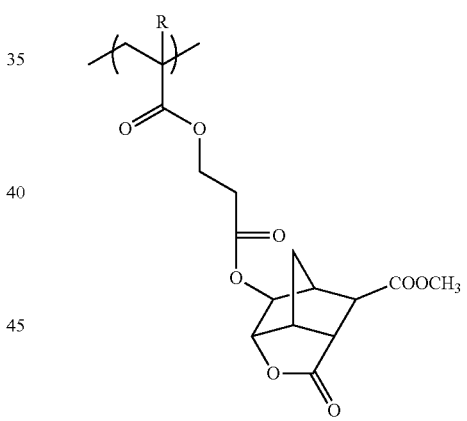
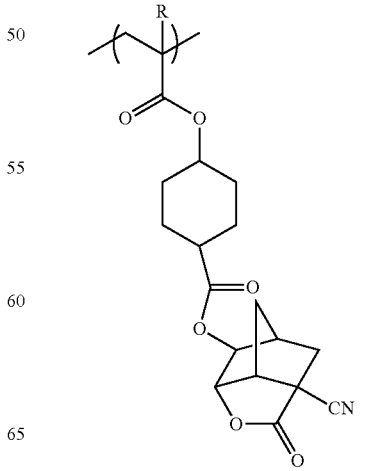

-continued

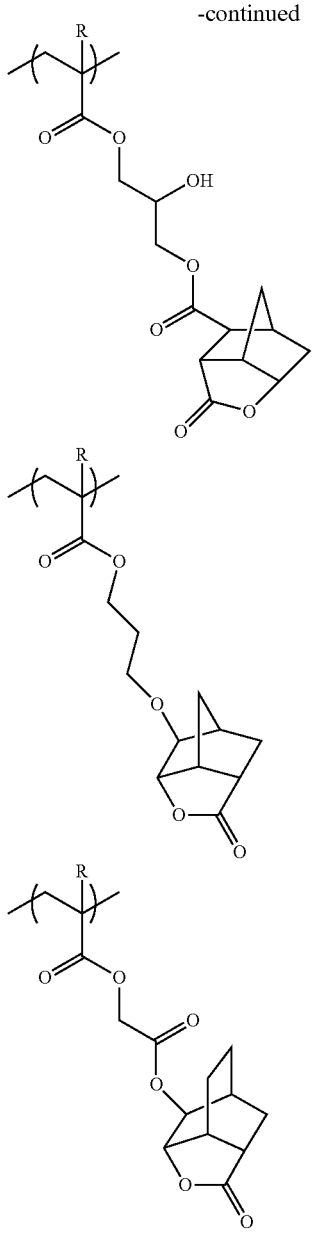

The resin (B) may contain a plurality of repeating units each containing a lactone group. In this case, either one of (1) using one repeating unit where Ab in formula (AI) is a single bond and one repeating unit where Ab is -Ab$_1$-CO$_2$—, or (2) using, in combination, two repeating units where Ab in formula (AI) is -Ab$_1$-CO$_2$—, is preferred.

The content of the lactone group-containing repeating unit (in the case of containing a plurality of lactone group-containing repeating units, the sum total thereof) is preferably from 3 to 70 mol %, more preferably from 5 to 60 mol %, based on all repeating units in the resin (B).

The resin (B) preferably contains a repeating unit having an alicyclic hydrocarbon structure substituted with a polar group. Thanks to this configuration, the adherence to substrate and the affinity for developer can be enhanced. The polar group is preferably a hydroxyl group or a cyano group. The hydroxyl group as the polar group forms an alcoholic hydroxyl group.

The alicyclic hydrocarbon structure substituted with a polar group includes, for example, a structure represented by the following formula (VIIa) or (VIIb):

[Chem. 28]

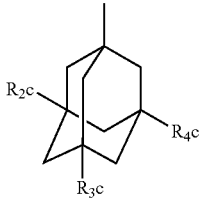
(VIIa)

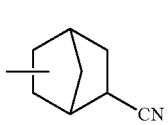
(VIIb)

In formula (VIIa), each of R$_2$c to R$_4$c independently represents a hydrogen atom, a hydroxyl group or a cyano group, provided that at least one of R$_2$c to R$_4$c represents a hydroxyl group or a cyano group. A structure where one or two members out of R$_2$c to R$_4$c are a hydroxyl group with the remaining being a hydrogen atom is preferred, and it is more preferred that two members out of R$_2$c to R$_4$c are a hydroxyl group and the remaining one member is a hydrogen atom.

The group represented by formula (VIIa) is preferably a dihydroxy form or monohydroxy form, more preferably a dihydroxy form.

The repeating unit having a group represented by formula (VIIa) or (VIIb) includes a repeating unit where at least one of R$_{13}$' to R$_{16}$' in formulae (II-AB1) and (II-AB2) has a group represented by formula (VIIa) or (VIIb), and a repeating unit represented by the following formula (AIIa) or (AIIb). Examples of the former include a structure where R$_5$ of —COOR$_5$ is a group represented by formula (VIIa) or (VIIb).

[Chem. 29]

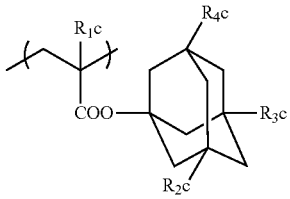
(AIIa)

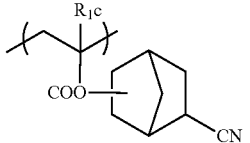
(AIIb)

In formulae (AIIa) and (AIIb), R$_1$c represents a hydrogen atom, a methyl group, a trifluoromethyl group or a hydroxymethyl group.

R$_2$c to R$_4$c have the same meaning as R$_2$c to R$_4$c in formula (VIIa).

Specific examples of the repeating unit represented by formula (AIIa) or (AIIb) are illustrated below, but the present invention is not limited thereto.

[Chem. 30]

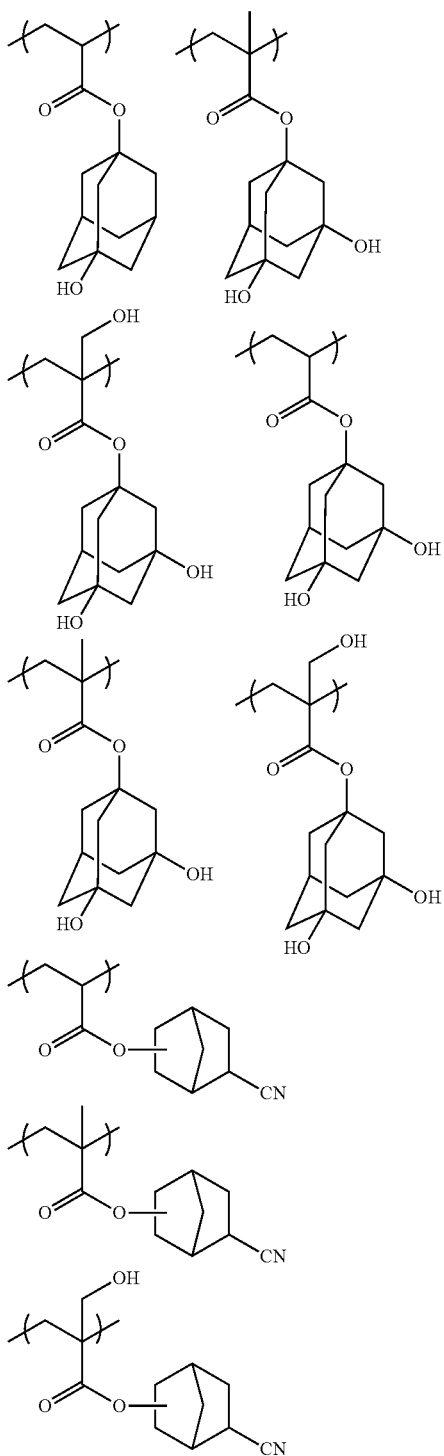

The content of the repeating unit above (in the case where a plurality of pertinent repeating units, the sum total thereof) is preferably from 3 to 30 mol %, more preferably from 5 to 25 mol %, based on all repeating units in the resin (B).

The resin of the present invention may contain a repeating unit containing neither a hydroxyl group nor a cyano group and being stable to an acid, in addition to the above-described repeating units.

The unit above includes, more specifically, a repeating unit having a non-acid-decomposable aryl structure or cycloalkyl structure in a side chain of an acrylic structure, represented, for example, by the formula below. By having this structure, contrast adjustment, enhancement of etching resistance, etc. can be expected.

This repeating unit may be introduced into the above-described resin containing a hydroxystyrene repeating unit or into an alicyclic hydrocarbon-based acid-decomposable resin, but in the case of being introduced into an alicyclic hydrocarbon-based acid-decomposable resin, from the standpoint of light absorption at 193 nm, it is preferable not to contain an aromatic ring structure.

[Chem. 31]

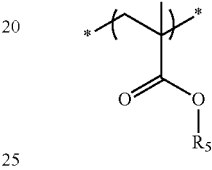

(III)

In formula (III), $R_5$ represents a hydrocarbon group.

Ra represents a hydrogen atom, an alkyl group (preferably a methyl group), a hydroxyalkyl group (preferably a hydroxymethyl group) or a trifluoromethyl group.

The hydrocarbon group of $R_5$ preferably has a cyclic structure therein. Specific examples of the hydrocarbon group containing a cyclic structure include a monocyclic or polycyclic cycloalkyl group (preferably having a carbon number of 3 to 12, more preferably a carbon number of 3 to 7), a monocyclic or polycyclic cycloalkenyl group (preferably having a carbon number of 3 to 12), an aryl group (preferably having a carbon number of 6 to 20, more preferably a carbon number of 6 to 12), and an aralkyl group (preferably having a carbon number of 7 to 20, more preferably a carbon number of 7 to 12).

The cycloalkyl group includes a ring assembly hydrocarbon group and a crosslinked cyclic hydrocarbon group. The crosslinked cyclic hydrocarbon ring includes a bicyclic hydrocarbon ring, a tricyclic hydrocarbon ring, a tetracyclic hydrocarbon ring, etc. The crosslinked cyclic hydrocarbon ring also includes a condensed ring formed, for example, by fusing a plurality of 5- to 8-membered cycloalkane rings. Preferable crosslinked cyclic hydrocarbon rings include a norbornyl group, an adamantyl group, a bicyclooctanyl group, and a tricyclo[5,2,1,0$^{2,6}$]decanyl group, and the like. More preferable crosslinked-ring hydrocarbon rings include a norbornyl group and an adamantyl group.

Preferable examples of the aryl group include a phenyl group, a naphthyl group, and a biphenyl group, and preferable examples of the aralkyl group include a phenylmethyl group, a phenylethyl group, and a naphthylmethyl group.

These hydrocarbon groups may have a substituent, and preferable substituents include a halogen atom, an alkyl group, a hydroxyl group protected by a protective group, an amino group protected by a protective group, and the like. Preferable halogen atoms include bromine, chlorine and fluorine atoms, and preferable alkyl groups include methyl group, ethyl, butyl and tert-butyl groups. The alkyl group above may further have a substituent, and the substituent that may be further substituted on the alkyl group includes a halogen atom, an alkyl group, a hydroxyl group protected by a protective group, and an amino group protected by a protective group.

The protective group includes, for example, an alkyl group, a cycloalkyl group, an aralkyl group, a substituted methyl group, a substituted ethyl group, an alkoxycarbonyl group, and an aralkyloxycarbonyl group. Preferable alkyl groups include an alkyl group having a carbon number of 1 to 4; preferable substituted methyl groups include methoxymethyl, methoxythiomethyl, benzyloxymethyl, tert-butoxymethyl and 2-methoxyethoxymethyl groups; preferable substituted ethyl groups include 1-ethoxyethyl and 1-methyl-1-methoxyethyl group; preferable groups include an aliphatic acyl group having a carbon number of 1 to 6, such as formyl, acetyl, propionyl, butyryl, isobutyryl, valeryl and pivaloyl groups; and the alkoxycarbonyl group includes, for example, an alkoxycarbonyl group having a carbon number of 1 to 4.

The resin (B) may or may not contain a repeating unit represented by formula (III), but in the case of containing a repeating unit represented by formula (III), the content thereof is preferably from 1 to 40 mol %, more preferably from 1 to 20 mol %, based on all repeating units in the resin (B).

Specific examples of the repeating unit represented by formula (III) are illustrated below, but the present invention is not limited thereto. In the formulae, Ra represents H, CH$_3$, CH$_2$OH or CF$_3$.

[Chem. 32]

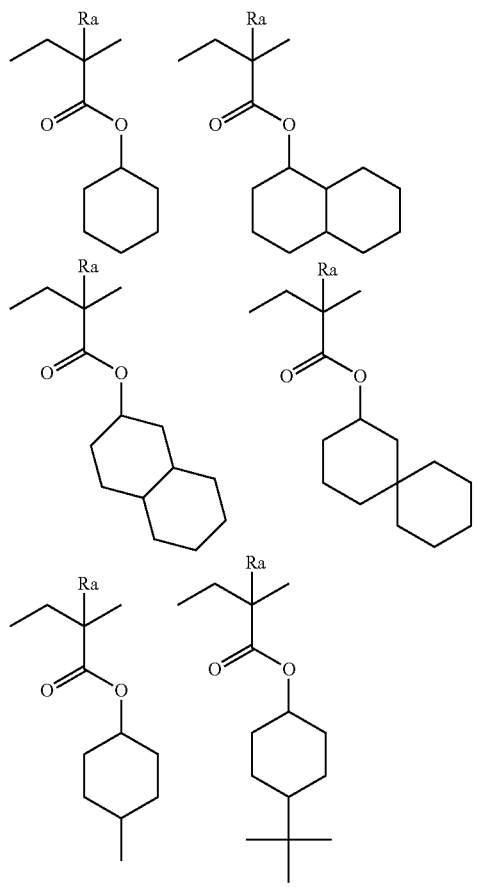
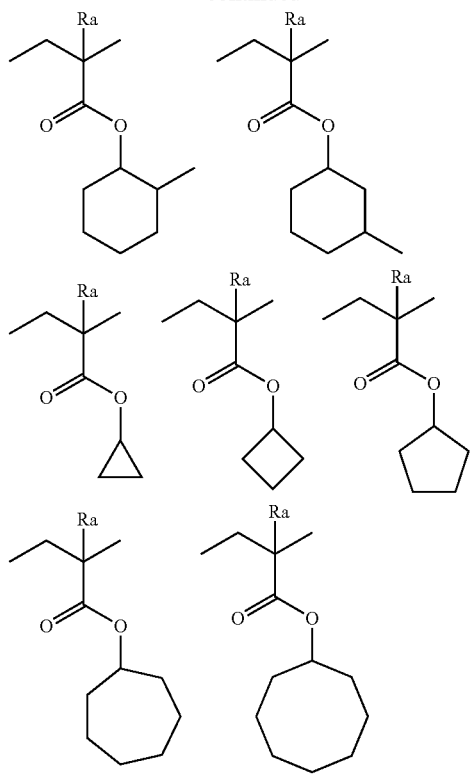
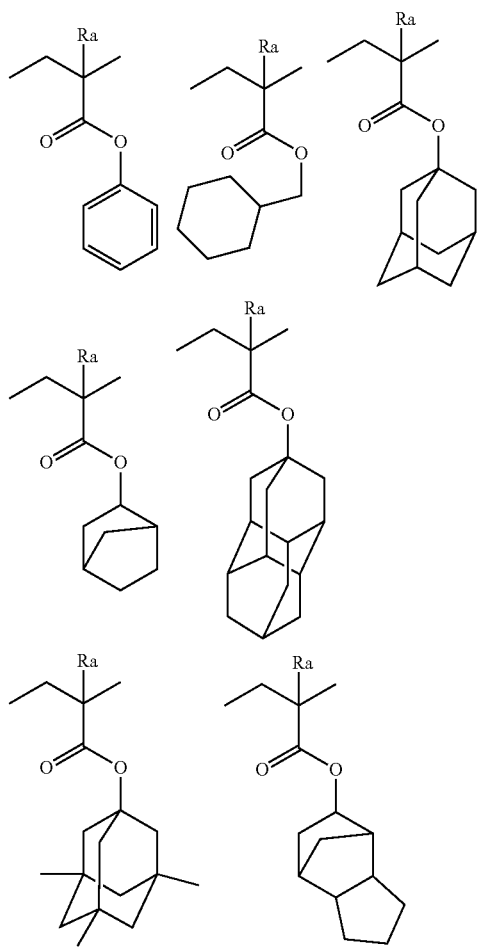

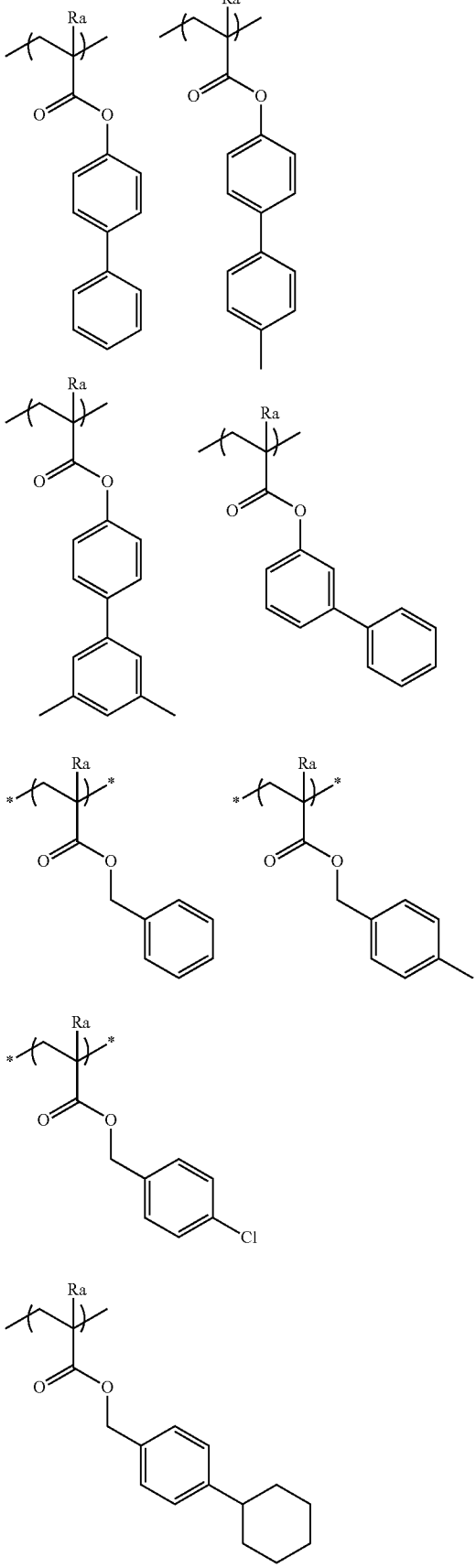

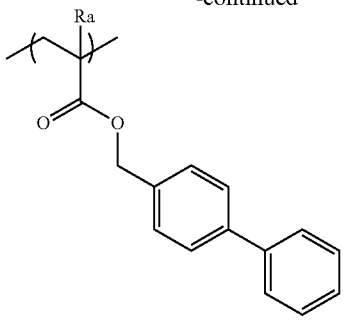

The resin (B) may or may not contain the above-described repeating unit, but in the case of containing the repeating unit, the content thereof (in the case of containing a plurality of pertinent repeating units, the sum total thereof) is preferably from 1 to 30 mol %, more preferably from 1 to 20 mol %, based on all repeating units in the resin.

The resin (B) may contain a repeating unit represented by the following formula (VIII):

[Chem. 33]

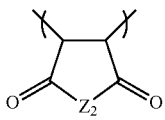

(VIII)

In formula (VIII), $Z_2$ represents —O— or —N($R_{41}$)—. $R_{41}$ represents a hydrogen atom, a hydroxyl group, an alkyl group or —OSO$_2$—$R_{42}$, wherein $R_{42}$ represents an alkyl group, a cycloalkyl group or a camphor residue group. The alkyl group as $R_{41}$ or $R_{42}$ may be substituted with a halogen atom or the like. In this case, the halogen atom is preferably a fluorine atom.

Specific examples of the repeating unit represented by formula (VIII) are illustrated below, but the present invention is not limited thereto.

[Chem. 34]

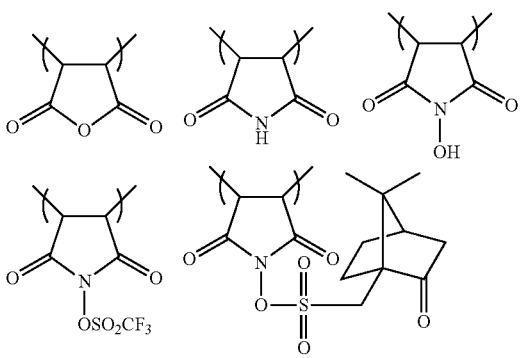

The resin (B) preferably contains a repeating unit having an alkali-soluble group, more preferably a repeating unit having a carboxy group. Thanks to such a repeating unit, the resolution increases in usage of forming contact holes.

As for the repeating unit having a carboxy group, both a repeating unit where a carboxy group is directly bonded to the main chain of the resin, and a repeating unit where a carboxy group is bonded to the main chain of the resin through a linking group, are preferred.

Examples of the former include a repeating unit by an acrylic acid or a methacrylic acid. Also, the linking group in the latter may have a monocyclic or polycyclic hydrocarbon structure.

The repeating unit having a carboxy group is most preferably a repeating unit by an acrylic acid or a methacrylic acid.

The weight average molecular weight of the resin capable of decomposing by an action of an acid to increase the solubility in an alkali developer is preferably from 2,000 to 200,000 in terms of polystyrene as determined by the GPC method. By setting the weight average molecular weight to 2,000 or more, heat resistance and dry etching resistance can be improved in particular. Also, by setting the weight average molecular weight to 200,000 or less, developability can be increased in particular and at the same time, thanks to reduction in the viscosity of the composition, the film-forming property of the composition can be enhanced.

The molecular weight is more preferably from 2,500 to 50,000, still more preferably from 3,000 to 20,000. In the fine pattern formation using an electron beam, an X-ray or a high-energy ray at a wavelength of 50 nm or less (e.g., EUV), the weight average molecular weight is most preferably from 3,000 to 10,000. By adjusting the molecular weight, enhancement of the heat resistance and resolution of the composition and decrease or the like of the development defect can be achieved at the same time.

The polydispersity (Mw/Mn) of the resin capable of decomposing by an action of an acid to increase the solubility in an alkali developer is preferably from 1.0 to 3.0, more preferably from 1.2 to 2.5, still more preferably from 1.2 to 1.6. By adjusting the polydispersity to this range, for example, the line edge roughness performance can be improved.

Specific examples of the resin described above are illustrated below, but the present invention is not limited thereto.

[Chem. 35]

(R-1)
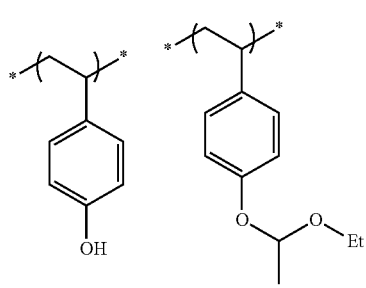

(R-2)
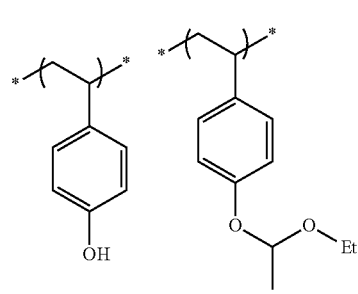

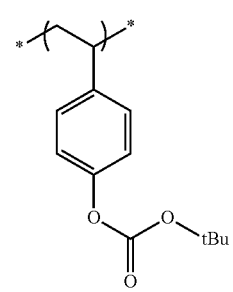

(R-3)
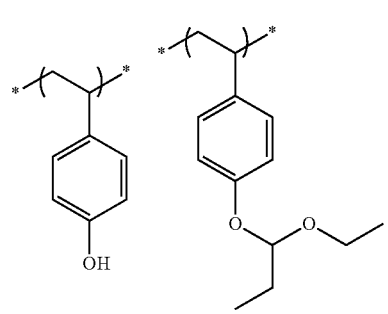

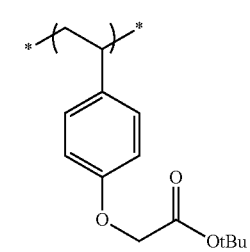

(R-4)
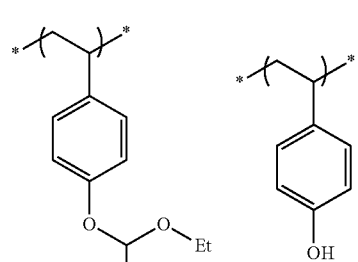

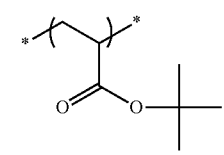

(R-5)
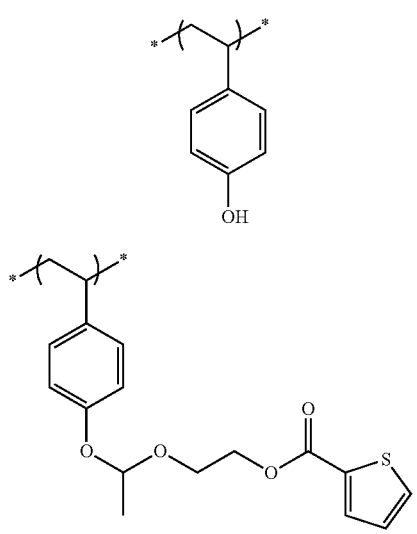
(R-6)
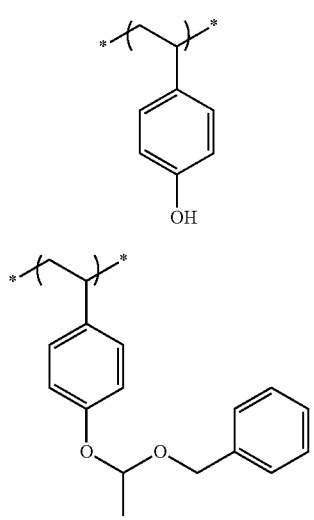
(R-7)
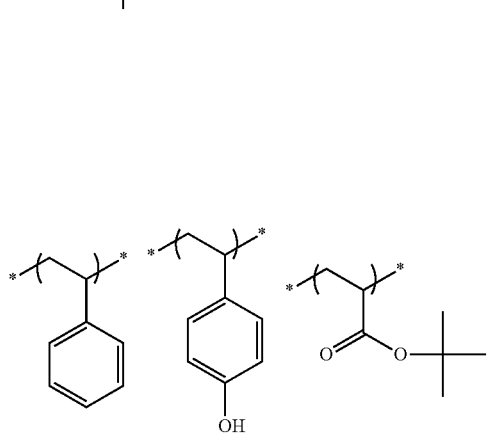
(R-8)
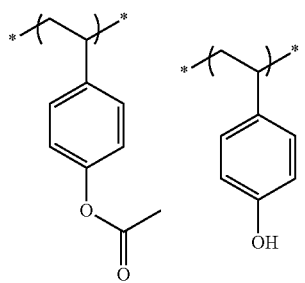
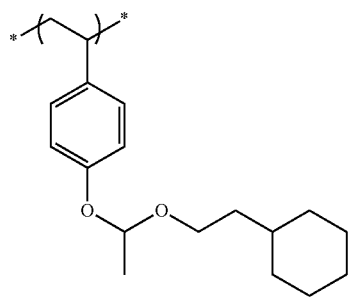
(R-9)
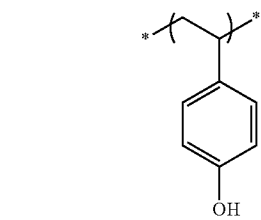
(R-10)
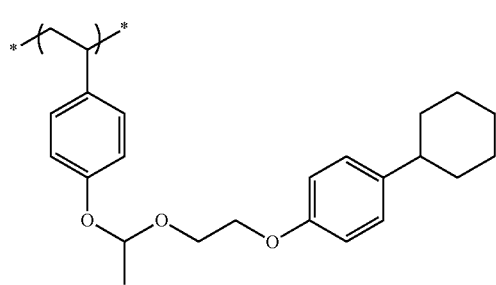

(R-11)
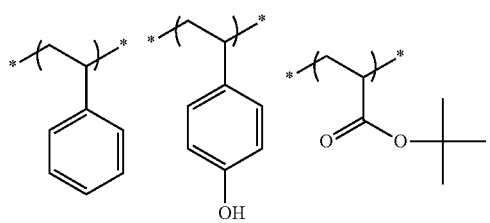
(R-12)
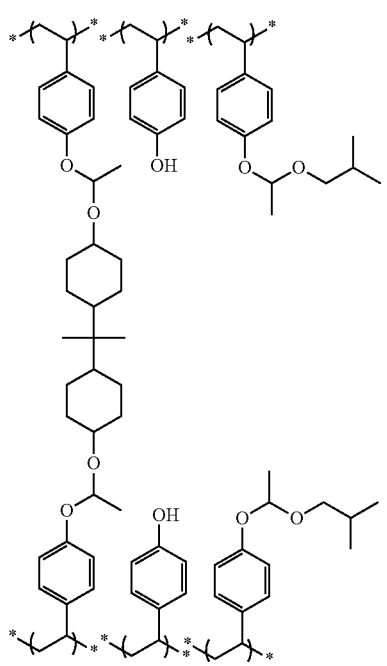
(R-13)
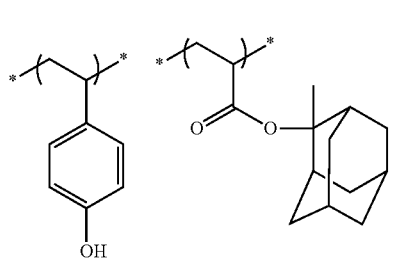
(R-14)
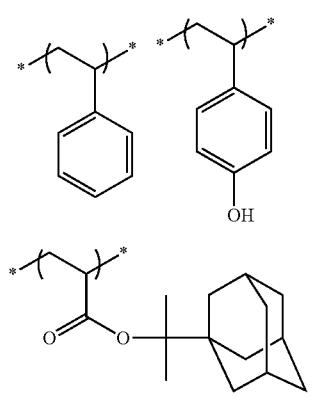
(R-15)
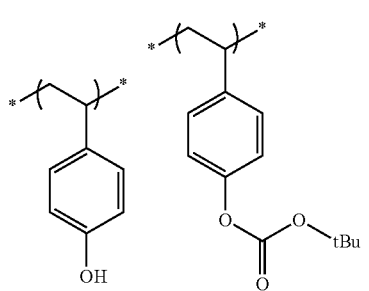
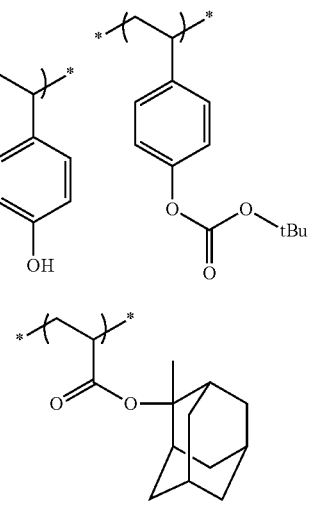
(R-16)
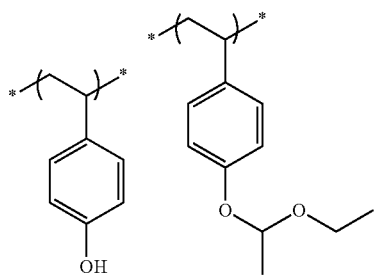
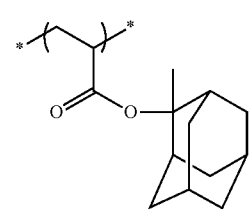
(R-17)
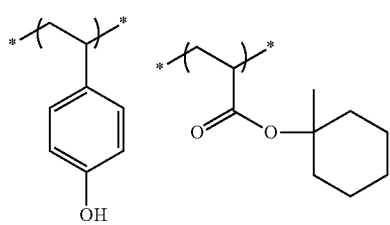
[Chem. 36]
(R-18)
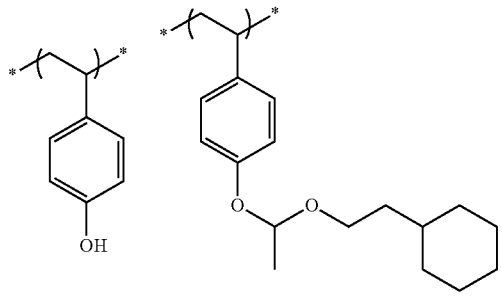

(R-19)
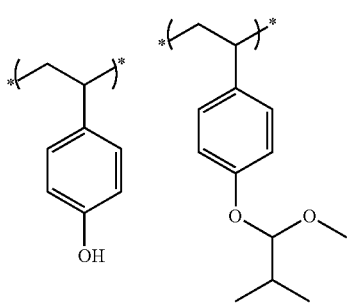
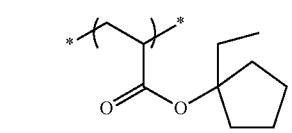
(R-20)
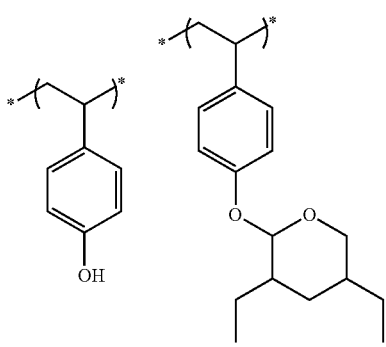
(R-21)
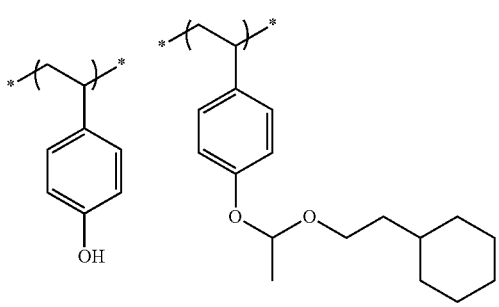
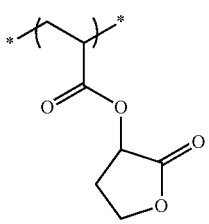
[Chem. 37]
R-22
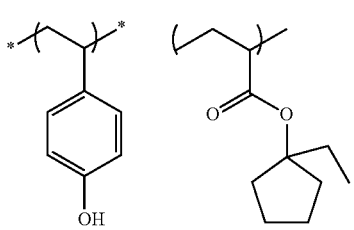
R-23
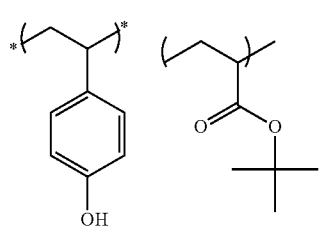
R-24
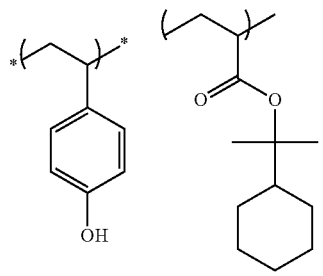
R-25
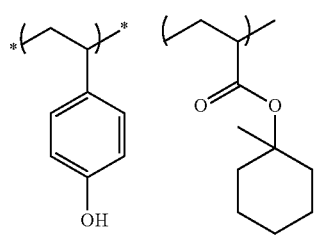
R-26
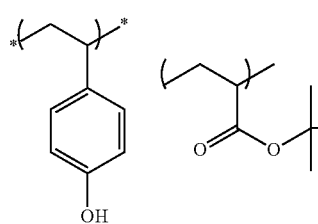
R-27
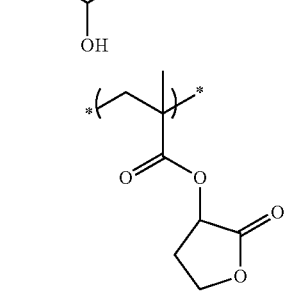

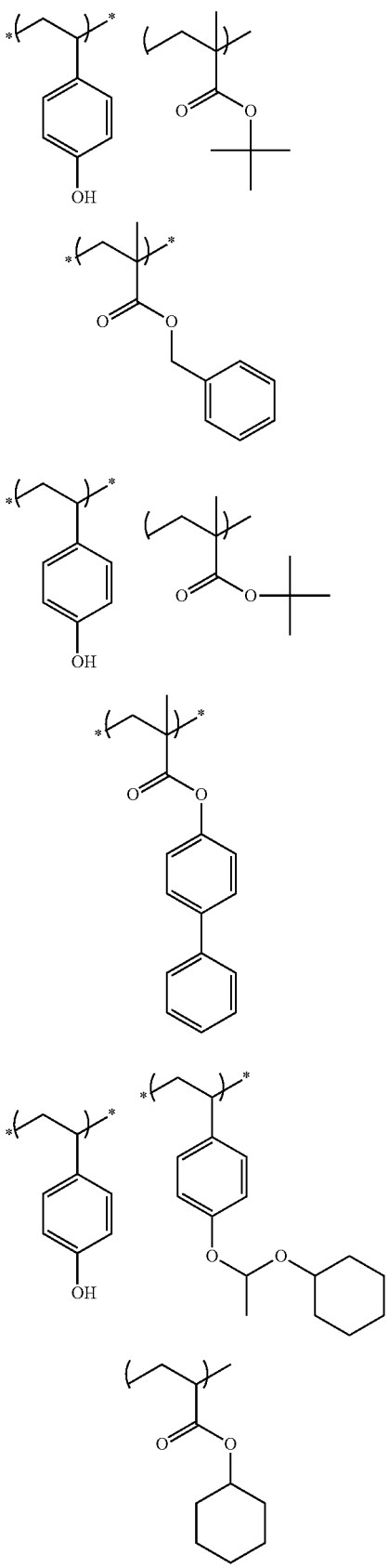

R-28
R-29
R-30

In specific examples above, tBu indicates a tert-butyl group.

The blending ratio of the resin (B) in the composition according to the present invention is preferably from 5 to 99.9 mass %, more preferably from 50 to 95 mass %, still more preferably from 60 to 93 mass %, based on the total solid content.

[3] Resin Soluble in an Alkali Developer (Hereinafter, Sometimes Referred to as "Alkali-Soluble Resin")

The negative actinic ray-sensitive or radiation-sensitive resin composition of the present invention may contain (C) an alkali-soluble resin and furthermore, if desired (D) a crosslinking agent. The alkali dissolution rate of the alkali-soluble resin (C) is preferably 2 nm/sec or more as measured (at 23° C.) by using an aqueous 2.38 mass % tetramethylammonium hydroxide (TMAH) solution. This rate is more preferably 20 nm/sec or more.

Examples of the alkali-soluble resin include, but are not limited to, a novolak resin, a hydrogenated novolak resin, an acetone-pyrogallol resin, an o-polyhydroxystyrene, an m-polyhydroxystyrene, a p-polyhydroxystyrene, a hydrogenated polyhydroxystyrene, a halogen- or alkyl-substituted polyhydroxystyrene, a hydroxystyrene-N-substituted maleimide copolymer, an o/p- or m/p-hydroxystyrene copolymer, a polyhydroxystyrene with the hydroxyl group being partially O-alkylated (for example, O-methylated, O-(1-methoxy)ethylated, O-(1-ethoxy)ethylated, O-2-tetrahydropyranylated or O-(tert-butoxycarbonyl)methylated in a ratio of 5 to 30 mol %) or O-acylated (for example, O-acylated or O-(tert-butoxy)carbonylated in a ratio of 5 to 30 mol %), a styrene-maleic anhydride copolymer, a styrene-hydroxystyrene copolymer, an α-methylstyrene-hydroxystyrene copolymer, a carboxyl group-containing methacrylic resin or a derivative thereof, and a polyvinyl alcohol derivative.

Preferable alkali-soluble resins include a novolak resin, an o-polyhydroxystyrene, an m-polyhydroxystyrene, a p-polyhydroxystyrene, a copolymer thereof, an alkyl-substituted polyhydroxystyrene, a partially O-alkylated or O-acylated polyhydroxystyrene, a styrene-hydroxystyrene copolymer, and an α-methylstyrene-hydroxystyrene copolymer.

Above all, in the present invention, a resin having a hydroxystyrene structure is preferred. Among hydroxystyrene structures, an m-hydroxystyrene structure is preferred.

The novolak resin above can be obtained by subjecting a predetermined monomer as the main component to addition condensation with aldehydes in the presence of an acidic catalyst.

The weight average molecular weight of the alkali-soluble resin is preferably 2,000 or more, more preferably from 5,000 to 200,000, still more preferably from 5,000 to 100,000. The weight average molecular weight as used herein is defined by a value in terms of polystyrene as measured by GPC (gel permeation chromatography).

Two or more kinds of these alkali-soluble resins (C) for use in the present invention may be used in combination.

The content of the alkali-soluble resin (C) is preferably from 40 to 97 mass %, more preferably from 60 to 90 mass %, based on the all solid matters in the composition.

[4] Acid Crosslinking Agent that is Caused to Crosslink with the Alkali-Soluble Resin by an Action of an Acid The negative actinic ray-sensitive or radiation-sensitive resin composition of the present invention may further contain (D) an acid crosslinking agent.

As the acid crosslinking agent (D), any compound that is caused to crosslink with the alkali-soluble resin (C) by an action of an acid may be used, but the following compounds (1) to (3) are preferred.

(1) A hydroxymethyl, alkoxymethyl or acyloxymethyl form of a phenol derivative (2) A compound having an N-hydroxymethyl group, an N-alkoxymethyl group or an N-acyloxymethyl group (3) A compound having an epoxy group The alkoxymethyl group is preferably an alkoxymethyl group having a carbon number of 6 or less, and the acyloxymethyl group is preferably an acyloxymethyl group having a carbon number of 6 or less.

Among these crosslinking agents, particularly preferable compounds are illustrated below.

[Chem. 38]

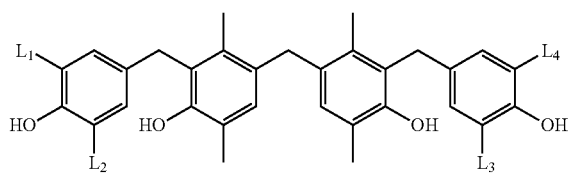

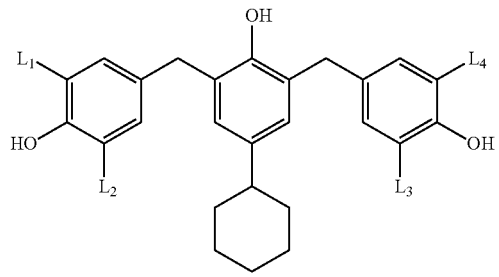

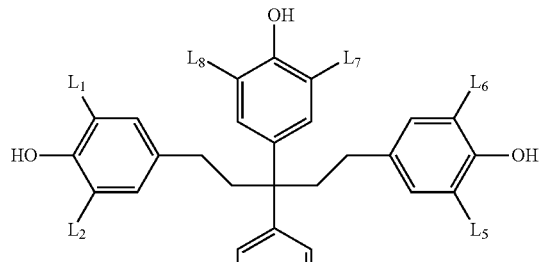

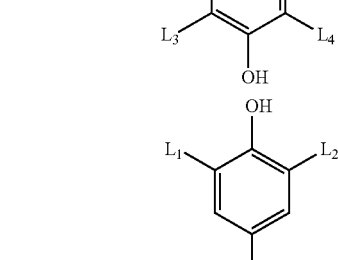

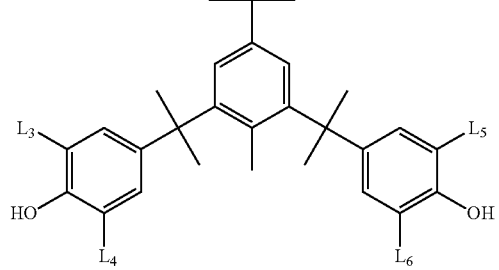

-continued

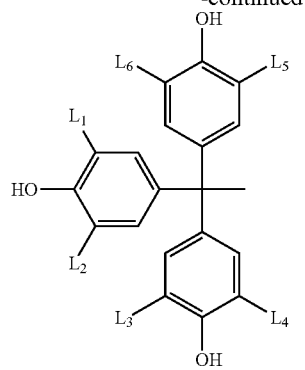

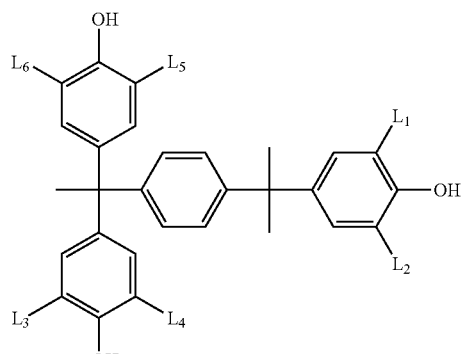

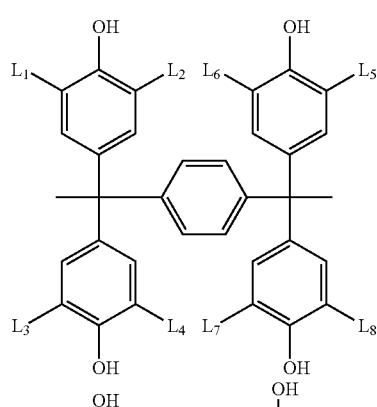

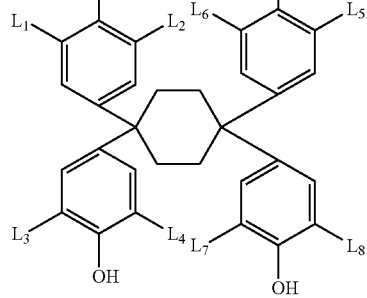

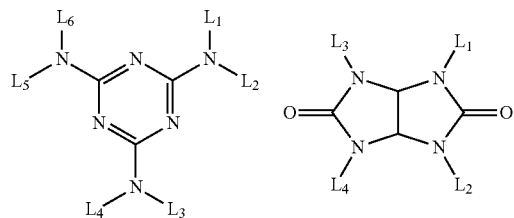

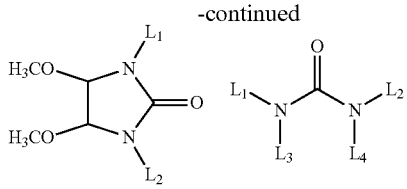

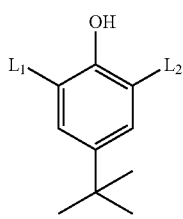

In the formulae, each of $L^1$ to $L^8$ independently represents a hydrogen atom, a hydroxymethyl group, an alkoxymethyl group (preferably a methoxymethyl group or an ethoxymethyl group) or an alkyl group having a carbon number of 1 to 6.

The amount added of the crosslinking agent is preferably from 3 to 70 mass %, more preferably from 5 to 50 mass %, based on the total solid content of the actinic ray-sensitive or radiation-sensitive resin composition.

[5] Compound Having a Molecular Weight of 3,000 or Less and being Capable of Decomposing by an Action of an Acid to Increase the Solubility in an Alkali Developer The positive actinic ray-sensitive or radiation-sensitive resin composition of the present invention may further contain a dissolution inhibiting compound having a molecular weight of 3,000 or less and being capable of decomposing by an action of an acid to increase the solubility in an alkali developer (hereinafter, sometimes referred to as "dissolution inhibiting compound"). In order to prevent reduction in the transparency to light of 220 nm or less, the dissolution inhibiting compound is preferably an alicyclic or aliphatic compound containing an acid-decomposable group, such as acid-decomposable group-containing cholic acid derivatives described in *Proceeding of SPIE*, 2724, 355 (1996). Examples of the acid-decomposable group are the same as those described above for the acid-decomposable unit.

In the case where the composition according to the present invention is exposed to a KrF excimer laser or irradiated with an electron beam, the dissolution inhibiting compound is preferably a compound containing a structure where a phenolic hydroxyl group of a phenol compound is substituted with an acid-decomposable group. The phenol compound is preferably a compound containing from 1 to 9 phenol frameworks, more preferably from 2 to 6 phenol frameworks.

The amount added of the dissolution inhibiting compound is preferably from 3 to 50 mass %, more preferably from 5 to 40 mass %, based on the total solid content of the composition.

Specific examples of the dissolution inhibiting compound are illustrated below, but the present invention is not limited thereto.

[Chem. 39]

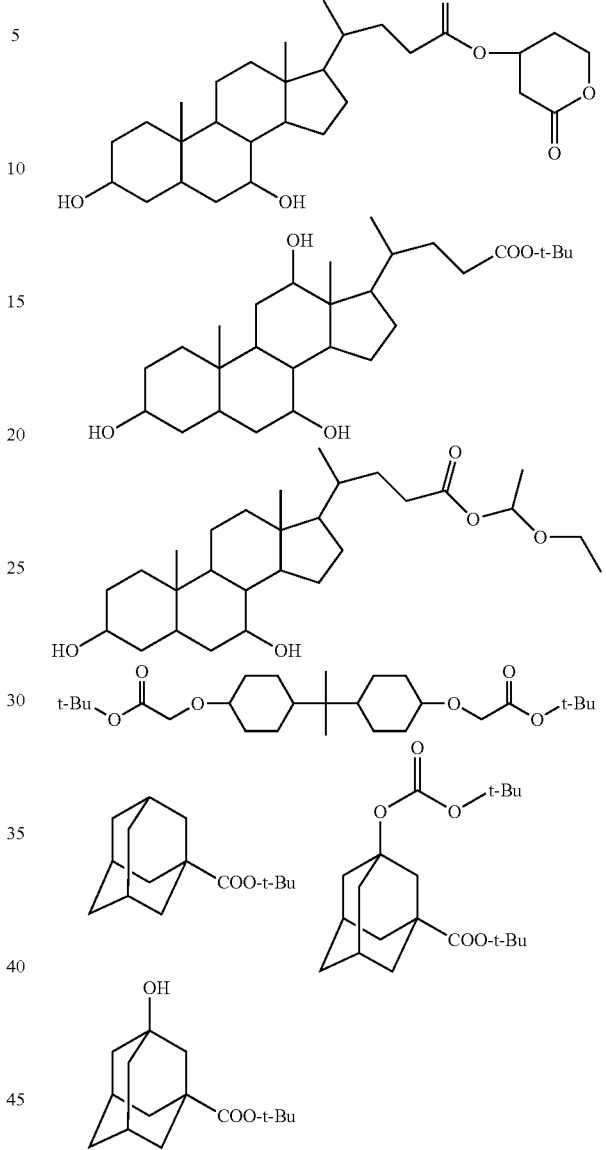

[6] Other Components

The positive or negative actinic ray-sensitive or radiation-sensitive resin composition according to the present invention may further contain a basic compound, an organic solvent, a surfactant, a dye, a plasticizer, a photosensitizer, a compound for accelerating dissolution in developer, a compound having a proton acceptor functional group, and the like.

(Basic Compound)

The composition according to the present invention may further contain a basic compound. When a basic compound is further contained, the change of the performance over time between exposure and heating (post-bake) can be more reduced. Also, when thus contained, the in-film diffusion of an acid generated upon exposure can be controlled.

The basic compound is preferably a nitrogen-containing organic compound. The compound that can be used is not particularly limited, but, for example, compounds in the following categories (1) to (5) can be used.

(1) Compound Represented by the Following Formula (BS-1):

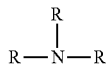

(BS-1)

In formula (BS-1), each R independently represents a hydrogen atom or an organic group, provided that at least one of three R is an organic group. The organic group is a linear or branched alkyl group, a monocyclic or polycyclic cycloalkyl group, an aryl group or an aralkyl group.

The carbon number of the alkyl group as R is not particularly limited but is usually from 1 to 20, preferably from 1 to 12.

The carbon number of the cycloalkyl group as R is not particularly limited but is usually from 3 to 20, preferably from 5 to 15.

The carbon number of the aryl group as R is not particularly limited but is usually from 6 to 20, preferably from 6 to 10. Specific examples of the aryl group include a phenyl group and a naphthyl group.

The carbon number of the aralkyl group as R is not particularly limited but is usually from 7 to 20, preferably from 7 to 11. Specific examples of the aralkyl group include a benzyl group.

In the alkyl group, cycloalkyl group, aryl group and aralkyl group as R, a hydrogen atom may be substituted by a substituent. This substituent includes, for example, an alkyl group, a cycloalkyl group, an aryl group, an aralkyl group, a hydroxyl group, a carboxy group, an alkoxy group, an aryloxy group, an alkylcarbonyloxy group, and an alkyloxycarbonyl group.

In the compound represented by formula (BS-1), it is preferred that at least two R are an organic group.

Specific examples of the compound represented by formula (BS-1) include tri-n-butylamine, tri-n-pentylamine, tri-n-octylamine, tri-n-decylamine, triisodecylamine, dicyclohexylmethylamine, tetradecylamine, pentadecylamine, hexadecylamine, octadecylamine, didecylamine, methyloctadecylamine, dimethylundecylamine, N,N-dimethyldodecylamine, methyldioctadecylamine, N,N-dibutylaniline, N,N-dihexylaniline, 2,6-diisopropylaniline, and 2,4,6-tri(tert-butyl)aniline.

Also, preferable basic compounds represented by formula (BS-1) include a compound where at least one R is an alkyl group substituted with a hydroxyl group. Specific examples thereof include triethanolamine and N,N-dihydroxyethylaniline.

The alkyl group as R may have an oxygen atom in the alkyl chain. That is, an oxyalkylene chain may be formed. The oxyalkylene chain is preferably —$CH_2CH_2O$—. Specific examples thereof include tris(methoxyethoxyethyl)amine and compounds illustrated in column 3, line 60 et seq. of U.S. Pat. No. 6,040,112.

(2) Compound Having a Nitrogen-Containing Heterocyclic Structure

The nitrogen-containing heterocyclic ring may or may not have aromaticity, may contain a plurality of nitrogen atoms, and may further contain a heteroatom other than nitrogen. Specific examples of the compound include a compound having an imidazole structure (e.g., 2-phenylbenzimidazole, 2,4,5-triphenylimidazole), a compound having a piperidine structure [e.g., N-hydroxyethylpiperidine, bis(1,2,2,6,6-pentamethyl-4-piperidyl)sebacate], a compound having a pyridine structure (e.g., 4-dimethylaminopyridine), and a compound having an antipyrine structure (e.g., antipyrine, hydroxyantipyrine).

A compound having two or more ring structures is also suitably used. Specific examples thereof include 1,5-diazabicyclo[4.3.0]non-5-ene and 1,8-diazabicyclo[5.4.0]undec-7-ene.

(3) Phenoxy Group-Containing Amine Compound

The phenoxy group-containing amine compound is a compound where the alkyl group contained in an amine compound has a phenoxy group at the terminal opposite the N atom. The phenoxy group may have a substituent such as alkyl group, alkoxy group, halogen atom, cyano group, nitro group, carboxy group, carboxylic acid ester group, sulfonic acid ester group, aryl group, aralkyl group, acyloxy group and aryloxy group.

This compound preferably has at least one oxyalkylene chain between the phenoxy group and the nitrogen atom. The number of oxyalkylene chains per molecule is preferably from 3 to 9, more preferably from 4 to 6. Among oxyalkylene chains, —$CH_2CH_2O$— is preferred.

Specific examples of the compound include 2-[2-{2-(2,2-dimethoxy-phenoxyethoxy)ethyl}-bis-(2-methoxyethyl)]-amine and Compounds (C1-1) to (C3-3) illustrated in paragraph [0066] of U.S. Patent Application Publication No. 2007/0224539A1.

(4) Ammonium Salt

An ammonium salt may also be appropriately used. The ammonium salt is preferably a hydroxide or a carboxylate. More specifically, a tetraalkylammonium hydroxide such as tetrabutylammonium hydroxide is preferred.

Other examples of the basic compound which can be used in the positive or negative actinic ray-sensitive or radiation-sensitive resin composition according to the present invention include compounds synthesized in Examples of JP-A-2002-363146 and compounds described in paragraph 0108 of JP-A-2007-298569.

A photosensitive basic compound may also be used as the basic compound. The photosensitive basic compound which can be used includes, for example, compounds described in JP-T-2003-524799 (the term "JP-T" as used herein means a "published Japanese translation of a PCT patent application") and J. Photopolym. Sci. & Tech., Vol. 8, pp. 543-553 (1995).

The molecular weight of the basic compound is preferably from 250 to 2,000, more preferably from 400 to 1,000.

One of these basic compounds is used alone, or two or more thereof are used in combination.

The content of the basic compound is preferably from 0.01 to 8.0 mass %, more preferably from 0.1 to 5.0 mass %, still more preferably from 0.2 to 4.0 mass %, based on the total solid content of the composition.

(5) Compound Having an Amine Oxide Structure

Compounds having amine oxide structures represented by the following formulae (1) to (3) are preferred, but the present invention is not limited, and any compound may be used as long as it is a nitrogen-containing organic compound having a structure where nitrogen atom is oxidized.

[Chem. 41]

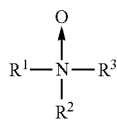

(1)

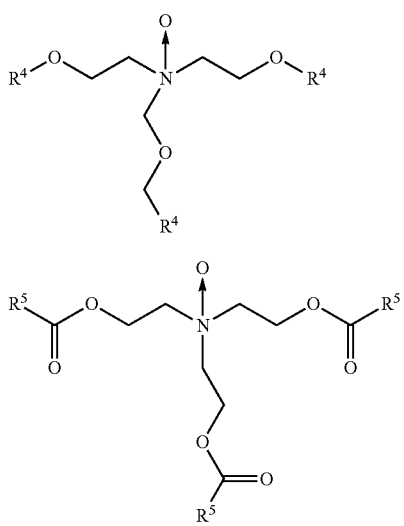

(In the formulae above, each of $R^1$, $R^2$ and $R^3$ independently represents a hydrogen atom, a linear, branched or cyclic alkyl group having a carbon number of 1 to 20, an aryl group having a carbon number of 6 to 20, an aralkyl group having a carbon number of 7 to 20, a hydroxyalkyl group having a carbon number of 2 to 10, an alkoxyalkyl group having a carbon number of 2 to 10, an acyloxyalkyl group having a carbon number of 3 to 10, or an alkylthioalkyl group having a carbon number of 1 to 10;

any two members of $R^1$, $R^2$ and $R^3$ may combine to form a ring structure or an aromatic ring;

$R^4$ represents a hydrogen atom, a linear, branched or cyclic alkyl group having a carbon number of 1 to 20, an aryl group having a carbon number of 6 to 20, an aralkyl group having a carbon number of 7 to 20, an alkoxyalkyl group having a carbon number of 2 to 10, a hydroxyalkyl group having a carbon number of 2 to 10, or an acyloxyalkyl group having a carbon number of 3 to 10; and $R^5$ represents a hydrogen atom, a linear, branched or cyclic alkyl group having a carbon number of 1 to 20, an aryl group having a carbon number of 6 to 20, or an aralkyl group having a carbon number of 7 to 20.)

For example, the aryl group having a carbon number of 6 to 20 specifically includes a phenyl group, a naphthyl group, an anthryl group, a phenanthryl group, a pyrenyl group, a naphthacenyl group, and a fluorenyl group; the linear, branched or cyclic alkyl group having a carbon number of 1 to 20 specifically includes a methyl group, an ethyl group, a propyl group, an isopropyl group, a butyl group, an isobutyl group, a tert-butyl group, a pentyl group, a hexyl group, a decyl group, a cyclopentyl group, a cyclohexyl group, and a decahydronaphthalenyl group; the aralkyl group having a carbon number of 7 to 20 specifically includes a benzyl group, a phenethyl group, a phenylpropyl group, a naphthylmethyl group, a naphthylethyl group, and an anthracenylmethyl group; the hydroxyalkyl group having a carbon number of 2 to 10 specifically includes a hydroxymethyl group, a hydroxyethyl group, and a hydroxypropyl group; the alkoxyalkyl group having a carbon number of 2 to 10 specifically includes a methoxymethyl group, an ethoxymethyl group, a propoxymethyl group, an isopropoxymethyl group, a butoxymethyl group, an isobutoxymethyl group, a tert-butoxymethyl group, a tert-amyloxymethyl group, a cyclohexyloxymethyl group, and a cyclopentyloxymethyl group; the acyloxyalkyl group having a carbon number of 3 to 10 specifically includes a formyloxymethyl group, an acetoxymethyl group, a propionyloxymethyl group, a butyryloxymethyl group, a pivaloyloxymethyl group, a cyclohexanecarbonyloxymethyl group, and a decanoyloxymethyl group; and the alkylthioalkyl group having a carbon number of 1 to 10 specifically includes a methylthiomethyl group, an ethylthiomethyl group, a propylthiomethyl group, an isopropylthiomethyl group, a butylthiomethyl group, an isobutylthiomethyl group, a tert-butylthiomethyl group, a tert-amylthiomethyl group, a decylthiomethyl group, and a cyclohexylthiomethyl group, but the present invention is not limited thereto.

Specific examples of the compound having an amine oxide structure represented by formula (1) are illustrated below, but the present invention is not limited thereto.

[Chem. 42]

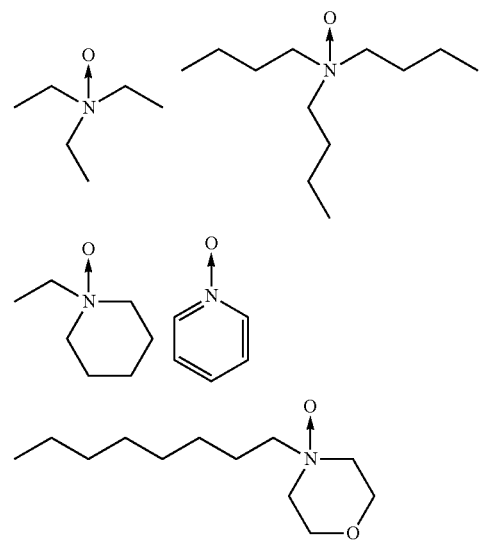

Specific examples of the compounds having amine oxide structures represented by formulae (2) and (3) are illustrated below, but the present invention is not limited thereto.

[Chem. 43]

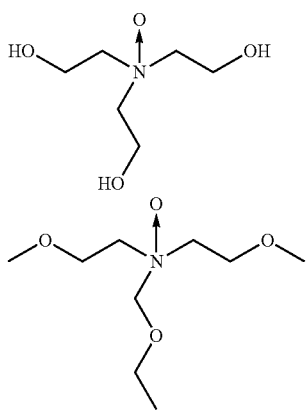

-continued

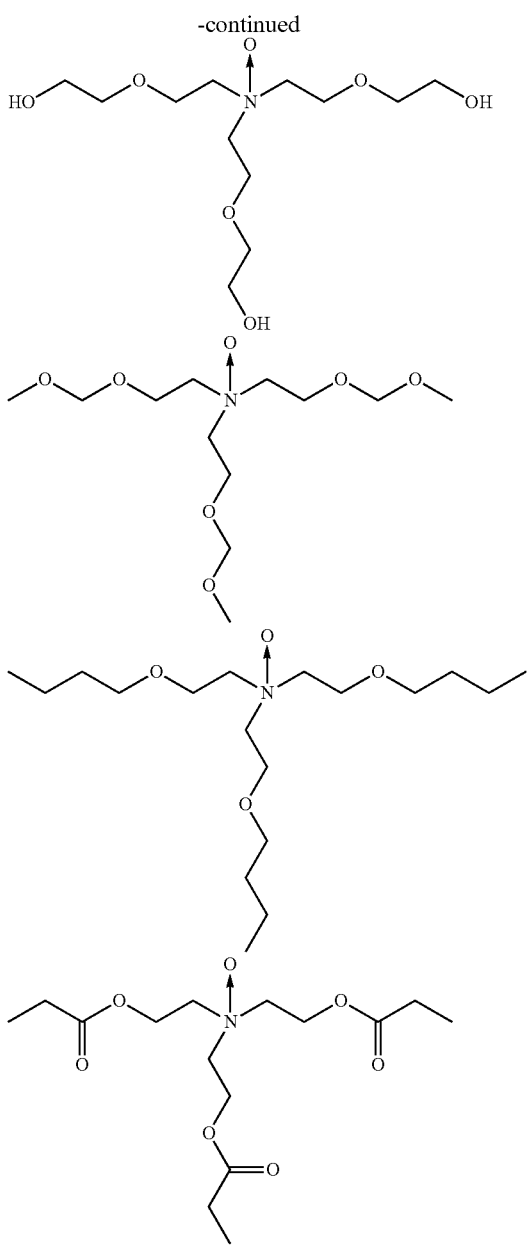

In the present invention, it is foreseen that in the above-described nitrogen-containing organic compound having an amine oxide structure in the molecule, the presence of a functional group substituted on the nitrogen atom realizes rapid capture of the generated acid and on the other hand, the structure where the nitrogen atom is oxidized affects the distribution in the resist film. These results are considered to make it possible to achieve high resolution and an excellent pattern profile in a photoresist having added thereto the compound having an amine oxide structure. Furthermore, it is likely that by selecting an appropriate structure from possible structures of the compound having an amine oxide structure, the volatility, basicity, acid capturing rate, in-resist diffusion rate, etc. of the compound having an amine oxide structure can be appropriately adjusted according to the combination of resist polymer and acid generator used and in turn, a compound additive having an amine oxide structure capable of optimally adjusting the properties of the resist material, such as pattern profile, can be provided.

The amine oxide structures represented by formulae (1) to (3) are produced by selecting an optimal method according to the structure of the compound. Examples of the method include a method where an oxidation reaction using an oxidizing agent for a nitrogen-containing compound is utilized, and a method where an oxidation reaction of a nitrogen-containing compound in a diluted aqueous hydrogen peroxide solution is utilized, but the present invention is not limited thereto.

One of these amine oxide structure-containing compounds is used alone, or two or more thereof are used in combination.

The content of the compound having an amine oxide structure is preferably from 0.01 to 8.0 mass %, more preferably from 0.1 to 5.0 mass %, still more preferably from 0.2 to 4.0 mass %, based on the total solid content of the composition.

(Surfactant)

The composition according to the present invention may further contain a surfactant. Among others, the surfactant is preferably a fluorine-containing and/or silicon-containing surfactant.

The surfactant above includes, for example, Megaface F176 and Megaface R08 produced by DIC Corp.; PF656 and PF6320 produced by OMNOVA; Troysol S-366 produced by Troy Chemical; Florad FC430 produced by Sumitomo 3M Inc.; and Polysiloxane Polymer KP-341 produced by Shin-Etsu Chemical Co., Ltd.

A surfactant other than the fluorine-containing and/or silicon-containing surfactant may also be used. More specifically, this surfactant includes polyoxyethylene alkyl ethers, polyoxyethylene alkylaryl ethers, and the like.

In addition, known surfactants may be appropriately used. The surfactant which can be used includes, for example, surfactants described in paragraph [0273] et seq. of U.S. Patent Application Publication No. 2008/0248425A1.

One surfactant may be used alone, or two or more surfactants may be used in combination.

The amount of the surfactant used is preferably from 0 to 2 mass %, more preferably from 0.0001 to 2 mass %, still more preferably from 0.001 to 1 mass %, based on the total solid content of the composition.

(Solvent)

The solvent which can be used at the preparation of the composition is not particularly limited as long as it is a solvent capable of dissolving respective components, but the solvent above includes, for example, an alkylene glycol monoalkyl ether carboxylate (e.g., propylene glycol monomethyl ether acetate), an alkylene glycol monoalkyl ether (e.g., propylene glycol monomethyl ether), an alkyl lactate (e.g., ethyl lactate, methyl lactate), a cyclic lactone (e.g., γ-butyrolactone; preferably having a carbon number of 4 to 10), a linear or cyclic ketone (e.g., 2-heptanone, cyclohexanone; preferably having a carbon number of 4 to 10), an alkylene carbonate (e.g., ethylene carbonate, propylene carbonate), an alkyl carboxylate (preferably an alkyl acetate such as butyl acetate), and an alkyl alkoxyacetate (preferably ethyl ethoxypropionate). Other usable solvents include, for example, solvents described in paragraph [0244] et seq. of US 2008/0248425A1.

Among these solvents, an alkylene glycol monoalkyl ether carboxylate, an alkylene glycol monoalkyl ether, and an ethyl lactate are preferred.

One of these solvents may be used alone, or two or more thereof may be mixed and used. In the case of using a mixture of two or more solvent, it is preferable to mix a solvent containing a hydroxyl group and a solvent not containing a hydroxyl group. The mass ratio between the solvent containing a hydroxyl group and the solvent not containing a hydroxyl group is usually from 1/99 to 99/1, preferably from 10/90 to 90/10, more preferably from 20/80 to 60/40.

The solvent containing a hydroxyl group is preferably an alkylene glycol monoalkyl ether or an alkyl lactate, and the solvent not containing a hydroxyl group is preferably an alkylene glycol monoalkyl ether carboxylate.

The amount of the solvent used is not particularly limited but is adjusted such that the total solid content concentration of the composition becomes preferably from 0.5 to 30 mass %, more preferably from 1.0 to 10 mass %. Above all, in the case of performing electron-beam or EUV lithography by using the composition of the present invention, the amount of the solvent used is adjusted to give a total solid content concentration of preferably from 2.0 to 6.0 mass %, more preferably 2.0 to 4.5 mass %.

(Other Additives)

The positive or negative actinic ray-sensitive or radiation-sensitive resin composition according to the present invention may further contain, if desired, a dye, a plasticizer, a photosensitizer, a light absorber, a compound for accelerating dissolution in developer (for example, a phenolic compound having a molecular weight of 1000 or less, or an alicyclic or aliphatic compound containing a carboxy group), etc. In addition, a compound having a proton acceptor functional group described, for example, in JP-A-2006-208781 and JP-A-2007-286574 may also be suitably used.

[7] Pattern Forming Method

The positive or negative actinic ray-sensitive or radiation-sensitive resin composition according to the present invention is used typically as follows. That is, the composition according to the present invention is typically coated on a support such as substrate to form a film. The thickness of the film is preferably from 0.02 to 0.1 μm. The method for coating the composition on a substrate is preferably spin coating, and the rotation speed thereof is preferably from 1,000 to 3,000 rpm.

For example, the composition is coated on a substrate (e.g., silicon/silicon dioxide coat, silicon nitride, chromium-deposited quartz substrate) for use in the production, etc. of a precision integrated circuit device, by an appropriate coating method such as spinner or coater. Thereafter, the coating is dried to obtain an actinic ray-sensitive or radiation-sensitive resist film (hereinafter, sometimes referred to as "photosensitive film"). Incidentally, a known antireflection film may be previously provided by coating.

Subsequently, the photosensitive film is irradiated with an actinic ray or radiation, then preferably baked (heated) and developed, whereby a good pattern can be obtained. In view of sensitivity and stability, the baking temperature is preferably from 80 to 150° C., more preferably from 90 to 130° C.

The actinic ray or radiation includes, for example, infrared light, visible light, ultraviolet light, far ultraviolet light, X-ray, and electron beam. An actinic ray or radiation having, for example, a wavelength of 250 nm or less, particularly 220 nm or less, is preferred. Such an actinic ray or radiation includes, for example, KrF excimer laser (248 nm), ArF excimer laser (193 nm), $F_2$ excimer laser (157 nm), X-ray, EUV (13 nm), and electron beam (EB). Particularly preferable actinic ray or radiation includes ArF excimer laser, $F_2$ excimer laser, X-ray, EUV (13 nm) and electron beam (EB), and the actinic ray or radiation is most preferably X-ray, electron beam or EUV.

Exposure by filling a liquid (e.g., pure water) having a refractive index higher than that of air between the photosensitive film and the lens at the irradiation with an actinic ray or radiation, that is, immersion exposure, may also be performed. By this exposure, the resolution can be increased. In this case, for avoiding contact of the film with the immersion liquid, a film (sometimes referred to as a "topcoat") sparingly soluble in the immersion liquid may be provided on the film to intervene between the film and the immersion liquid. As another technique to avoid contact of the film with the immersion liquid, a hydrophobic resin (HR) may be previously added to the above-described composition.

The hydrophobic resin (HR) is specifically described below.

In the case of exposing the film composed of the composition of the present invention through an immersion medium, a hydrophobic resin (HR) may be further added, if desired. The hydrophobic resin (HR) is unevenly distributed to the surface layer of the film and in the case where the immersion medium is water, when a film is formed, the receding contact angle on the resist film surface for water as well as the followability of immersion liquid can be enhanced. The receding contact angle on the surface is increased by the addition of a hydrophobic resin (HR). The receding contact angle of the film is preferably from 60 to 90°, more preferably 70° or more. The hydrophobic resin (HR) is, as described above, unevenly distributed to the interface but unlike a surfactant, need not have necessarily a hydrophilic group in the molecule and may not contribute to uniform mixing of polar/nonpolar substances.

The receding contact angle is a contact angle measured when a contact line recedes on the liquid droplet-substrate interface, and this is generally known to be useful in simulating the mobility of a liquid droplet in the dynamic state. In a simple manner, the receding contact angle can be defined as a contact angle on receding of the liquid droplet interface when a liquid droplet ejected from a needle tip is landed on a substrate and then the liquid droplet is again suctioned into the needle. In general, the receding contact angle can be measured by a contact angle measuring method called an expansion/contraction method.

In the immersion exposure step, the immersion liquid must move on a wafer in conformity to the movement of an exposure head that is scanning the wafer at a high speed and forming an exposure pattern. Therefore, the contact angle of the immersion liquid for the resist film in a dynamic state is important, and the resist is required to have a performance of allowing a liquid droplet to follow the high-speed scanning of an exposure head with no remaining.

The hydrophobic resin (HR) preferably contains a fluorine atom or a silicon atom so as to be unevenly distributed to the film surface. The fluorine atom or silicon atom in the hydrophobic resin (HR) may be contained in the main chain of the resin or may be substituted on the side chain.

The hydrophobic resin (HR) is preferably a resin containing, as a fluorine atom-containing partial structure, a fluorine atom-containing alkyl group, a fluorine atom-containing cycloalkyl group or a fluorine atom-containing aryl group.

The fluorine atom-containing alkyl group (preferably having a carbon number of 1 to 10, more preferably a carbon number of 1 to 4) is a linear or branched alkyl group with at least one hydrogen atom being substituted by a fluorine atom and may further have other substituents.

The fluorine atom-containing cycloalkyl group is a monocyclic or polycyclic cycloalkyl group with at least one hydrogen atom being substituted by a fluorine atom and may further have other substituents.

The fluorine atom-containing aryl group includes an aryl group such as phenyl group and naphthyl group, with at least one hydrogen atom being substituted by a fluorine atom and may further have other substituents.

Preferable fluorine atom-containing alkyl group, fluorine atom-containing cycloalkyl group and fluorine atom-containing aryl group include groups represented by the following formulae (F2) to (F4), but the present invention is not limited thereto.

[Chem. 44]

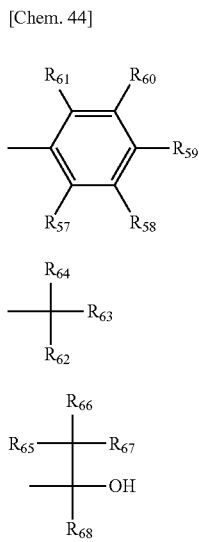

(F2)

(F3)

(F4)

In formulae (F2) to (F4), each of $R_{57}$ to $R_{68}$ independently represents a hydrogen atom, a fluorine atom or an alkyl group, provided that at least one of $R_{57}$ to $R_{61}$, at least one of $R_{62}$ to $R_{64}$ and at least one of $R_{65}$ to $R_{68}$ represent a fluorine atom or an alkyl group (preferably having a carbon number of 1 to 4) with at least one hydrogen atom being substituted by a fluorine atom. It is preferred that all of $R_{57}$ to $R_{61}$ and $R_{65}$ to $R_{67}$ are a fluorine atom. Each of $R_{62}$, $R_{63}$ and $R_{68}$ is preferably an alkyl group (preferably having a carbon number of 1 to 4) with at least one hydrogen atom being substituted by a fluorine atom, more preferably a perfluoroalkyl group having a carbon number of 1 to 4. $R_{62}$ and $R_{63}$ may combine with each other to form a ring.

Specific examples of the group represented by formula (F2) include a p-fluorophenyl group, a pentafluorophenyl group, and a 3,5-di(trifluoromethyl)phenyl group.

Specific examples of the group represented by formula (F3) include a trifluoroethyl group, a pentafluoropropyl group, a pentafluoroethyl group, a heptafluorobutyl group, a hexafluoroisopropyl group, a heptafluoroisopropyl group, a hexafluoro(2-methyl)isopropyl group, a nonafluorobutyl group, an octafluoroisobutyl group, a nonafluorohexyl group, a nonafluoro-tert-butyl group, a perfluoroisopentyl group, a perfluorooctyl group, a perfluoro(trimethyl)hexyl group, a 2,2,3,3-tetrafluorocyclobutyl group, and a perfluorocyclohexyl group. A hexafluoroisopropyl group, a heptafluoroisopropyl group, a hexafluoro(2-methyl)isopropyl group, an octafluoroisobutyl group, a nonafluoro-tert-butyl group and a perfluoroisopentyl group are preferred, and a hexafluoroisopropyl group and a heptafluoroisopropyl group are more preferred.

Specific examples of the group represented by formula (F4) include —C(CF$_3$)$_2$OH, —C(C$_2$F$_5$)$_2$OH, —C(CF$_3$)(CH$_3$)OH and —CH(CF$_3$)OH, with —C(CF$_3$)$_2$OH being preferred.

Specific examples of the repeating unit having a fluorine atom are illustrated below, but the present invention is not limited thereto.

In specific examples, $X_1$ represents a hydrogen atom, —CH$_3$, —F or —CF$_3$, and $X_2$ represents —F or —CF$_3$.

[Chem. 45]

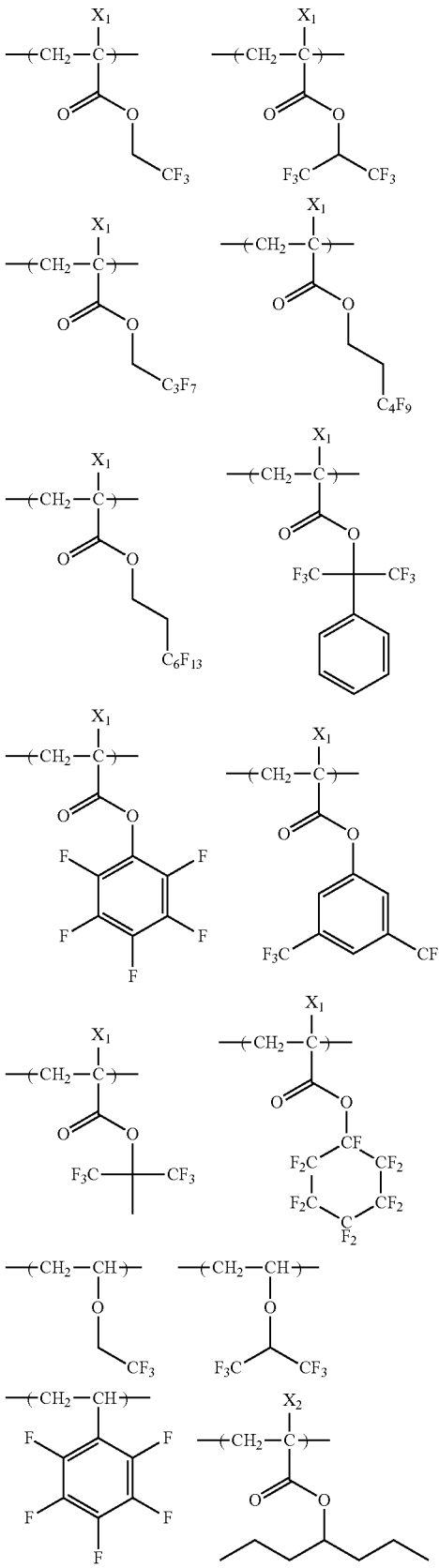

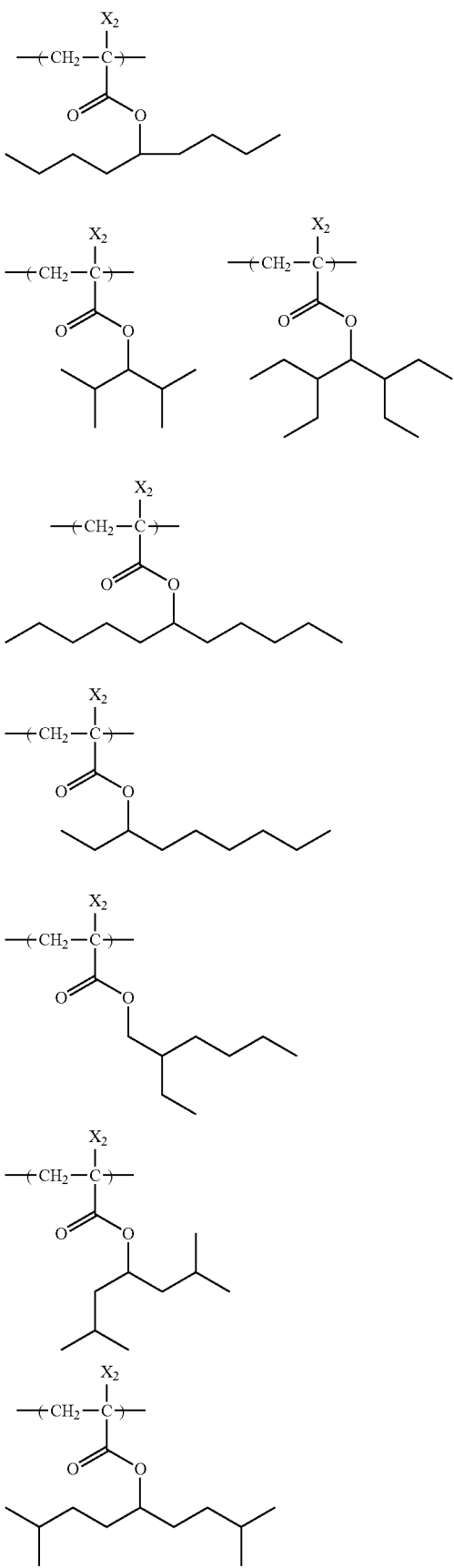

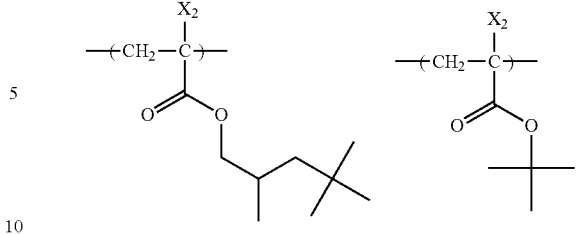

In the case of containing a silicon atom, the hydrophobic resin (HR) is preferably a resin having, as a silicon atom-containing partial structure, an alkylsilyl structure (preferably a trialkylsilyl group) or a cyclic siloxane structure.

The alkylsilyl structure or cyclic siloxane structure specifically includes, for example, the groups represented by the following formulae (CS-1) to (CS-3):

[Chem. 46]

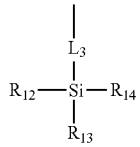
(CS-1)

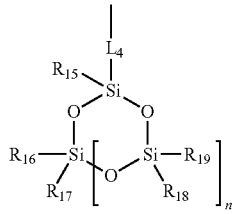
(CS-2)

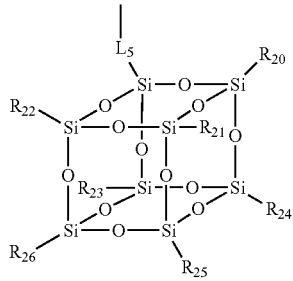
(CS-3)

In formulae (CS-1) to (CS-3), each of $R_{12}$ to $R_{26}$ independently represents a linear or branched alkyl group (preferably having a carbon number of 1 to 20) or a cycloalkyl group (preferably having a carbon number of 3 to 20).

Each of $L_3$ to $L_5$ represents a single bond or a divalent linking group. The divalent linking group includes a single group or a combination of two or more groups, selected from the group consisting of an alkylene group, a phenylene group, an ether group, a thioether group, a carbonyl group, an ester group, an amide group, a urethane group and a urea group.

n represents an integer of 1 to 5. n is preferably an integer of 2 to 4.

Specific examples of the repeating unit having a group represented by formulae (CS-1) to (CS-3) are illustrated below, but the present invention is not limited thereto. In specific examples, $X_1$ represents a hydrogen atom, —$CH_3$, —F or —$CF_3$.

[Chem. 47]
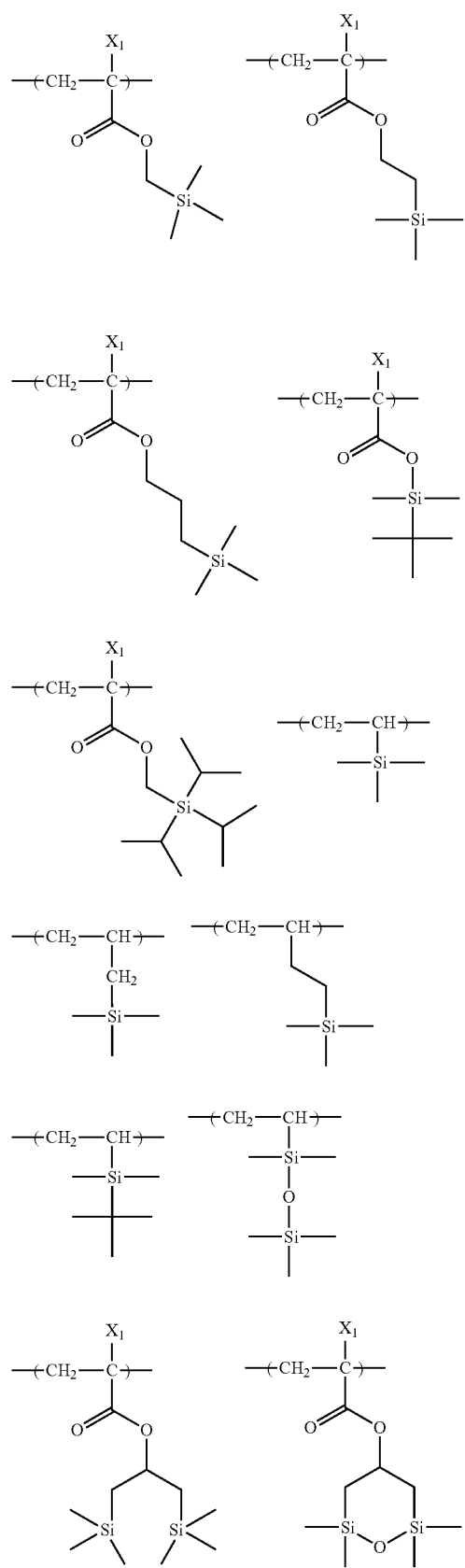
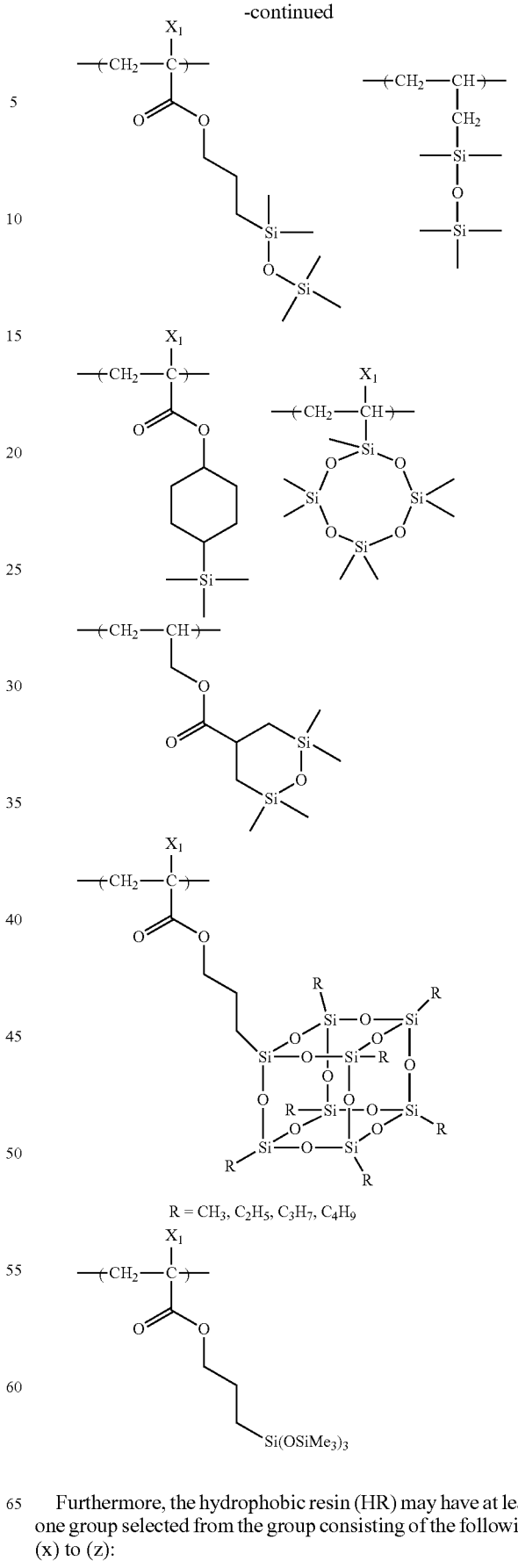
Furthermore, the hydrophobic resin (HR) may have at least one group selected from the group consisting of the following (x) to (z):

(x) an alkali-soluble group, (y) a group capable of decomposing by an action of an alkali developer to increase the solubility in an alkali developer, and (z) a group capable of decomposing by an action of an acid.

The alkali-soluble group (x) includes a phenolic hydroxyl group, a carboxylic acid group, a fluorinated alcohol group, a sulfonic acid group, a sulfonamide group, a sulfonylimide group, an (alkylsulfonyl)(alkylcarbonyl)methylene group, an (alkylsulfonyl)(alkylcarbonyl)imide group, a bis(alkylcarbonyl)methylene group, a bis(alkylcarbonyl)imide group, a bis(alkylsulfonyl)methylene group, a bis(alkylsulfonyl)imide group, a tris(alkylcarbonyl)methylene group, a tris(alkylsulfonyl)methylene group, and the like.

Preferable alkali-soluble groups include a fluorinated alcohol group (preferably hexafluoroisopropanol), a sulfonimide group, and a bis(carbonyl)methylene group.

The repeating unit having (x) an alkali-soluble group includes a repeating unit where an alkali-soluble group is directly bonded to the main chain of the resin, such as repeating unit by an acrylic acid or a methacrylic acid; and a repeating unit where an alkali-soluble group is bonded to the main chain of the resin through a linking group. Furthermore, an alkali-soluble group may be introduced into the terminal of the polymer chain by using an alkali-soluble group-containing polymerization initiator or chain transfer agent at the polymerization. All of these cases are preferred.

The content of the repeating unit having (x) an alkali-soluble group is preferably from 1 to 50 mol %, more preferably from 3 to 35 mol %, still more preferably from 5 to 20 mol %, based on all repeating units in the polymer.

Specific examples of the repeating unit having (x) an alkali-soluble group are illustrated below, but the present invention is not limited thereto.

[Chem. 48]

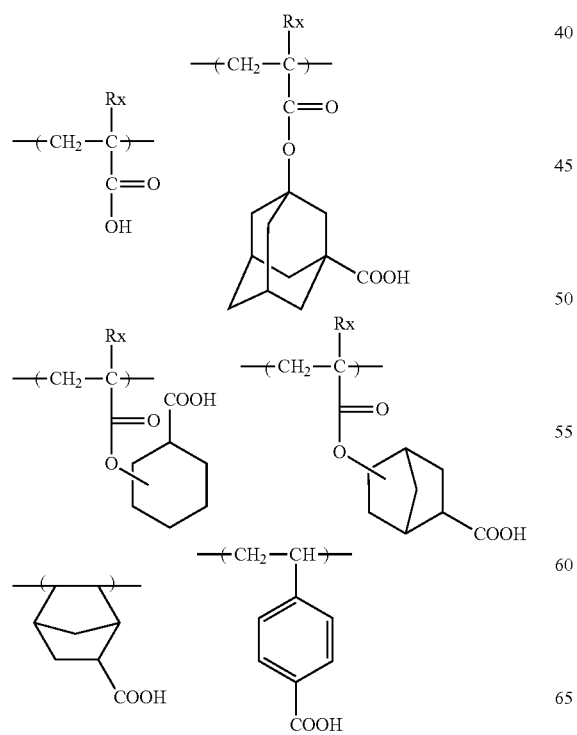

-continued

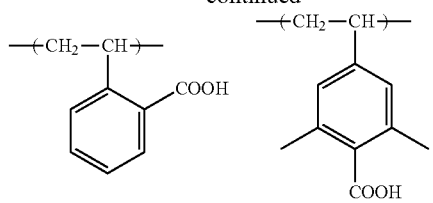

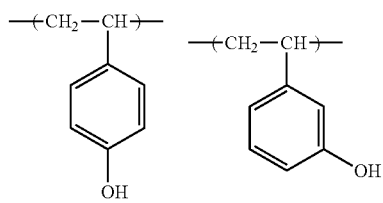

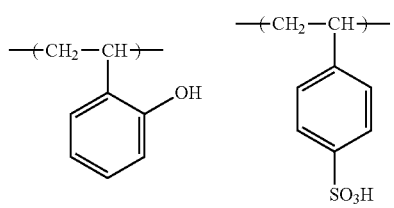

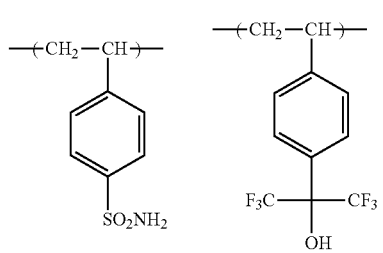

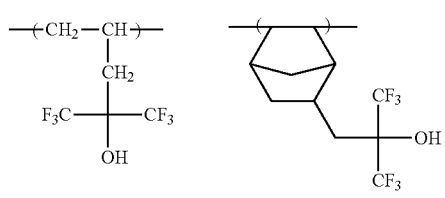

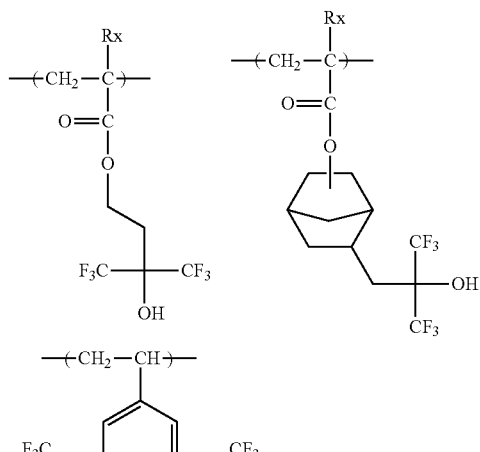

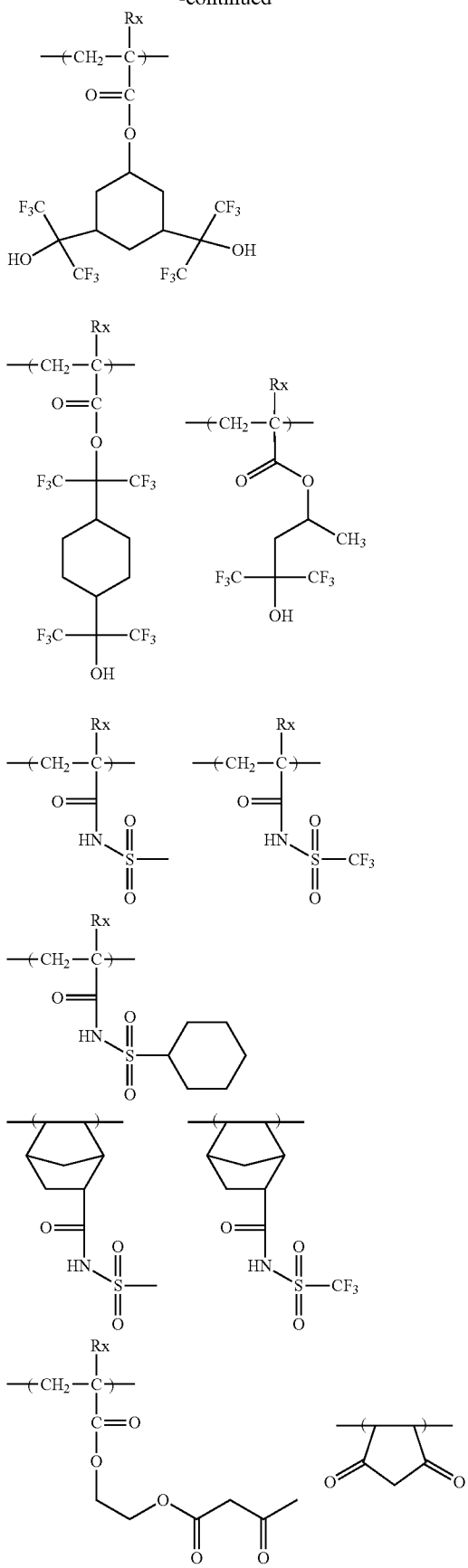

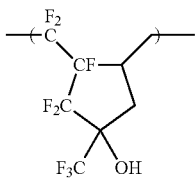

The (y) group capable of decomposing by an action of an alkali developer to increase the solubility in an alkali developer includes, for example, a group having a lactone structure, an acid anhydride group, and an acid imide group. A group having a lactone structure is preferred.

As for the repeating unit having (y) a group capable of decomposing by an action of an alkali developer to increase the solubility in an alkali developer, both a repeating unit where (y) a group capable of decomposing by the action of an alkali developer to increase the solubility in an alkali developer is bonded to the main chain of the resin, such as repeating unit by an acrylic acid ester or a methacrylic acid ester; and a repeating unit where (y) a group capable of increasing the solubility in an alkali developer is introduced into the polymer chain terminal by using a polymerization initiator or chain transfer agent containing the group at the polymerization, are preferred.

The content of the repeating unit having (y) a group capable of increasing the solubility in an alkali developer is preferably from 1 to 40 mol %, more preferably from 3 to 30 mol %, still more preferably from 5 to 15 mol %, based on all repeating units in the polymer.

Specific examples of the repeating unit having (y) a group capable of increasing the solubility in an alkali developer are the same as those of the repeating unit having a lactone structure described above for the resin of the component (B).

Examples of the repeating unit having (z) a group capable of decomposing by the action of an acid, contained in the hydrophobic resin (HR), are the same as those of the repeating unit having an acid-decomposable group described above for the resin (B). The content of the repeating unit having (z) a group capable of decomposing by the action of an acid in the hydrophobic resin (HR) is preferably from 1 to 80 mol %, more preferably from 10 to 80 mol %, still more preferably from 20 to 60 mol %, based on all repeating units in the polymer.

The hydrophobic resin (HR) may further contain a repeating unit represented by the following formula (III):

[Chem. 49]

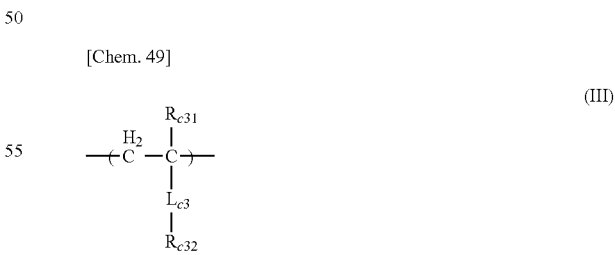

(III)

In formula (III), $R_{c31}$ represents a hydrogen atom, an alkyl group or an alkyl group which may be substituted with a fluorine atom, a cyano group or a —$CH_2$—O-$Rac_2$ group, wherein $Rac_2$ represents a hydrogen atom, an alkyl group or an acyl group. $R_{c31}$ is preferably a hydrogen atom, a methyl group, a hydroxymethyl group or a trifluoromethyl group, more preferably a hydrogen atom or a methyl group.

$R_{c32}$ represents a group having an alkyl group, a cycloalkyl group, an alkenyl group, a cycloalkenyl group or an aryl group. These groups may be substituted with a fluorine atom or a silicon atom.

$L_{c3}$ represents a single bond or a divalent linking group.

In formula (III), the alkyl group of $R_{c32}$ is preferably a linear or branched alkyl group having a carbon number of 3 to 20.

The cycloalkyl group is preferably a cycloalkyl group having a carbon number of 3 to 20.

The alkenyl group is preferably an alkenyl group having a carbon number of 3 to 20.

The cycloalkenyl group is preferably a cycloalkenyl group having a carbon number of 3 to 20.

The aryl group is preferably a phenyl group or a naphthyl group, which are an aryl group having a carbon number of 6 to 20, and these groups may have a substituent.

$R_{c32}$ is preferably an unsubstituted alkyl group or a fluorine atom-substituted alkyl group.

The divalent linking group of $L_{c3}$ is preferably an alkylene group (preferably having a carbon number of 1 to 5), an oxy group, a phenylene group or an ester bond (a group represented by —COO—). It is also preferred that the hydrophobic resin (HR) further contains a repeating unit represented by the following formula (CII-AB):

[Chem. 50]

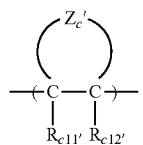

(CII-AB)

In formula (CII-AB), each of $R_{c11}'$ and $R_{c12}'$ independently represents a hydrogen atom, a cyano group, a halogen atom or an alkyl group.

$Z_c'$ represents an atomic group for forming an alicyclic structure together with two carbon atoms (C—C) to which $Z_c'$ is bonded.

Specific examples of the repeating units represented by formulae (III) and (CII-AB) are illustrated below, but the present invention is not limited thereto. In the formulae, Ra represents H, $CH_3$, $CH_2OH$, $CF_3$ or CN.

[Chem. 51]

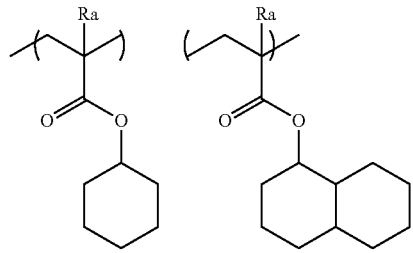

-continued

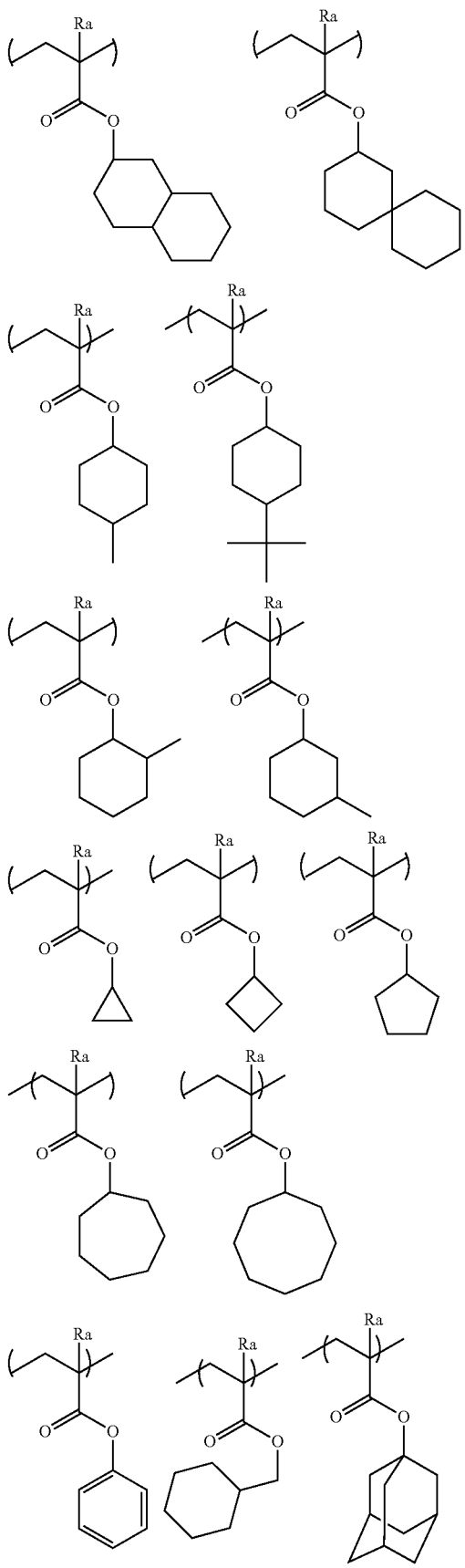

-continued

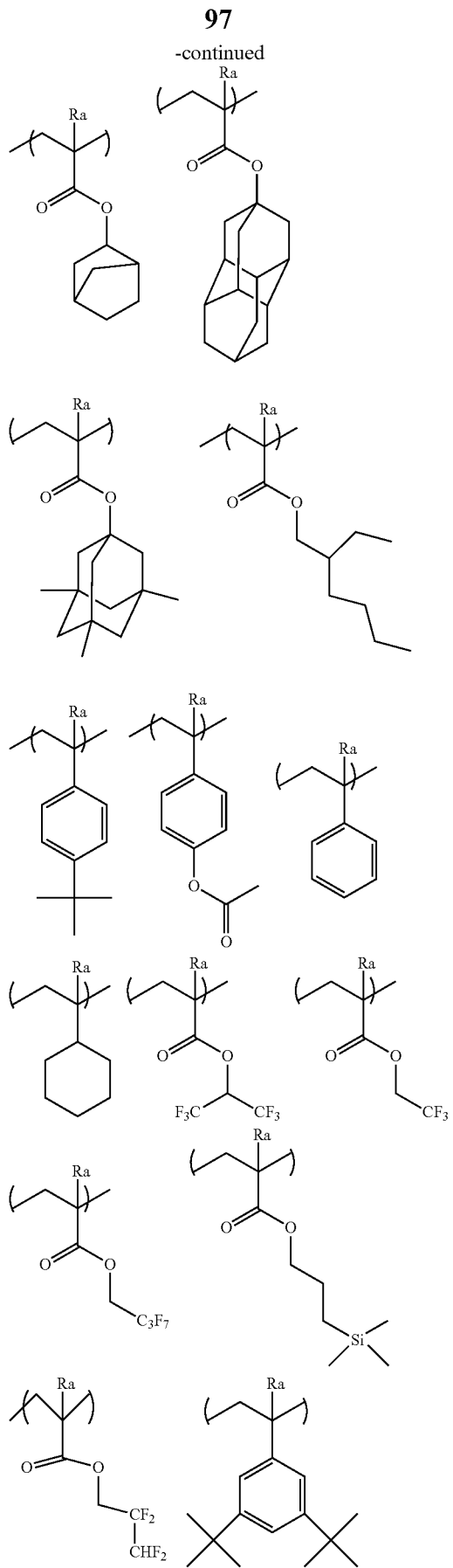

-continued

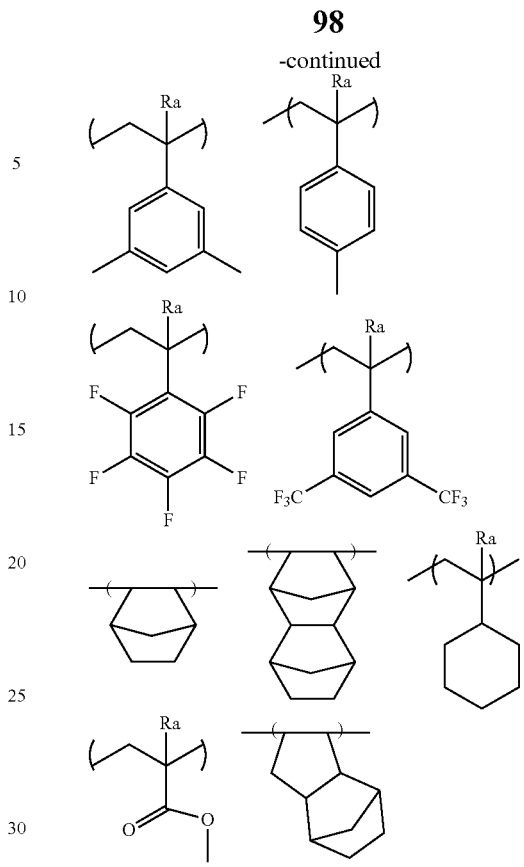

In the case where the hydrophobic resin (HR) contains a fluorine atom, the fluorine atom content is preferably from 5 to 80 mass %, more preferably from 10 to 80 mass %, based on the weight average molecular weight of the hydrophobic resin (HR). Also, the fluorine atom-containing repeating unit preferably accounts for 10 to 100 mol %, more preferably from 30 to 100 mol %, in the hydrophobic resin (HR).

In the case where the hydrophobic resin (HR) contains a silicon atom, the silicon atom content is preferably from 2 to 50 mass %, more preferably from 2 to 30 mass %, based on the weight average molecular weight of the hydrophobic resin (HR). Also, the silicon atom-containing repeating unit preferably accounts for 10 to 100 mol %, more preferably from 20 to 100 mol %, in the hydrophobic resin (HR).

The weight average molecular weight in terms of standard polystyrene of the hydrophobic resin (HR) is preferably from 1,000 to 100,000, more preferably from 1,000 to 50,000, still more preferably from 2,000 to 15,000.

The content ratio of the hydrophobic resin (HR) in the composition is preferably from 0.01 to 10 mass %, more preferably from 0.05 to 8 mass %, still more preferably from 0.1 to 5 mass %, based on the total solid content of the composition of the present invention.

In the hydrophobic resin (HR), similarly to the resin (B), it is of course preferred that the content of impurities such as metal is small, but the content of residual monomers or oligomer components is also preferably from 0 to 10 mass %, more preferably from 0 to 5 mass %, still more preferably from 0 to 1 mass %. Within this range, a resist composition free from in-liquid extraneous substances and change with aging of sensitivity or the like can be obtained. Furthermore, in view of resolution, resist profile, side wall of resist pattern, roughness and the like, the molecular weight distribution (Mw/Mn, sometimes referred to as "polydispersity") is preferably from 1 to 5, more preferably from 1 to 3, still more preferably from 1 to 2.

As the hydrophobic resin (HR), various commercial products may be used, or the resin may be synthesized by a conventional method (for example, radical polymerization). For example, the general synthesis method includes a batch polymerization method of dissolving monomer species and an initiator in a solvent and heating the solution, thereby effecting the polymerization, and a dropping polymerization method of adding dropwise a solution containing monomer species and an initiator to a heated solvent over 1 to 10 hours. A dropping polymerization method is preferred. The reaction solvent includes, for example, tetrahydrofuran, 1,4-dioxane, ethers such as diisopropyl ether, ketones such as methyl ethyl ketone and methyl isobutyl ketone, an ester solvent such as ethyl acetate, an amide solvent such as dimethylformamide and dimethylacetamide, and the above-described solvent capable of dissolving the composition of the present invention, such as propylene glycol monomethyl ether acetate, propylene glycol monomethyl ether and cyclohexanone. The polymerization is more preferably performed using the same solvent as the solvent used in the positive resist composition of the present invention. By the use of the same solvent, production of particles during storage can be suppressed.

The polymerization reaction is preferably performed in an inert gas atmosphere such as nitrogen or argon. As for the polymerization initiator, the polymerization is started using a commercially available radical initiator (e.g., azo-based initiator, peroxide). The radical initiator is preferably an azo-based initiator, and an azo-based initiator having an ester group, a cyano group or a carboxyl group is preferred. Preferable initiators include azobisisobutyronitrile, azobisdimethylvaleronitrile, dimethyl 2,2'-azobis(2-methylpropionate), etc. The concentration in the reaction is from 5 to 50 mass %, preferably from 30 to 50 mass %, and the reaction temperature is usually from 10 to 150° C., preferably from 30 to 120° C., more preferably from 60 to 100° C.

After the completion of reaction, the reaction solution is allowed to cool to room temperature and purified. In the purification, there may be applied a conventional method, for example, a liquid-liquid extraction method of applying water washing or combining it with an appropriate solvent to remove residual monomers or oligomer components; a purification method in a solution sate, such as ultrafiltration of extracting and removing only polymers having a molecular weight not more than a specific value; a reprecipitation method of adding dropwise the resin solution in a poor solvent to solidify the resin in the poor solvent and thereby remove residual monomers and the like; and a purification method in a solid state, such as washing of a resin slurry with a poor solvent after separation of the slurry by filtration. For example, the resin is precipitated as a solid by contacting the reaction solution with a solvent in which the resin is sparingly soluble or insoluble (poor solvent) and which is in a volume amount of 10 times or less, preferably from 10 to 5 times, the reaction solution.

The solvent used at the operation of precipitation or reprecipitation from the polymer solution (precipitation or reprecipitation solvent) may be sufficient if it is a poor solvent for the polymer, and the solvent which can be used may be appropriately selected from, for example, a hydrocarbon, a halogenated hydrocarbon, a nitro compound, an ether, a ketone, an ester, a carbonate, an alcohol, a carboxylic acid, water, and a mixed solvent containing such a solvent, according to the kind of the polymer. Among these solvents, a solvent containing at least an alcohol (particularly, methanol or the like) or water is preferred as the precipitation or reprecipitation solvent.

The amount of the precipitation or reprecipitation solvent used may be appropriately selected by taking into account the efficiency, yield and the like, but in general, the amount used is from 100 to 10,000 parts by mass, preferably from 200 to 2,000 parts by mass, more preferably from 300 to 1,000 parts by mass, per 100 parts by mass of the polymer solution.

The temperature at the precipitation or reprecipitation may be appropriately selected by taking into account the efficiency or operability but is usually on the order of 0 to 50° C., preferably in the vicinity of room temperature (for example, approximately from 20 to 35° C.). The precipitation or reprecipitation operation may be performed using a commonly employed mixing vessel such as stirring tank by a known method such as batch system and continuous system.

The precipitated or reprecipitated polymer is usually subjected to commonly employed solid-liquid separation such as filtration and centrifugation, then dried and used. The filtration is performed using a solvent-resistant filter element preferably under pressure. The drying is performed under atmospheric pressure or reduced pressure (preferably under reduced pressure) at a temperature of approximately from 30 to 100° C., preferably on the order of 30 to 50° C.

Incidentally, after the resin is once precipitated and separated, the resin may be again dissolved in a solvent and then put into contact with a solvent in which the resin is sparingly soluble or insoluble. That is, there may be used a method involving, after the completion of radical polymerization reaction, bringing the polymer into contact with a solvent in which the polymer is sparingly soluble or insoluble, to precipitate a resin (step a), separating the resin from the solution (step b), anew dissolving the resin in a solvent to prepare a resin solution A (step c), bringing the resin solution A into contact with a solvent in which the resin is sparingly soluble or insoluble and which is in a volume amount of less than 10 times (preferably 5 times or less) the resin solution A, to precipitate a resin solid (step d), and separating the precipitated resin (step e).

Specific examples of the hydrophobic resin (HR) are illustrated below. Also, the molar ratio of repeating units (corresponding to respective repeating units starting from the left), weight average molecular weight and polydispersity of each resin are shown in Table 1 below.

[Chem. 52]

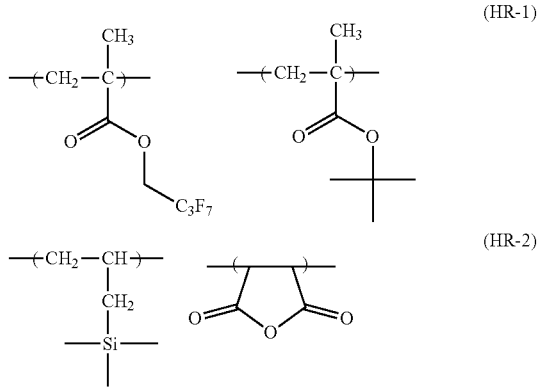

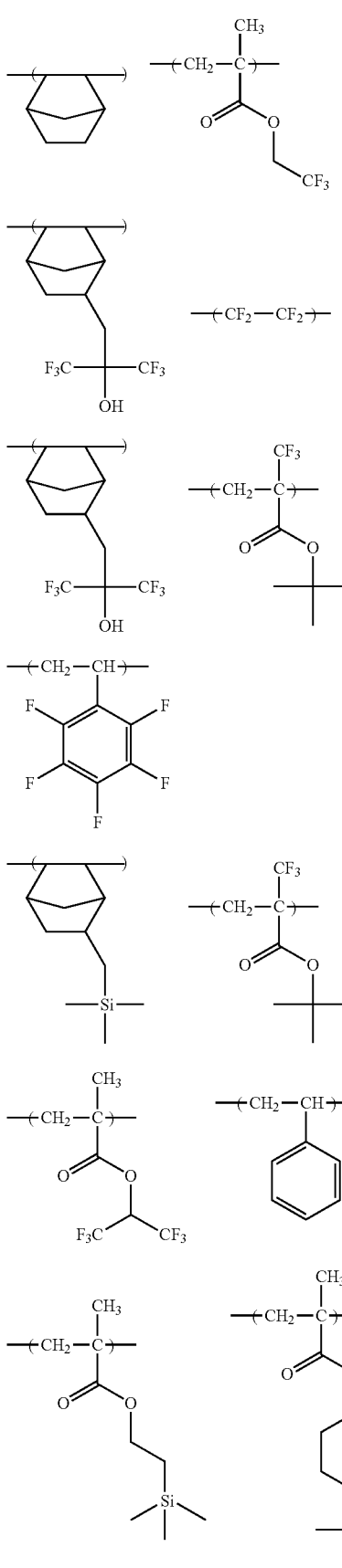
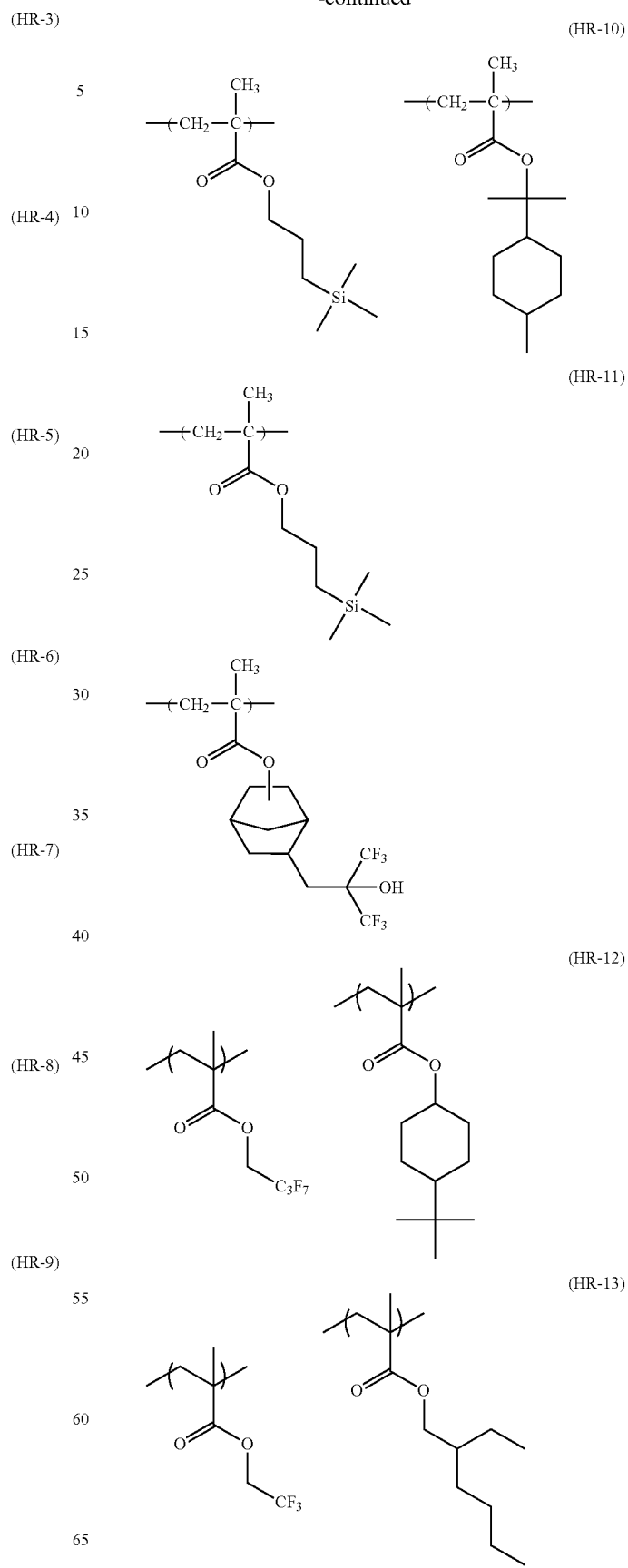

(HR-14)
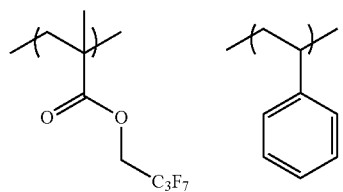
(HR-15)
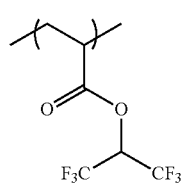
(HR-16)
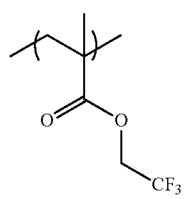
(HR-17)
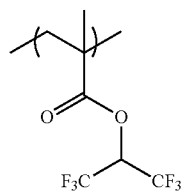
(HR-18)
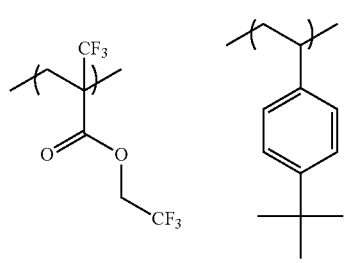
(HR-19)
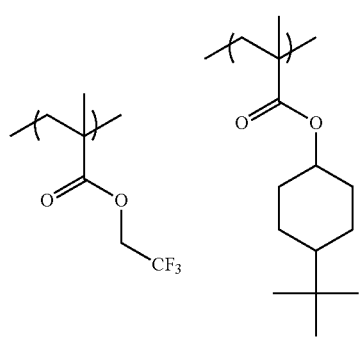
(HR-20)
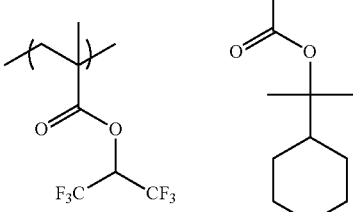
(HR-21)
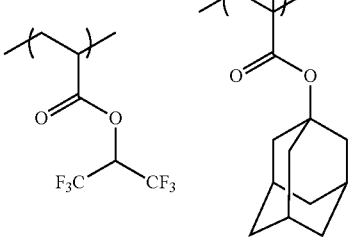
(HR-22)
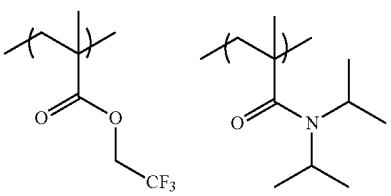
(HR-23)
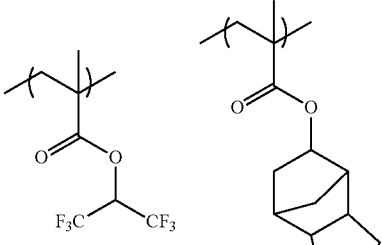
(HR-24)
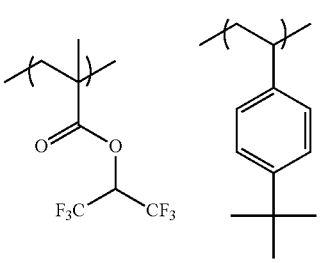

-continued
(HR-25)
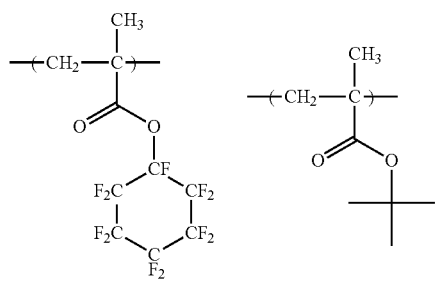
(HR-26)
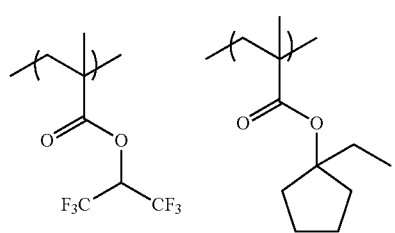
[Chem. 53]
(HR-27)
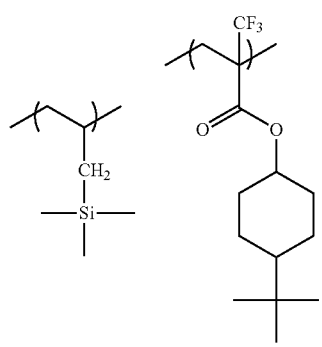
(HR-28)
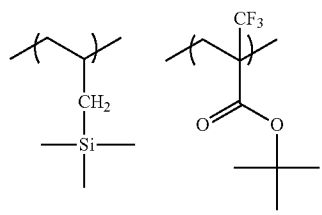
(HR-29)
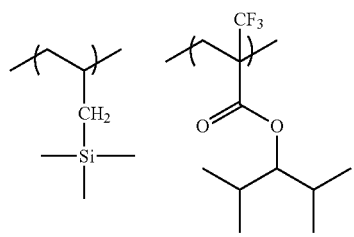
(HR-30)
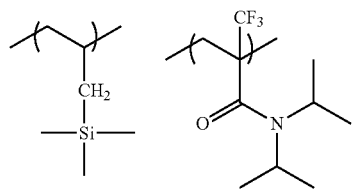
-continued
(HR-31)
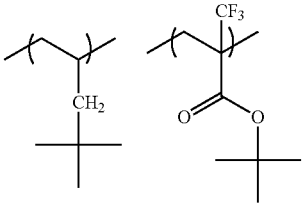
(HR-32)
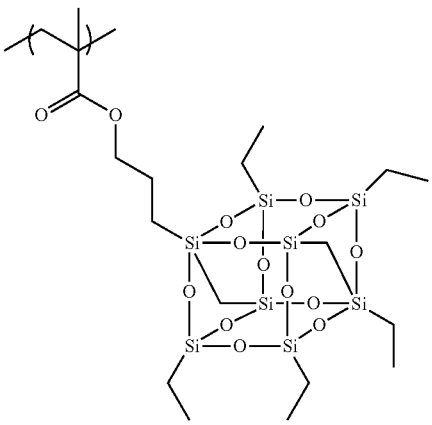
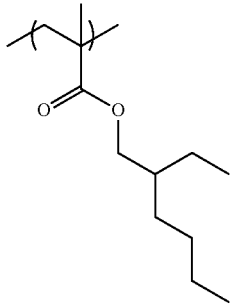
(HR-33)
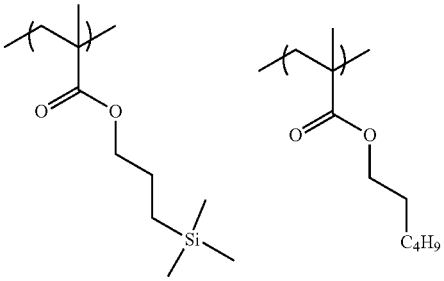
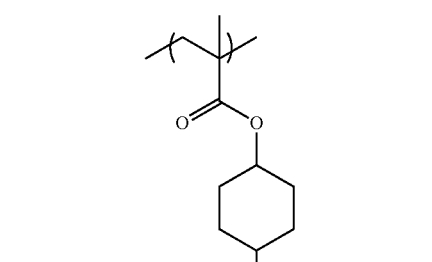

(HR-34) 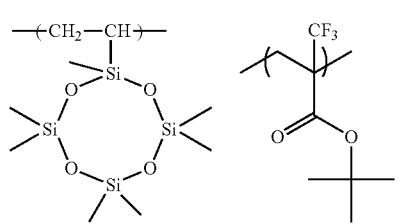
(HR-35) 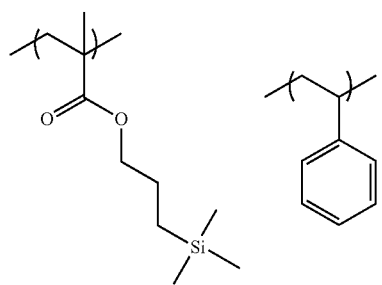
(HR-36) 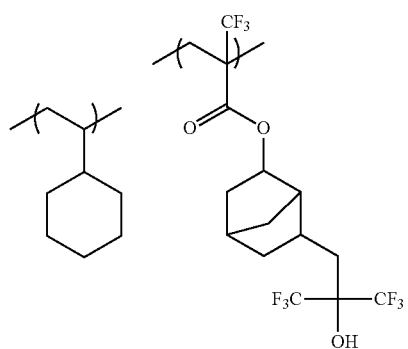
(HR-37) 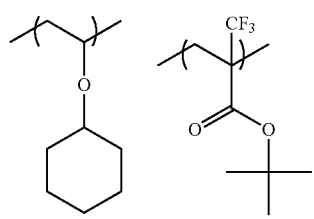
(HR-38) 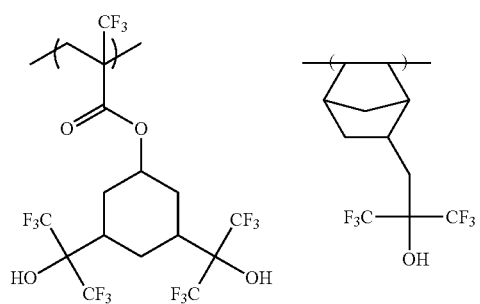
(HR-39) 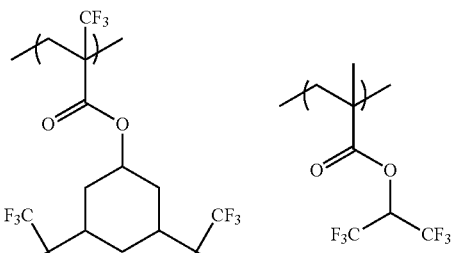
(HR-40) 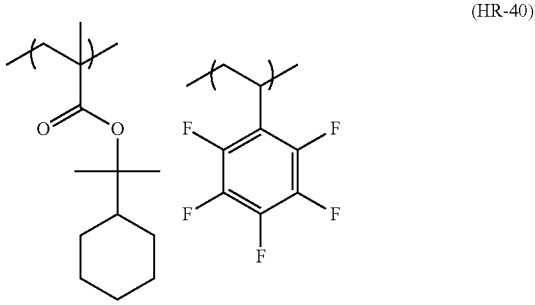
(HR-41) 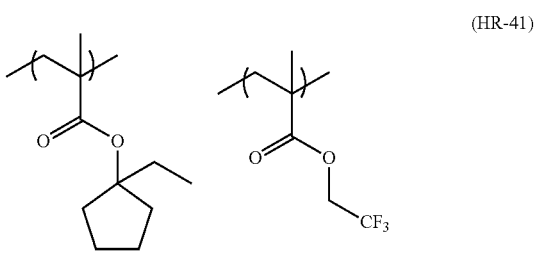
(HR-42) 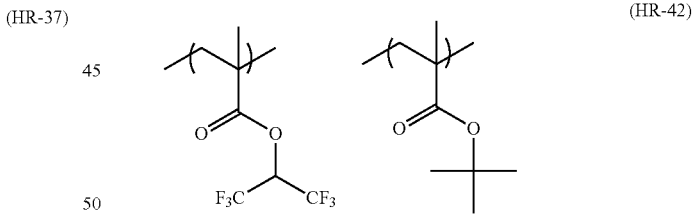
(HR-43) 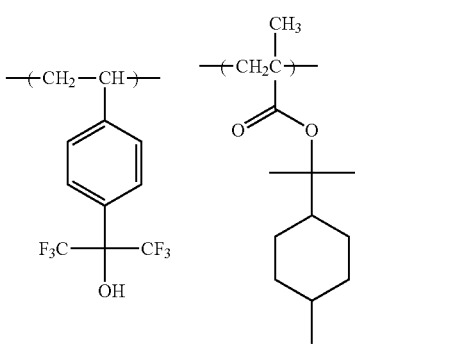

(HR-44)
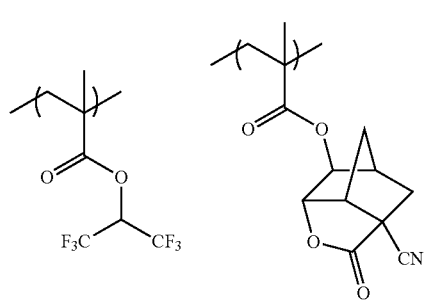
(HR-45)
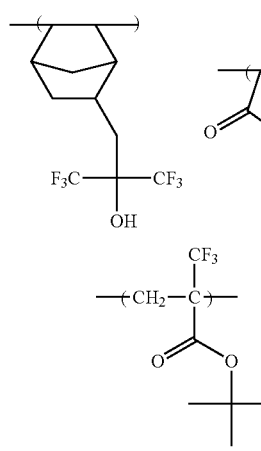
(HR-46)
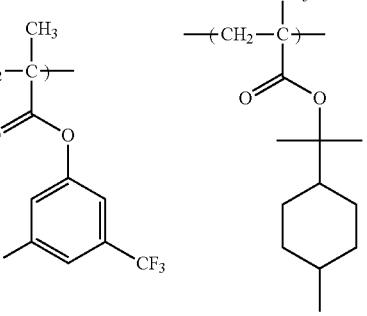
(HR-47)
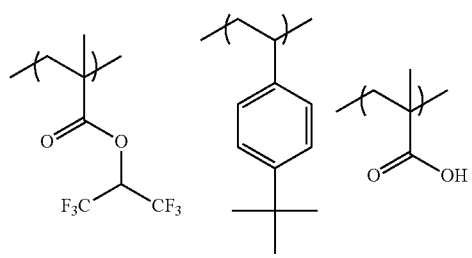
(HR-48)
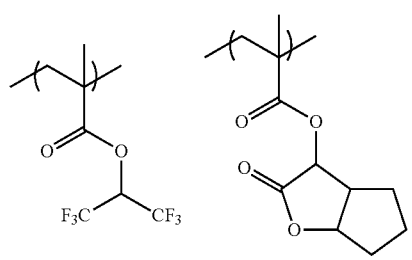
[Chem. 54]
(HR-49)
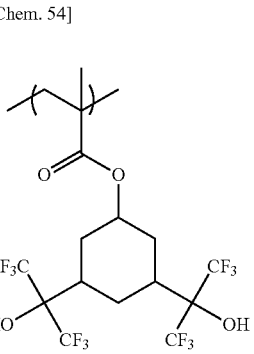
(HR-50)
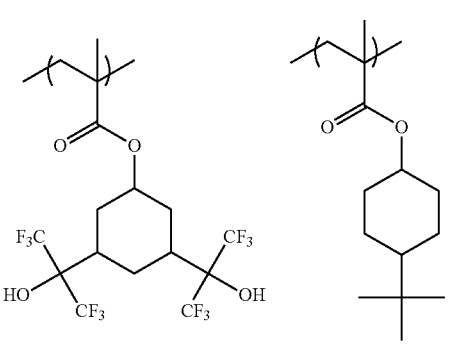
(HR-51)
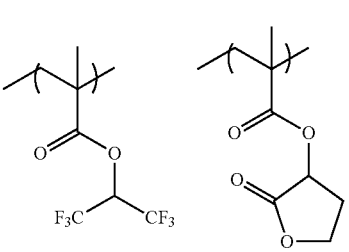
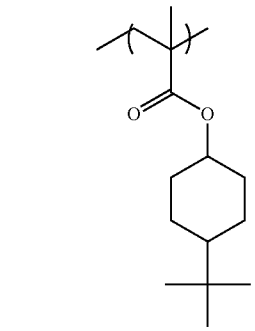
(HR-52)
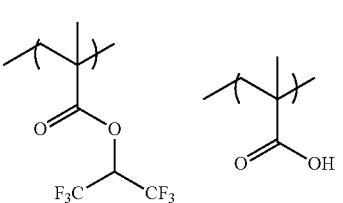

(HR-53)
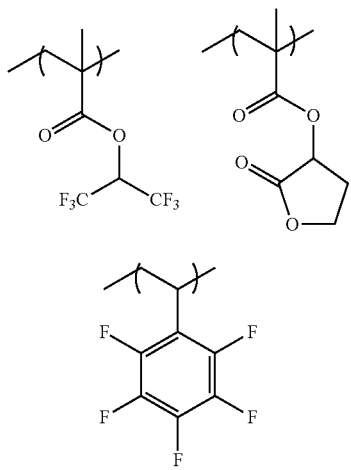
(HR-55)
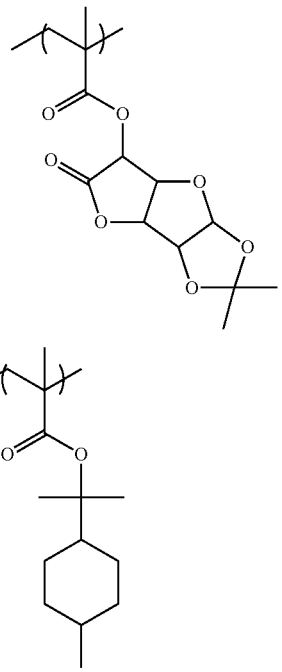
(HR-54)
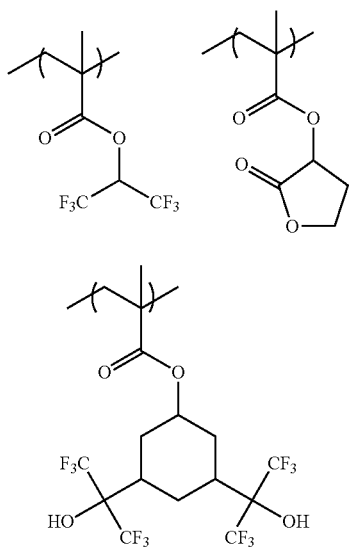
(H-56)
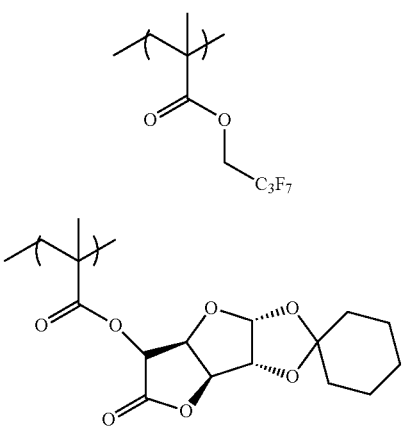

(HR-57)
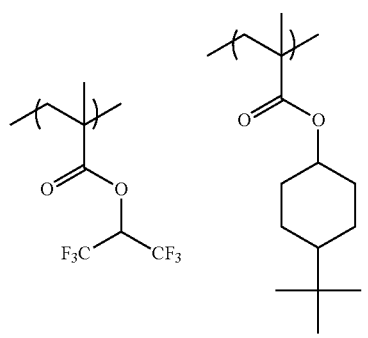
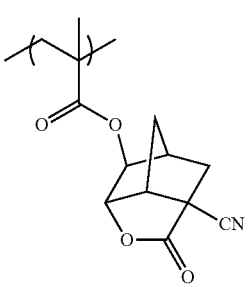
(HR-58)
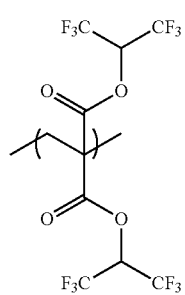 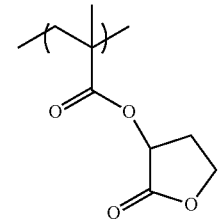
(HR-59)
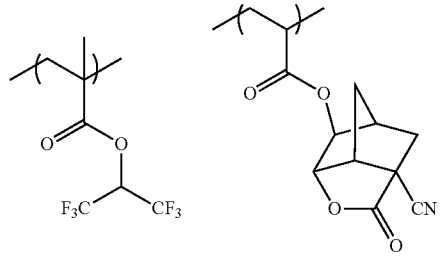
(HR-60)
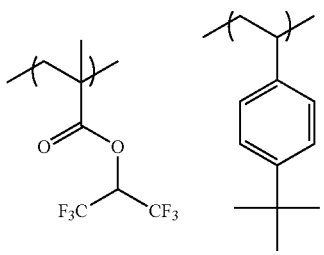
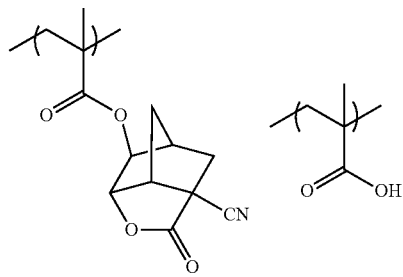
(HR-61)
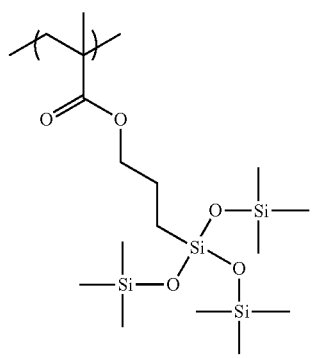
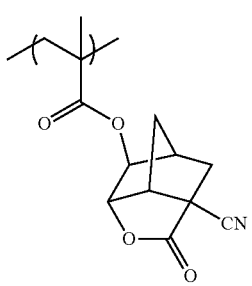
(HR-62)
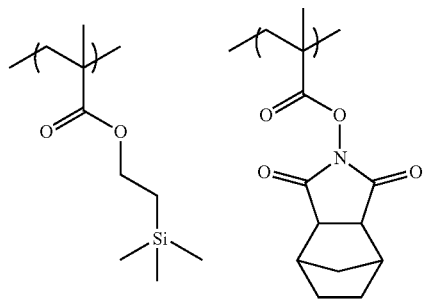

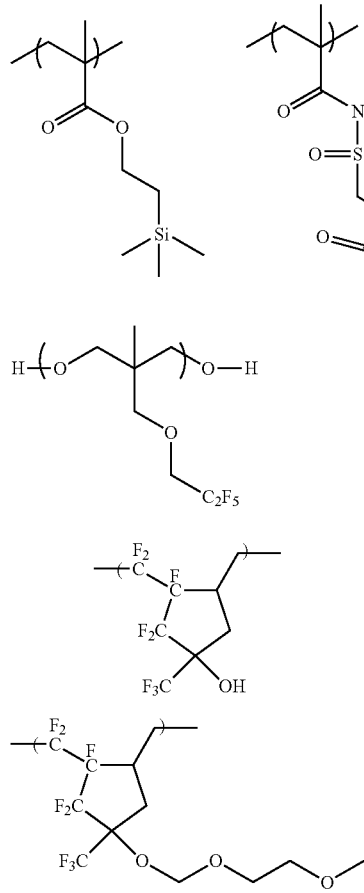

TABLE 1

| Resin | Composition | Mw | Mw/Mn |
|---|---|---|---|
| HR-1 | 50/50 | 4900 | 1.4 |
| HR-2 | 50/50 | 5100 | 1.6 |
| HR-3 | 50/50 | 4800 | 1.5 |
| HR-4 | 50/50 | 5300 | 1.6 |
| HR-5 | 50/50 | 4500 | 1.4 |
| HR-6 | 100 | 5500 | 1.6 |
| HR-7 | 50/50 | 5800 | 1.9 |
| HR-8 | 50/50 | 4200 | 1.3 |
| HR-9 | 50/50 | 5500 | 1.8 |
| HR-10 | 40/60 | 7500 | 1.6 |
| HR-11 | 70/30 | 6600 | 1.8 |
| HR-12 | 40/60 | 3900 | 1.3 |
| HR-13 | 50/50 | 9500 | 1.8 |
| HR-14 | 50/50 | 5300 | 1.6 |
| HR-15 | 100 | 6200 | 1.2 |
| HR-16 | 100 | 5600 | 1.6 |
| HR-17 | 100 | 4400 | 1.3 |
| HR-18 | 50/50 | 4300 | 1.3 |
| HR-19 | 50/50 | 6500 | 1.6 |
| HR-20 | 30/70 | 6500 | 1.5 |
| HR-21 | 50/50 | 6000 | 1.6 |
| HR-22 | 50/50 | 3000 | 1.2 |
| HR-23 | 50/50 | 5000 | 1.5 |
| HR-24 | 50/50 | 4500 | 1.4 |
| HR-25 | 30/70 | 5000 | 1.4 |
| HR-26 | 50/50 | 5500 | 1.6 |
| HR-27 | 50/50 | 3500 | 1.3 |
| HR-28 | 50/50 | 6200 | 1.4 |
| HR-29 | 50/50 | 6500 | 1.6 |
| HR-30 | 50/50 | 6500 | 1.6 |

TABLE 1-continued

| Resin | Composition | Mw | Mw/Mn |
|---|---|---|---|
| HR-31 | 50/50 | 4500 | 1.4 |
| HR-32 | 30/70 | 5000 | 1.6 |
| HR-33 | 30/30/40 | 6500 | 1.8 |
| HR-34 | 50/50 | 4000 | 1.3 |
| HR-35 | 50/50 | 6500 | 1.7 |
| HR-36 | 50/50 | 6000 | 1.5 |
| HR-37 | 50/50 | 5000 | 1.6 |
| HR-38 | 50/50 | 4000 | 1.4 |
| HR-39 | 20/80 | 6000 | 1.4 |
| HR-40 | 50/50 | 7000 | 1.4 |
| HR-41 | 50/50 | 6500 | 1.6 |
| HR-42 | 50/50 | 5200 | 1.6 |
| HR-43 | 50/50 | 6000 | 1.4 |
| HR-44 | 70/30 | 5500 | 1.6 |
| HR-45 | 50/20/30 | 4200 | 1.4 |
| HR-46 | 30/70 | 7500 | 1.6 |
| HR-47 | 40/58/2 | 4300 | 1.4 |
| HR-48 | 50/50 | 6800 | 1.6 |
| HR-49 | 100 | 6500 | 1.5 |
| HR-50 | 50/50 | 6600 | 1.6 |
| HR-51 | 30/20/50 | 6800 | 1.7 |
| HR-52 | 95/5 | 5900 | 1.6 |
| HR-53 | 40/30/30 | 4500 | 1.3 |
| HR-54 | 50/30/20 | 6500 | 1.8 |
| HR-55 | 30/40/30 | 7000 | 1.5 |
| HR-56 | 60/40 | 5500 | 1.7 |
| HR-57 | 40/40/20 | 4000 | 1.3 |
| HR-58 | 60/40 | 3800 | 1.4 |
| HR-59 | 80/20 | 7400 | 1.6 |
| HR-60 | 40/40/15/5 | 4800 | 1.5 |
| HR-61 | 60/40 | 5600 | 1.5 |
| HR-62 | 50/50 | 5900 | 2.1 |
| HR-63 | 80/20 | 7000 | 1.7 |
| HR-64 | 100 | 5500 | 1.8 |
| HR-65 | 50/50 | 9500 | 1.9 |

The immersion liquid used when performing immersion exposure is described below.

The immersion liquid is preferably a liquid being transparent to light of the exposure wavelength and having as small a temperature coefficient of refractive index as possible so as to minimize the distortion of an optical image projected on the resist film. Particularly, when the exposure light source is ArF excimer laser (wavelength: 193 nm), water is preferably used in view of availability and ease of handling, in addition to the above-described aspects.

Furthermore, a medium having a refractive index of 1.5 or more may also be used from the standpoint that the refractive index can be more improved. This medium may be either an aqueous solution or an organic solvent.

In the case of using water as the immersion liquid, for the purpose of decreasing the surface tension of water and increasing the surface activity, an additive (liquid) incapable of dissolving the resist layer on the wafer and at the same time, capable of giving only a negligible effect on the optical coat at the undersurface of the lens element may be added in a small ratio. The additive is preferably an aliphatic alcohol having a refractive index substantially equal to that of water, and specific examples thereof include methyl alcohol, ethyl alcohol, and isopropyl alcohol. By virtue of adding an alcohol having a refractive index substantially equal to that of water, even when the alcohol component in water is evaporated and its content concentration is changed, the change in the refractive index of the liquid as a whole can be made very small. On the other hand, when a substance opaque to light of 193 nm or an impurity greatly differing in the refractive index from water is mingled, this incurs distortion of the optical image projected on the resist film, and therefore, water used is preferably distilled water. Pure water obtained by further filtering the distilled water through an ion exchange filter or the like may be also used.

The electrical resistance of water is preferably 18.3 MΩcm or more, and TOC (total organic carbon) is preferably 20 ppb or less. Also, the water is preferably subjected to a deaeration treatment.

The lithography performance can be enhanced by elevating the refractive index of the immersion liquid. From such a standpoint, an additive for elevating the refractive index may be added to water, or heavy water ($D_2O$) may be used in place of water.

In order to prevent the film from contacting directly with the immersion liquid, an immersion liquid sparingly soluble film (hereinafter, sometimes referred to as "topcoat") may be provided between the film formed of the composition of the present invention and the immersion liquid. The functions required of the topcoat are suitability for coating on the resist upper layer part, transparency to radiation particularly of 193 nm, and difficult solubility in the immersion liquid. It is preferred that the topcoat does not intermix with the resist and can be uniformly coated on the resist upper layer.

In view of transparency to light of 193 nm, the topcoat is preferably a polymer not abundantly containing an aromatic moiety. Specifically, this polymer includes a hydrocarbon polymer, an acrylic acid ester polymer, a polymethacrylic acid, a polyacrylic acid, a polyvinyl ether, a silicon-containing polymer, a fluorine-containing polymer, and the like. The above-described hydrophobic resin (HR) is suitable also as the topcoat. From the standpoint that elution of impurities into the immersion liquid from the topcoat leads to contamination of the optical lens, the amount of residual monomer components of the polymer contained in the topcoat is preferably smaller.

On removing the topcoat, a developer may be used, or a release agent may be separately used. The release agent is preferably a solvent less permeating the resist film. From the standpoint that the removing step can be performed simultaneously with the film development step, the topcoat is preferably removable with an alkali developer and for the removal with an alkali developer, the topcoat is preferably acidic, but in view of non-intermixing with the film, the topcoat may be neutral or alkaline.

With no difference in the refractive index between the topcoat and the immersion liquid, the resolution is enhanced. In the case of using water as the immersion liquid at the exposure with an ArF excimer laser (wavelength: 193 nm), the topcoat for ArF immersion exposure preferably has a refractive index close to the refractive index of the immersion liquid. From the standpoint of making the refractive index close to that of the immersion liquid, the topcoat preferably contains a fluorine atom. Also, in view of transparency and refractive index, the topcoat is preferably a thin film.

The topcoat is preferably free of intermixing with the film and further with the immersion liquid. From this standpoint, when the immersion liquid is water, the solvent used for the topcoat is preferably a medium that is sparingly soluble in the solvent used for the composition of the present invention and is water-insoluble. On the other hand, when the immersion liquid is an organic solvent, the topcoat may be either water-soluble or water-insoluble.

The development step is described below.

In the development step, an alkali developer is usually used.

The alkali developer includes, for example, an alkaline aqueous solution containing inorganic alkalis such as sodium hydroxide, potassium hydroxide, sodium carbonate, sodium silicate, sodium metasilicate and aqueous ammonia, primary amines such as ethylamine and n-propylamine, secondary amines such as diethylamine and di-n-butylamine, tertiary amines such as triethylamine and methyldiethylamine, alcohol amines such as dimethylethanolamine and triethanolamine, quaternary ammonium salts such as tetramethylammonium hydroxide and tetraethylammonium hydroxide, or cyclic amines such as pyrrole and piperidine.

In the alkali developer, alcohols and/or a surfactant may be added each in an appropriate amount.

The concentration of the alkali developer is usually from 0.1 to 20 mass %. The pH of the alkali developer is usually from 10.0 to 15.0.

Details of the process when fabricating an imprint mold by using the composition of the present invention may be refer to, for example, Japanese Patent 4,109,085, JP-A-2008-162101, and "Yoshihiko Hirai (compiler), Nanoimprint no Kiso to Gijutsu Kaihatsu•Oyo Tenkai-Nanoimprint no Kiban Gijutsu to Saishin no Gijutsu Tenkai (Basic and Technology Expansion•Application Development of Nanoimprint-Substrate Technology of Nanoimprint and Latest Technology Expansion), Frontier Shuppan".

The present invention also includes an electronic device manufacturing method involving the above-described pattern forming method of the present invention, and an electronic device manufactured by this manufacturing method.

The electronic device of the present invention is suitably mounted on electric and electronic equipment (home electronic device, OA•media-related device, optical device communication device, etc.).

EXAMPLES

The present invention is described in greater detail below, but the present invention is not limited thereto.

Example A

Examples 1A to 19A and Comparative Examples 1A and 2A

<Preparation of Resist>

The components shown in Table 2 below were dissolved in the solvent to prepare a solution having a solid content concentration of 4.0 mass %, and the obtained solution was filtered through a polytetrafluoroethylene filter having a pore size of 0.03 μm to prepare a positive resist solution. The positive resist compositions (resist solutions) prepared were evaluated by the following method and the results are shown in Table 2.

<Evaluation of Resist>

An organic antireflection film, ARC29A (produced by Nissan Chemical Industries, Ltd.), was coated on a silicon wafer and baked at 205° C. for 60 seconds to form an antireflection film having a thickness of 78 nm, and the positive resist composition prepared was coated thereon and baked at 130° C. for 60 seconds to form a resist film having a thickness of 120 nm. The obtained resist film was exposed through a 6% halftone mask having a 1:1 line-and-space pattern with a line width of 75 nm by using an ArF excimer laser scanner (PAS5500/1100, manufactured by ASML, NA: 0.75). Thereafter, the film was heated at 130° C. for 60 seconds, developed with an aqueous tetramethylammonium hydroxide solution (2.38 mass %) for 30 seconds, rinsed with the pure water, and spin-dried to obtain a resist pattern.

[LER (Line Edge Roughness)]

In the measurement of line edge roughness (nm), the line-and-space 1/1 pattern with a line width of 75 nm was observed using a critical dimension scanning electron microscope (SEM), and the distance from the reference line where the edge should be present was measured using a critical dimension SEM (S-8840, manufactured by Hitachi, Ltd.) at 50 points in the longitudinal edge range of 2 μm of the line pattern. The standard deviation was determined, and 3σ was computed. A smaller value indicates better performance.

[Sensitivity, Resolution (γ Value)]

Surface exposure was performed by changing the exposure dose in steps of 0.5 mJ/cm$^2$ in the range of 10 to 40 mJ/cm$^2$, and the exposed film was further baked at 110° C. for 90 seconds. Thereafter, the dissolution rate at each exposure dose was measured by using an aqueous 2.38 mass % tetramethylammonium hydroxide (TMAH) solution to obtain a solubility curve.

The sensitivity was defined as the exposure dose at which the dissolution rate of the resist film was saturated on the solubility curve. Also, the dissolution contrast (γ value) was calculated from the gradient of the straight line portion of the solubility curve. A larger γ value indicates a higher dissolution contrast and is considered to be more advantageous in terms of resolution.

[Aging Stability (Variation of Sensitivity after Aging)]

The resist composition (resist solution) was refrigerated at 5° C. for 2 weeks and then measured for the sensitivity in the same manner as above to evaluate the aging stability. A smaller variation from the sensitivity when not aged is better.

[Outgassing Performance: Percentage Variation in Film Thickness by Exposure]

Irradiation with ArF excimer laser at an exposure dose of 2.0 times the exposure dose giving the sensitivity above was performed, and the film thickness after exposure but before post-baking was measured. The percentage variation from the film thickness when not exposed was determined by the following formula:

Percentage variation in film thickness (%)=[(film thickness when not exposed−film thickness after exposure)/film thickness when not exposed]×100

These measurement results are shown in Table 2 below.

TABLE 2

(ArF; positive)

| | (A1) Acid Generator (0.4 g) | (A2) Acid Generator (0.4 g) | (B) Resin (9.6 g) | Basic Compound (0.02 g) | Surfactant (0.1 mass %)* | Solvent (mass ratio) | Sensitivity (mJ/cm$^2$) | Resolution (γ value) | LER (nm) | Sensitivity after Aging (mJ/cm$^2$) | Outgassing (%) |
|---|---|---|---|---|---|---|---|---|---|---|---|
| Example 1A | b-19 | — | RA-2 | C-1 | W-1 | A1/B1 (6/4) | 27.0 | 7.1 | 4.2 | 27.0 | 4.4 |
| Example 2A | b-63 | — | RA-2 | C-1 | W-1 | A1/B1 (6/4) | 28.0 | 6.9 | 4.1 | 30.0 | 3.4 |
| Example 3A | b-6 | Z | RA-2 | C-1 | W-1 | A1/B1 (6/4) | 29.0 | 6.4 | 4.6 | 30.0 | 5.0 |
| Example 4A | b-9 | — | RA-2 | C-1 | W-1 | A1/B1 (6/4) | 28.0 | 6.9 | 4.3 | 28.0 | 3.0 |
| Example 5A | b-3 | — | RA-2 | C-1 | W-1 | A1/B1 (6/4) | 32.0 | 6.0 | 5.5 | 34.0 | 6.0 |
| Example 6A | b-4 | — | RA-3 | C-3 | W-1 | A1/B1 (6/4) | 33.0 | 5.8 | 5.6 | 35.0 | 6.0 |
| Example 7A | b-10 | — | RA-1 | C-1 | W-1 | A2/B2 (6/4) | 28.0 | 6.8 | 4.4 | 29.0 | 5.5 |
| Example 8A | b-18 | — | RA-2 | C-1 | W-2 | A1/B1 (6/4) | 29.0 | 6.3 | 4.7 | 30.0 | 3.6 |
| Example 9A | b-11 | Z | RA-2 | C-1 | W-3 | A3/B1 (6/4) | 30.0 | 6.1 | 5.2 | 32.0 | 5.5 |
| Example 10A | b-20 | — | RA-2 | C-1 | W-3 | A3/B1 (6/4) | 27.0 | 7.0 | 4.4 | 27.0 | 4.4 |
| Example 11A | b-23 | — | RA-4 | C-1 | W-3 | A3/B1 (6/4) | 29.0 | 6.4 | 4.6 | 29.0 | 5.0 |
| Example 12A | b-27 | — | RA-3 | C-2 | W-4 | A4/B1 (6/4) | 29.0 | 6.5 | 4.5 | 29.0 | 4.9 |
| Example 13A | b-32 | — | RA-4 | C-3 | W-4 | A4/B1 (6/4) | 28.0 | 7.0 | 4.3 | 28 | 3.2 |
| Example 14A | b-37 | — | RA-3 | C-2 | W-4 | A4/B1 (6/4) | 30.0 | 6.4 | 4.8 | 30.0 | 4.2 |
| Example 15A | b-40 | — | RA-4 | C-3 | W-4 | A4/B1 (6/4) | 31.0 | 6.2 | 5.0 | 31.0 | 4.3 |
| Example 16A | b-42 | — | RA-3 | C-2 | W-4 | A4/B1 (6/4) | 30.0 | 6.3 | 4.9 | 31.0 | 5.4 |
| Example 17A | b-48 | — | RA-4 | C-3 | W-4 | A4/B1 (6/4) | 29.0 | 6.4 | 4.2 | 29.0 | 5.5 |
| Example 18A | b-50 | — | RA-3 | C-2 | W-4 | A4/B1 (6/4) | 31.0 | 6.2 | 4.9 | 31.0 | 5.5 |
| Example 19A | b-52 | — | RA-4 | C-3 | W-4 | A4/B1 (6/4) | 29.0 | 6.4 | 5.1 | 30.0 | 3.2 |
| Comparative Example 1A | Comparative Compound 1 | — | RA-2 | C-1 | W-1 | A1/B1 (6/4) | 42.0 | 5.4 | 6.3 | 51.0 | 6.2 |
| Comparative Example 2A | Comparative Compound 2 | — | RA-2 | C-1 | W-1 | A1/B1 (6/4) | 43.0 | 5.3 | 6.2 | 53.0 | 6.2 |

*Incidentally, the content (0.1 mass %) of the surfactant is the content based on the total amount of solid matters in the resist composition. In the following Tables, the same applies.

Respective components used are as follows.

[Acid Generator]

Acid Generator (A1) of the present invention is the compound illustrated above.

Acid Generator (A2) used in combination is Compound Z shown below.

[Chem. 55]

(Z)

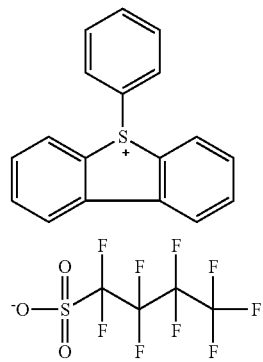

Comparative Compounds 1 and 2 are those shown below.

[Chem. 56]

Comparative Compound 1

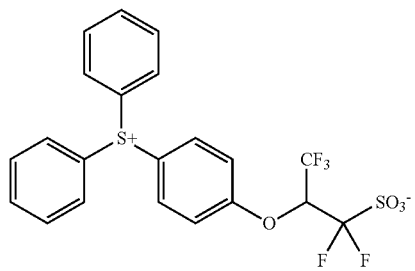

Comparative Compound 2

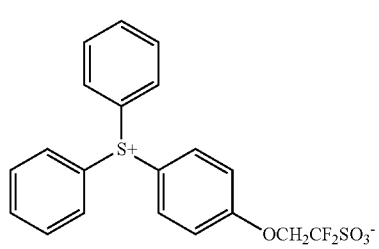

[Resin]

As the resin, any one of (RA-1) to (RA-4) shown below was used. In the following formulae, the numeral on the right side of repeating units indicates the molar ratio. Also, Mw indicates the weight average molecular weight, and Mw/Mn indicates the polydispersity.

[Chem. 57]

(RA-1)

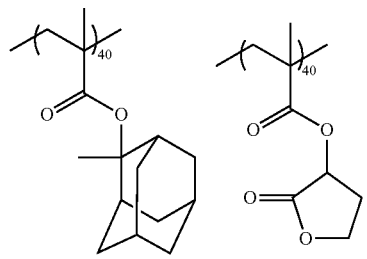

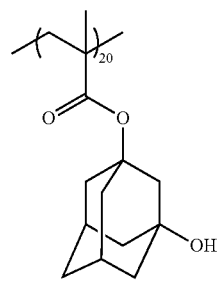

MW = 10700
Mw/Mn = 1.81

(RA-2)

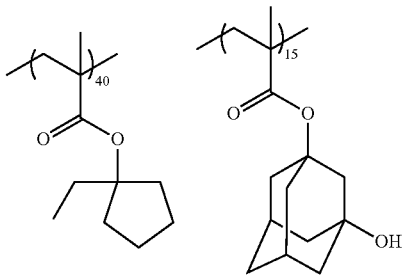

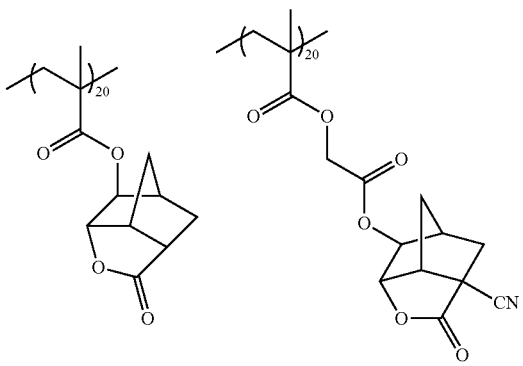

MW = 8500
Mw/Mn = 1.60

(RA-3)

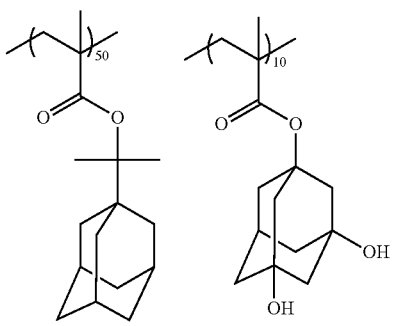

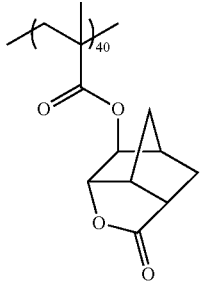

MW = 8800
Mw/Mn = 1.90

-continued (RA-4)

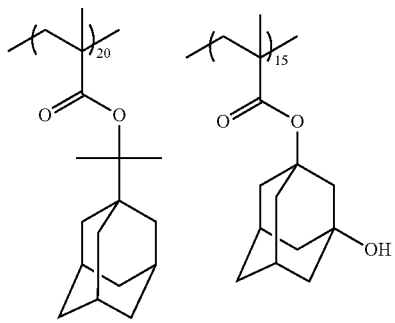

Mw = 10000
Mw/Mn = 1.70

<Basic Compound>

As the basic compound, the following Compounds C-1 to C-3 were used.
C-1: 2,4,5-Triphenylimidazole
C-2: Tetrabutylammonium hydroxide
C-3: 1,5-Diazabicyclo[4.3.0]non-5-ene
<Surfactant>

As the surfactant, the following W-1 to W-4 were used.
W-1: Megaface F176 (produced by DIC Corp.; fluorine-containing)
W-2: Megaface R08 (produced by DIC Corp.; fluorine- and silicon-containing)
W-3: Polysiloxane Polymer KP-341 (produced by Shin-Etsu Chemical Co., Ltd.; silicon-containing)
W-4: Troysol S-366 (produced by Troy Chemical; fluorine-containing)
<Solvent>

As the solvent, the following A1 to A4, B1 and B2 were used. These solvents were appropriately mixed and used.
A1: Propylene glycol monomethyl ether acetate
A2: 2-Heptanone
A3: Cyclohexanone
A4: γ-Butyrolactone
B1: Propylene glycol monomethyl ether
B2: Ethyl lactate As apparent from the results in Table 2, with respect to ArF exposure, in Comparative Examples 1A and 2A using Comparative Compounds 1 and 2 (both are compounds described in Patent Document 2 (JP-A-2011-16746)) as the acid generator, the sensitivity, resolution and LER were poor, the variation of sensitivity after aging was large, and the outgassing was frequently generated.

The reason why in Comparative Examples 1A and 2A, the sensitivity was poor, particularly, as to the aging stability, the variation of sensitivity after aging was large, is not clearly known but is considered because the decomposition efficiency (acid generation efficiency) of Comparative Compounds 1 and 2 during exposure is low probably due to low solubility of Comparative Compounds 1 and 2 for the solvent in the composition.

On the other hand, in Examples 1A to 19A using, as the acid generator, (A1) a compound represented by formula (Z1) where when -$L_1$-$R_1$-$A_1$ is substituted at the para-position relative to $S^+$, $L_1$ is not an oxygen atom, the sensitivity, resolution and LER were excellent, the variation of sensitivity after aging was small, and the outgassing was little generated.

The reason why in Examples 1A to 19A using the compound (A1) according to the present invention, the sensitivity and LER were excellent, is not clearly known but is considered that the compound (A1) represented by formula (Z1) is configured to have a specific betaine structure of not allowing $L_1$ to be an oxygen atom when -$L_1$-$R_1$-$A_1$ is substituted at the para-position relative to $S^+$, whereby the decomposition efficiency (acid generation efficiency) of the compound (A1) during exposure can be enhanced, the solubility of the compound (A1) for the solvent in the composition can be increased, the compound (A1) can be prevented from precipitating in the resist composition during storage and exhibit excellent aging stability (little variation of sensitivity after aging), and because of high acid generation efficiency, a large amount of acid can be generated, resulting in high sensitivity and low LER.

Furthermore, it is considered that the compound (A1) according to the present invention has a betaine structure having an anion moiety and a cation moiety in the same molecule and thanks to this configuration, the cation moiety decomposes during exposure to reduce the molecular weight, as a result, the solubility of the exposed area for an alkali developer is enhanced to increase the dissolution contrast, making it possible to achieve high resolution.

Example B

Resist solutions were prepared in the same manner as in Example 1A except for adding 0.06 g of the polymer shown below (the compositional ratio is in terms of molar ratio) to the composition of Example 1A, and the solution was coated to obtain a resist film. The obtained resist film was pattern-wise exposed through an immersion liquid (pure water) by using an ArF excimer laser immersion scanner (XT1700i, manufactured by ASML, NA: 1.2), and a pattern was formed in the same manner as in Example A1.

The obtained pattern was evaluated for the sensitivity, resolution, LER, aging stability (variation of sensitivity after aging), and outgassing performance in the same manner as in Example A. As a result, it was confirmed that the sensitivity, resolution and LER are excellent, the variation of sensitivity after aging is small, and the outgassing is little generated.

The reason therefor is as described in Example A.

[Chem. 58]

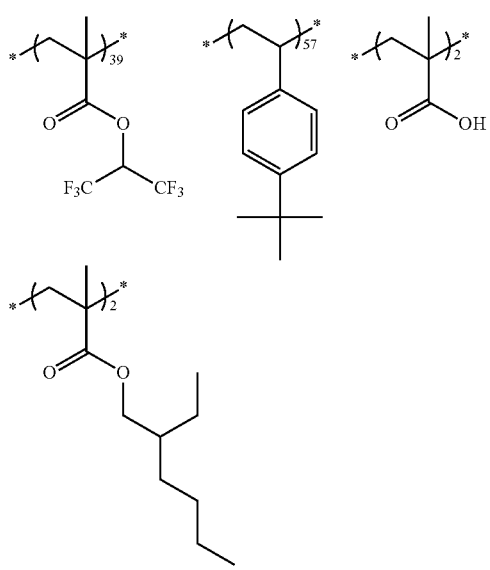

Weight average molecular weight: 4,500
Polydispersity: 1.4

Example C

Examples 1C to 10C and Comparative Examples 1C and 2C

<Preparation of Resist>

The components shown in Table 3 below were dissolved in the solvent, and the obtained solution was filtered through a polytetrafluoroethylene filter having a pore size of 0.1 μm to prepare a positive resist composition (resist solution) having a total solid content concentration of 8 mass %.

<Evaluation of Resist>

The positive resist solution prepared was uniformly coated on a hexamethyldisilazane-treated silicon substrate by using a spin coater and heated/dried on a hot plate at 120° C. for 90 seconds to form a resist film having a thickness of 0.4 μm.

This resist film was patternwise exposed using a KrF excimer laser stepper (NA=0.63) and immediately after the exposure, baked on a hot plate at 110° C. for 90 seconds. Thereafter, the resist film was developed with an aqueous 2.38 mass % tetramethylammonium hydroxide solution at 23° C. for 60 seconds, rinsed with pure water for 30 seconds and then dried to form a line-and-space 1/1 pattern with a line width of 0.2 μm.

[LER (Line Edge Roughness)]

In the measurement of line edge roughness (nm), the line-and-space 1/1 pattern with a line width of 0.2 μm was observed using a critical dimension scanning electron microscope (SEM), and the distances from the reference line where the edge should be present was measured using a critical dimension SEM (S-8840, manufactured by Hitachi, Ltd.) at 50 points in the longitudinal edge range of 5 μm of the line pattern. The standard deviation was determined, and 3σ was computed. A smaller value indicates better performance.

[Sensitivity, Resolution (γ Value)]

Surface exposure was performed by changing the exposure dose in steps of 0.5 mJ/cm$^2$ in the range of 10 to 40 mJ/cm$^2$, and the exposed film was further baked at 110° C. for 90 seconds. Thereafter, the dissolution rate at each exposure dose was measured by using an aqueous 2.38 mass % tetramethylammonium hydroxide (TMAH) solution to obtain a solubility curve.

The sensitivity was defined as the exposure dose at which the dissolution rate of the resist was saturated on the solubility curve. Also, the dissolution contrast (γ value) was calculated from the gradient of the straight line portion of the solubility curve. A larger γ value indicates a higher dissolution contrast and is considered to be more advantageous in terms of resolution.

[Aging Stability (Variation of Sensitivity after Aging)]

The resist composition (resist solution) was refrigerated at 5° C. for 2 weeks and then measured for the sensitivity in the same manner as above to evaluate the aging stability. A smaller variation from the sensitivity when not aged is better.

[Outgassing Performance: Percentage Variation in Film Thickness by Exposure]

Irradiation with KrF excimer laser at an exposure dose of 2.0 times the exposure dose giving the sensitivity above was performed, and the film thickness after exposure but before post-baking was measured. The percentage variation from the film thickness when not exposed was determined by the following formula:

Percentage variation in film thickness (%)=[(film thickness when not exposed−film thickness after exposure)/film thickness when not exposed]×100

These measurement results are shown in Table 3 below.

TABLE 3

(KrF; positive)

| | (A1) Acid Generator (0.3 g) | (A2) Acid Generator (0.1 g) | (B) Resin (10 g) | Basic Compound (0.02 g) | Surfactant (0.1 mass %) | Solvent (mass ratio) | Sensitivity (mJ/cm$^2$) | Resolution (γ value) | LER (nm) | Sensitivity after Aging (mJ/cm$^2$) | Outgassing (%) |
|---|---|---|---|---|---|---|---|---|---|---|---|
| Example 1C | b-3 | — | R-18 | C-1 | W-1 | A1/B1 (6/4) | 24.0 | 6.2 | 5.2 | 26.0 | 6.0 |
| Example 2C | b-8 | — | R-18 | C-1 | W-1 | A1/B1 (6/4) | 22.0 | 7.2 | 4.4 | 22.5 | 3.2 |
| Example 3C | b-25 | — | R-18 | C-1 | W-1 | A3/B1 (6/4) | 21.5 | 6.9 | 4.4 | 21.5 | 3.7 |
| Example 4C | b-34 | — | R-18 | C-2 | W-1 | A4/B1 (6/4) | 22.0 | 7.1 | 4.3 | 22.0 | 3.1 |
| Example 5C | b-57 | — | R-18 | C-1 | W-1 | A1/B1 (6/4) | 22.0 | 7.2 | 4.5 | 22.5 | 3.0 |
| Example 6C | b-6 | — | R-19 | C-1 | W-1 | A1/B1 (6/4) | 22.5 | 6.7 | 4.5 | 23.0 | 5.0 |
| Example 7C | b-7 | — | R-19 | C-3 | W-1 | A1/B1 (6/4) | 22.0 | 6.5 | 4.6 | 22.0 | 4.0 |
| Example 8C | b-10 | Z | R-22 | C-1 | W-2 | A1/B1 (6/4) | 21.5 | 7.0 | 4.3 | 22.0 | 4.8 |
| Example 9C | b-19 | — | R-27 | C-1 | W-3 | A1/B1 (6/4) | 21.0 | 7.3 | 4.1 | 21.0 | 3.5 |
| Example 10C | b-52 | — | R-29 | C-2 | W-1 | A1/B1 (6/4) | 22.0 | 6.7 | 4.4 | 22.5 | 3.6 |
| Comparative Example 1C | Comparative Compound 1 | — | R-18 | C-1 | W-1 | A1/B1 (6/4) | 28.0 | 5.8 | 5.4 | 39.0 | 6.5 |
| Comparative Example 2C | Comparative Compound 2 | — | R-18 | C-1 | W-1 | A1/B1 (6/4) | 28.0 | 5.7 | 5.5 | 38.0 | 7.0 |

The photoacid generators (A1) and (A2), basic compound, surfactant and solvent used were appropriately selected from those illustrated above.

The resin used was appropriately selected from (R-1) to (R-30) illustrated above. The molar ratio of respective repeating units and the weight average molecular weight of each of (R-18), (R-19), (R-22), (R-27) and (R-29) recited in Table 3 and the Tables later are shown in Table 4 below.

TABLE 4

| Resin | Molar Ratio of Repeating Units (corresponding to repeating units from the left) | Weight Average Molecular Weight (Mw) |
|---|---|---|
| R-18 | 75/25 | 10000 |
| R-19 | 60/20/20 | 12000 |
| R-22 | 70/30 | 12000 |
| R-23 | 70/30 | 13000 |
| R-27 | 50/45/5 | 15000 |
| R-29 | 50/45/5 | 15000 |

As apparent from the results in Table 3, with respect to KrF exposure, in Comparative Examples 1C and 2C using Comparative Compounds 1 and 2 as the acid generator, the sensitivity, resolution and LER were poor, the variation of sensitivity after aging was large, and the outgassing was frequently generated.

The reason why in Comparative Examples 1C and 2C, the sensitivity was poor, particularly, as to the aging stability, the variation of sensitivity after aging was large, is considered to be the same as the reason described above in Example A.

On the other hand, in Examples 1C to 10C using, as the acid generator, (A1) a compound represented by formula (Z1) where when -$L_1$-$R_1$-$A_1$ is substituted at the para-position relative to $S^+$, $L_1$ is not an oxygen atom, the sensitivity, resolution and LER were excellent, the variation of sensitivity after aging was small, and the outgassing was little generated.

The reason why in Examples 1C to 10C, the sensitivity, resolution and LER were excellent and the variation of sensitivity after aging was small is considered to be the same as the reason described above in Example A.

Example D

Examples 1D to 26D and Comparative Examples 1D and 2D

Preparation of Resist

The components shown in Tables 5 and 6 below were dissolved in the solvent shown, and the obtained solution was filtered through a polytetrafluoroethylene filter having a pore size of 0.1 μm to prepare a positive resist composition (resist solution) having a solid content concentration of 4 mass %.

<Evaluation of Resist>

The positive resist solution prepared was uniformly coated on a hexamethyldisilazane-treated silicon substrate by using a spin coater and heated/dried on a hot plate at 120° C. for 60 seconds to form a resist film having a thickness of 0.12 μm.

This resist film was irradiated using an electron beam projection lithography system (accelerating voltage: 100 keV) manufactured by Nikon Corporation and immediately after the irradiation, baked on a hot plate at 110° C. for 90 seconds. Thereafter, the resist film was developed with an aqueous 2.38 mass % tetramethylammonium hydroxide solution at 23° C. for 60 seconds, rinsed with pure water for 30 seconds and then dried to form a line-and-space pattern.

[Sensitivity]

The obtained patterns was observed using a scanning electron microscope (model S-9220 manufactured by Hitachi, Ltd.). The electron beam irradiation dose when resolving a line width of 0.10 μm (line:space=1:1) was taken as the sensitivity ($E_0$).

[Resolution]

The limiting resolution for 1:1 line-and-space (the minimum line width below which the line and the space were not separated and resolved) at the irradiation dose giving the sensitivity above was taken as the resolution.

[LER (Line Edge Roughness)]

In the measurement of line edge roughness (nm), the line-and-space 1/1 pattern with a line width of 0.10 μm was observed using a critical dimension scanning electron microscope (SEM), and the distances from the reference line where the edge should be present was measured using a critical dimension SEM (S-8840, manufactured by Hitachi, Ltd.) at 50 points in the longitudinal edge range of 2 μm of the line pattern. The standard deviation was determined, and 3σ was computed. A smaller value indicates better performance.

[Aging Stability (Variation of Sensitivity after Aging)]

The resist composition (resist solution) was refrigerated at 5° C. for 2 weeks and then measured for the sensitivity in the same manner as above to evaluate the aging stability. A smaller variation from the sensitivity when not aged is better.

[Outgassing Performance: Percentage Variation in Film Thickness by Exposure]

Irradiation with an electron beam at an irradiation dose of 2.0 times the irradiation dose giving the sensitivity above was performed, and the film thickness after exposure but before post-baking was measured. The percentage variation from the film thickness when not exposed was determined by the following formula:

Percentage variation in film thickness (%)=[(film thickness when not exposed−film thickness after exposure)/film thickness when not exposed]×100

These measurement results are shown in Tables 5 and 6 below.

TABLE 5

| (Electron Beam Exposure; positive) | | | | | | | | | | |
|---|---|---|---|---|---|---|---|---|---|---|
| | (A1) Acid Generator (0.3 g) | (A2) Acid Generator (0.1 g) | (B) Resin (10 g) | Basic Compound (0.02 g) | Surfactant (0.1 mass %) | Solvent (mass ratio) | Sensitivity (μC/cm$^2$) | Resolution (nm) | LER (nm) | Sensitivity after Aging (μC/cm$^2$) | Outgassing (%) |
| Example 1D | b-3 | — | R-18 | C-1 | W-1 | A1/B1 (6/4) | 23.0 | 65 | 6.3 | 25.0 | 3.7 |
| Example 2D | b-8 | — | R-18 | C-1 | W-1 | A2/B2 (6/4) | 18.0 | 50 | 4.6 | 18.0 | 1.9 |
| Example 3D | b-25 | — | R-18 | C-1 | W-1 | A3/B1 (6/4) | 18.0 | 50 | 4.4 | 18.0 | 2.0 |
| Example 4D | b-34 | — | R-18 | C-1 | W-1 | A4/B1 (6/4) | 18.0 | 50 | 4.5 | 18.0 | 1.9 |

TABLE 5-continued (Electron Beam Exposure; positive)

| | (A1) Acid Generator (0.3 g) | (A2) Acid Generator (0.1 g) | (B) Resin (10 g) | Basic Compound (0.02 g) | Surfactant (0.1 mass %) | Solvent (mass ratio) | Sensitivity ($\mu C/cm^2$) | Resolution (nm) | LER (nm) | Sensitivity after Aging ($\mu C/cm^2$) | Outgassing (%) |
|---|---|---|---|---|---|---|---|---|---|---|---|
| Example 5D | b-57 | — | R-18 | C-1 | W-1 | A1/B1 (6/4) | 17.5 | 50 | 4.4 | 18.0 | 1.7 |
| Example 6D | b-4 | — | R-18 | C-1 | W-1 | A1/B1 (6/4) | 23.5 | 65 | 6.4 | 25.0 | 3.8 |
| Example 7D | b-62 | — | R-18 | C-1 | — | A1/B1 (6/4) | 17.5 | 50 | 4.6 | 18.0 | 1.8 |
| Example 8D | b-6 | — | R-19 | C-1 | W-1 | A1/B1 (6/4) | 19.0 | 55 | 4.9 | 19.0 | 2.6 |
| Example 9D | b-7 | Z | R-19 | C-1 | W-2 | A1/B1 (6/4) | 19.0 | 55 | 5.0 | 19.0 | 2.2 |
| Example 10D | b-9 | — | R-29 | C-1 | W-3 | A1/B1 (6/4) | 18.0 | 50 | 4.3 | 18.5 | 1.8 |
| Example 11D | b-10 | — | R-29 | C-2 | W-1 | A1/B1 (6/4) | 18.0 | 50 | 4.5 | 18.0 | 2.4 |
| Example 12D | b-11 | — | R-22 | C-1 | W-4 | A1/B1 (6/4) | 19.5 | 55 | 5.1 | 20.0 | 2.4 |
| Example 13D | b-21 | — | R-22 | C-1 | W-4 | A1/B1 (6/4) | 17.5 | 50 | 4.5 | 18.0 | 1.7 |
| Example 14D | b-18 | — | R-29 | C-1 | W-4 | A1/B1 (6/4) | 19.0 | 55 | 4.4 | 19.5 | 2.1 |

TABLE 6

(Table 5, continued) (Electron Beam Exposure; positive)

| | (A1) Acid Generator (0.3 g) | (A2) Acid Generator (0.1 g) | (B) Resin (10 g) | Basic Compound (0.02 g) | Surfactant (0.1 mass %) | Solvent (mass ratio) | Sensitivity ($\mu C/cm^2$) | Resolution (nm) | LER (nm) | Sensitivity after Aging ($\mu C/cm^2$) | Outgassing (%) |
|---|---|---|---|---|---|---|---|---|---|---|---|
| Example 15D | b-19 | — | R-29 | C-1 | W-4 | A1/B1 (6/4) | 17.0 | 45 | 4.0 | 17.0 | 1.9 |
| Example 16D | b-20 | — | R-29 | C-3 | W-4 | A1/B1 (6/4) | 17.0 | 45 | 4.2 | 17.0 | 1.9 |
| Example 17D | b-23 | — | R-29 | C-1 | W-4 | A1/B1 (6/4) | 19.0 | 55 | 4.9 | 19.0 | 2.2 |
| Example 18D | b-26 | Z | R-29 | C-1 | W-4 | A1/B1 (6/4) | 19.0 | 55 | 4.7 | 19.0 | 2.1 |
| Example 19D | b-27 | — | R-27 | C-2 | W-1 | A1/B1 (6/4) | 19.0 | 55 | 4.6 | 19.0 | 2.2 |
| Example 20D | b-28 | — | R-29 | C-1 | W-1 | A1/B1 (6/4) | 18.5 | 50 | 4.3 | 18.5 | 1.9 |
| Example 21D | b-32 | — | R-29 | C-1 | W-1 | A1/B1 (6/4) | 17.5 | 50 | 4.3 | 17.5 | 1.7 |
| Example 22D | b-52 | — | R-19 | C-1 | W-1 | A1/B1 (6/4) | 19.0 | 55 | 4.5 | 19.5 | 1.8 |
| Example 23D | b-55 | — | R-18 | C-2 | W-1 | A1/B1 (6/4) | 22.5 | 65 | 6.0 | 24.5 | 3.5 |
| Example 24D | b-37 | — | R-22 | C-1 | W-1 | A1/B1 (6/4) | 19.0 | 55 | 4.6 | 19.0 | 2.0 |
| Example 25D | b-40 | — | R-27 | C-1 | W-1 | A1/B1 (6/4) | 20.0 | 60 | 5.0 | 20.0 | 2.1 |
| Example 26D | b-63 | — | R-22 | C-1 | W-1 | A1/B1 (6/4) | 18.0 | 50 | 4.7 | 18.5 | 1.8 |
| Comparative Example 1D | Comparative Compound 1 | — | R-18 | C-1 | W-1 | A1/B1 (6/4) | 29.0 | 75 | 7.2 | 40.0 | 4.2 |
| Comparative Example 2D | Comparative Compound 2 | — | R-29 | C-1 | W-1 | A1/B1 (6/4) | 30.0 | 75 | 7.4 | 41.0 | 4.1 |

The photoacid generators (A1) and (A2), basic compound, surfactant and solvent used were appropriately selected from those illustrated above. The resin (B) such as (R-18), (R-19), (R-22), (R-27) and (R-29) are also as described above.

As apparent from the results in Tables 5 and 6, with respect to electron beam exposure (irradiation), in Comparative Examples 1D and 2D using Comparative Compounds 1 and 2 as the acid generator, the sensitivity, resolution and LER were poor, the variation of sensitivity after aging was large, and the outgassing was frequently generated.

The reason why in Comparative Examples 1D and 2D, the sensitivity was poor, particularly, as to the aging stability, the variation of sensitivity after aging was large, is considered to be the same as the reason described above in Example A.

On the other hand, in Examples 1D to 26D using, as the acid generator, (A1) a compound represented by formula (Z1) where when -$L_1$-$R_1$-$A_1$ is substituted at the para-position relative to $S^+$, $L_1$ is not an oxygen atom, the sensitivity, resolution and LER were excellent, the variation of sensitivity after aging was small, and the outgassing was little generated.

The reason why in Examples 1D to 26D, the sensitivity, resolution and LER were excellent and the variation of sensitivity after aging was small is considered to be the same as the reason described above in Example A.

Example E

Examples 1E to 9E and Comparative Examples 1E and 2E (Preparation of Resist)

The components shown in Table 7 below were dissolved in the solvent, and the obtained solution was filtered through a polytetrafluoroethylene filter having a pore size of 0.1 μm to prepare a negative resist solution having a solid content concentration of 4 mass %.

<Evaluation of Resist>

The negative resist solution prepared was uniformly coated on a hexamethyldisilazane-treated silicon substrate by using a spin coater and heated/dried on a hot plate at 120° C. for 60 seconds to form a resist film having a thickness of 0.12 μm.

This resist film was irradiated using an electron beam projection lithography system (accelerating voltage: 100 keV) manufactured by Nikon Corporation and immediately after the irradiation, baked on a hot plate at 110° C. for 90 seconds. Thereafter, the resist film was developed with an aqueous 2.38 mass % tetramethylammonium hydroxide solution at 23° C. for 60 seconds, rinsed with pure water for 30 seconds and then dried to form a line-and-space pattern.

The evaluations were performed in the same manner as in Example D. The results obtained are shown in Table 7.

TABLE 7

(Electron Beam Exposure; negative)

| | (A1) Acid Generator (0.3 g) | (A2) Acid Generator (0.1 g) | (C) Resin (10 g) | (D) Cross-linking Agent (3.0 g) | Basic Compound (0.02 g) | Surfactant (0.1 mass %) | Solvent (mass ratio) | Sensitivity ($\mu C/cm^2$) | Resolution (nm) | LER (nm) | Sensitivity after Aging ($\mu C/cm^2$) | Out-gassing (%) |
|---|---|---|---|---|---|---|---|---|---|---|---|---|
| Example 1E | b-3 | — | P-3 | CL-1 | C-1 | W-1 | A1/B1 (6/4) | 24.0 | 65 | 11.0 | 26.0 | 6.5 |
| Example 2E | b-8 | — | P-3 | CL-1 | C-1 | W-1 | A1/B1 (6/4) | 20.5 | 55 | 10.0 | 21.0 | 3.8 |
| Example 3E | b-25 | — | P-3 | CL-1 | C-1 | W-1 | A1/B1 (6/4) | 20.0 | 55 | 10.1 | 20.0 | 3.7 |
| Example 4E | b-34 | — | P-3 | CL-1 | C-1 | W-1 | A1/B1 (6/4) | 20.0 | 55 | 9.9 | 20.5 | 3.5 |
| Example 5E | b-57 | — | P-3 | CL-1 | C-1 | W-1 | A1/B1 (6/4) | 20.5 | 55 | 9.8 | 21.0 | 3.2 |
| Example 6E | b-6 | — | P-3 | CL-1 | C-1 | W-1 | A1/B1 (6/4) | 21.0 | 60 | 10.2 | 21.5 | 4.9 |
| Example 7E | b-7 | — | P-1 | CL-1 | C-1 | W-1 | A1/B1 (6/4) | 21.0 | 60 | 9.9 | 21.0 | 4.7 |
| Example 8E | b-10 | — | P-2 | CL-2 | C-1 | W-2 | A1/B1 (6/4) | 20.5 | 50 | 10.1 | 20.5 | 4.4 |
| Example 9E | b-19 | — | P-1 | CL-3 | C-1 | W-3 | A1/B1 (6/4) | 20.0 | 50 | 9.2 | 20.0 | 3.6 |
| Comparative Example 1E | Comparative Compound 1 | — | P-3 | CL-1 | C-1 | W-1 | A1/B1 (6/4) | 31.0 | 70 | 12.4 | 42.0 | 7.5 |
| Comparative Example 2E | Comparative Compound 2 | — | P-3 | CL-1 | C-1 | W-1 | A1/B1 (6/4) | 31.5 | 75 | 12.5 | 41.0 | 7.2 |

The structure (compositional ratio (molar ratio)), molecular weight and molecular weight distribution of the alkali-soluble resin (C), and the structure of the acid crosslinking agent are shown below.

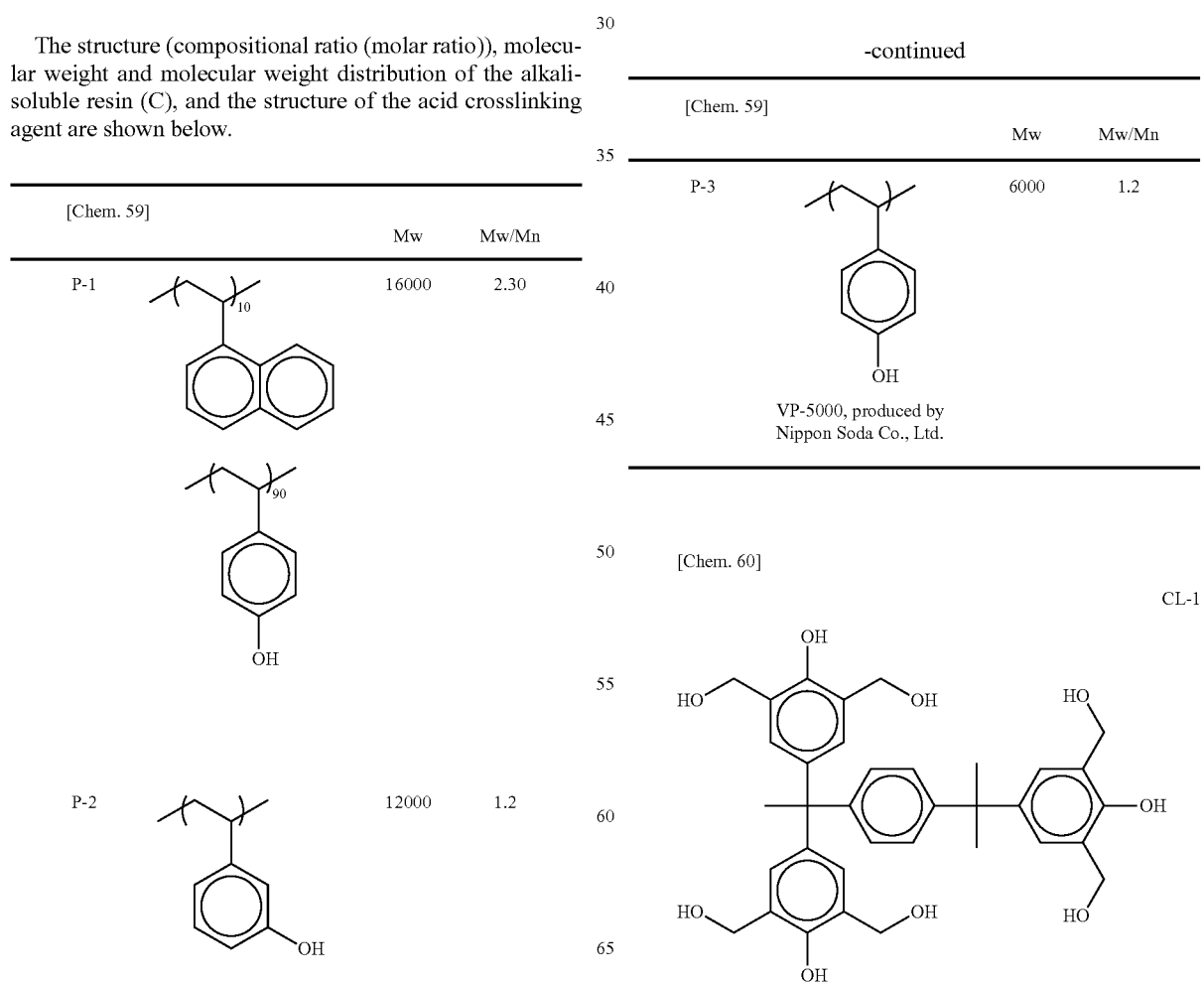

VP-5000, produced by Nippon Soda Co., Ltd.

-continued

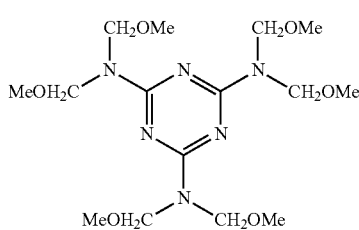
CL-2

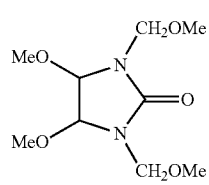
CL-3

As apparent from the results in Table 7, with respect to electron beam exposure (irradiation) of the negative resist composition, in Comparative Examples 1E and 2E using Comparative Compounds 1 and 2 (both are compounds described in Patent Document 2 (JP-A-2011-16746)) as the acid generator, the sensitivity, resolution and LER were poor, the variation of sensitivity after aging was large, and the outgassing was frequently generated.

The reason why in Comparative Examples 1E and 2E, the sensitivity was poor, particularly, as to the aging stability, the variation of sensitivity after aging was large, is considered to be the same as the reason described above in Example A.

On the other hand, in Examples 1E to 9E using, as the acid generator, (A1) a compound represented by formula (Z1) where when $-L_1-R_1-A_1$ is substituted at the para-position relative to $S^+$, $L_1$ is not an oxygen atom, the sensitivity, resolution and LER were excellent, the variation of sensitivity after aging was small, and the outgassing was little generated, revealing that the composition is suitable also as a negative resist composition.

The reason why in Examples 1E to 9E using the compound (A1) according to the present invention, the sensitivity and LER were excellent, is not clearly known but is considered that the compound (A1) represented by formula (Z1) is configured to have a specific betaine structure of not allowing $L_1$ to be an oxygen atom when $-L_1-R_1-A_1$ is substituted at the para-position relative to $S^+$, whereby the decomposition efficiency (acid generation efficiency) of the compound (A1) during exposure can be enhanced, the solubility of the compound (A1) for the solvent in the composition can be increased, the compound (A1) can be prevented from precipitating in the resist composition during storage and exhibit excellent aging stability (little variation of sensitivity after aging), and because of high acid generation efficiency, a large amount of acid can be generated, resulting in high sensitivity and low LER.

Example F

Examples 1F to 8F and Comparative Examples 1F and 2F

<Preparation of Resist>

The components shown in Table 8 below were dissolved in the solvent, and the obtained solution was filtered through a polytetrafluoroethylene filter having a pore size of 0.1 μm to prepare a positive resist solution having a solid content concentration of 4 mass %.

<Evaluation of Resist>

The positive resist solution prepared was uniformly coated on a hexamethyldisilazane-treated silicon substrate by using a spin coater and heated/dried on a hot plate at 120° C. for 60 seconds to form a resist film having a thickness of 0.12 μm.

This resist film was irradiated using an EUV exposure apparatus (wavelength: 13 nm) and immediately after the irradiation, baked on a hot plate at 110° C. for 90 seconds. Thereafter, the resist film was developed with an aqueous 2.38 mass % tetramethylammonium hydroxide solution at 23° C. for 60 seconds, rinsed with pure water for 30 seconds and then dried to form a line-and-space pattern (line:space=1: 1) with a line width of 50 nm. The obtained pattern was evaluated by the following methods.

[Sensitivity]

The obtained patterns was observed using a scanning electron microscope (model S-9220 manufactured by Hitachi, Ltd.). The electron beam irradiation dose when resolving a line width of 50 nm (line:space=1:1) was taken as the sensitivity ($E_0$).

[Resolution]

The limiting resolution for 1:1 line-and-space (the minimum line width below which the line and the space were not separated and resolved) at the irradiation dose giving the sensitivity above was taken as the resolution.

[LER (Line Edge Roughness)]

A line pattern (L/S=1/1) with a line width of 50 nm was formed at the irradiation dose giving the sensitivity above, and the distances from the reference line where the edge should be present was measured using a scanning electron microscope (S-9220, manufactured by Hitachi, Ltd.) at arbitrary 30 points included in the longitudinal range of 50 μm of the line pattern. The standard deviation of the distance was determined, and 3σ was computed.

[Aging Stability (Variation of Sensitivity after Aging)]

The resist composition (resist solution) was refrigerated at 5° C. for 2 weeks and then measured for the sensitivity in the same manner as above to evaluate the aging stability. A smaller variation from the sensitivity when not aged is better.

[Outgassing Performance: Percentage Variation in Film Thickness by Exposure]

Irradiation with EUV at an exposure dose of 2.0 times the exposure dose giving the sensitivity above was performed, and the film thickness after exposure but before post-baking was measured. The percentage variation from the film thickness when not exposed was determined by the following formula:

Percentage variation in film thickness (%)=[(film thickness when not exposed−film thickness after exposure)/film thickness when not exposed]×100

These measurement results are shown in Table 8 below.

TABLE 8

(EUV Exposure; positive)

|  | (A1) Acid Generator (0.3 g) | (B) Resin (10 g) | Basic Compound (0.02 g) | Surfactant (0.1 mass %) | Solvent (mass ratio) | Resolution (nm) | Sensitivity (mJ/cm$^2$) | LER (nm) | Sensitivity after Aging (mJ/cm$^2$) | Outgassing (%) |
|---|---|---|---|---|---|---|---|---|---|---|
| Example 1F | b-3 | R-23 | C-1 | W-1 | A1/B1 (6/4) | 28.0 | 23.0 | 5.3 | 26.0 | 5.6 |
| Example 2F | b-6 | R-23 | C-1 | W-1 | A1/B1 (6/4) | 27.0 | 19.0 | 4.8 | 19.5 | 4.5 |
| Example 3F | b-10 | R-23 | C-1 | W-1 | A1/B1 (6/4) | 26.0 | 18.0 | 4.3 | 18.0 | 3.9 |
| Example 4F | b-18 | R-23 | C-1 | W-2 | A1/B1 (6/4) | 27.0 | 19.0 | 4.6 | 19.5 | 3.4 |
| Example 5F | b-19 | R-23 | C-1 | W-1 | A1/B1 (6/4) | 25.0 | 17.0 | 3.8 | 17.0 | 3.4 |
| Example 6F | b-32 | R-23 | C-1 | W-1 | A1/B1 (6/4) | 25.0 | 17.0 | 3.9 | 17.0 | 3.1 |
| Example 7F | b-8 | R-18 | C-2 | W-1 | A1/B1 (6/4) | 25.5 | 17.5 | 3.7 | 17.5 | 3.0 |
| Example 8F | b-25 | R-18 | C-2 | W-1 | A1/B1 (6/4) | 26.5 | 18.0 | 4.1 | 18.0 | 3.5 |
| Comparative Example 1F | Comparative Compound 1 | R-23 | C-1 | W-1 | A1/B1 (6/4) | 30.5 | 30.0 | 5.9 | 41.0 | 6.4 |
| Comparative Example 2F | Comparative Compound 2 | R-23 | C-1 | W-1 | A1/B1 (6/4) | 32.0 | 31.0 | 6.1 | 43.0 | 6.2 |

The photoacid generator (A1), resin (B), basic compound, surfactant and solvent used were appropriately selected from those illustrated above.

As apparent from the results in Table 8, with respect to EUV exposure, in Comparative Examples 1F and 2F using Comparative Compounds 1 and 2 as the acid generator, the sensitivity, resolution and LER were poor, the variation of sensitivity after aging was large, and the outgassing was frequently generated.

The reason why in Comparative Examples 1C and 2C, the sensitivity and resolution were poor, particularly, as to the aging stability, the variation of sensitivity after aging was large, is considered to be the same as the reason described above in Example A.

On the other hand, in Examples 1F to 8F using, as the acid generator, (A1) a compound represented by formula (Z1) where when -L$_1$-R$_1$-A$_1$ is substituted at the para-position relative to S$^+$, L$_1$ is not an oxygen atom, the sensitivity, resolution and LER were excellent, the variation of sensitivity after aging was small, and the outgassing was little generated.

The reason why in Examples 1F to 8F, the sensitivity, resolution and LER were excellent and the variation of sensitivity after aging was small is considered to be the same as the reason described above in Example A.

Example G

Examples 1G and 2G and Comparative Example 1G

<Preparation of Resist>

The components shown in Table 9 below were dissolved in the solvent, and the obtained solution was filtered through a polytetrafluoroethylene filter having a pore size of 0.1 μm to prepare a negative resist solution having a solid content concentration of 4 mass %. The evaluations were performed as follows.

<Evaluation of Resist>

The negative resist solution prepared was uniformly coated on a hexamethyldisilazane-treated silicon substrate by using a spin coater and heated/dried on a hot plate at 120° C. for 60 seconds to form a resist film having a thickness of 0.12 μm.

This resist film was evaluated in the same manner as in Example F. The results obtained are shown in Table 9 below.

TABLE 9

(EUV Exposure; negative)

|  | (A1) Acid Generator (0.3 g) | (C) Resin (10 g) | (D) Cross-linking agent (3.0 g) | Basic Compound (0.02 g) | Surfactant (0.1 mass %) | Solvent (mass ratio) | Sensitivity (mJ/cm$^2$) | LER (nm) | Sensitivity after Aging (mJ/cm$^2$) | Outgassing (%) |
|---|---|---|---|---|---|---|---|---|---|---|
| Example 1G | b-8 | P-3 | CL-1 | C-1 | W-1 | A1/B1 (6/4) | 26.0 | 7.5 | 26.0 | 6.1 |
| Example 2G | b-19 | P-3 | CL-1 | C-1 | W-1 | A1/B1 (6/4) | 25.5 | 7.4 | 25.5 | 6.0 |
| Comparative Example 1G | Comparative Compound 1 | P-3 | CL-1 | C-1 | W-1 | A1/B1 (6/4) | 42.0 | 10.5 | 53.0 | 7.9 |

The photoacid generator (A1), resin (B), crosslinking agent, basic compound, surfactant and solvent used were appropriately selected from those illustrated above.

As apparent from the results in Table 9, with respect to EUV exposure of the negative resist composition, in Comparative Example 1G using Comparative Compound 1 as the acid generator, the sensitivity and LER were poor, the variation of sensitivity after aging was large, and the outgassing was frequently generated.

The reason why in Comparative Example 1G, the sensitivity was poor, particularly, as to the aging stability, the variation of sensitivity after aging was large, is considered to be the same as the reason described above in Example A.

On the other hand, in Examples 1G and 2G using, as the acid generator, (A1) a compound represented by formula (Z1) where when -L$_1$-R$_1$-A$_1$ is substituted at the para-position relative to S$^+$, L$_1$ is not an oxygen atom, the sensitivity and LER were excellent, the variation of sensitivity after aging was small, and the outgassing was little generated, revealing that the composition is suitable also as a negative resist composition.

The reason why in Examples 1G and 2G, the sensitivity and LER were excellent and the variation of sensitivity after aging was small is considered to be the same as the reason described above in Example E.

INDUSTRIAL APPLICABILITY

According to the present invention, an actinic ray-sensitive or radiation-sensitive resin composition excellent in sensitivity, resolution, roughness performance and aging stability and less likely to cause outgassing, a pattern forming method and a resist film using the composition, and an electronic device manufacturing method and an electronic device using the composition, method or film, can be provided.

While the invention has been described in detail and with reference to specific embodiments thereof, it will be apparent to one skilled in the art that various changes and modifications can be made therein without departing from the spirit and scope of the invention.

This application is based on Japanese Patent Application (Patent Application No. 2012-032099) filed on Feb. 16, 2012, the contents of which are incorporated herein by way of reference.

The invention claimed is:

1. An actinic ray-sensitive or radiation-sensitive resin composition containing a compound capable of generating an acid upon irradiation with an actinic ray or radiation, represented by the following formula (Z1):

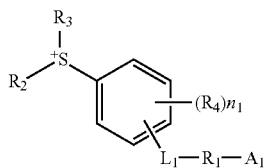

in formula (Z1),
$L_1$ represents —O—, —S—, —OS(=O)$_2$—, —S(=O)$_2$O—, —OC(=O)—, —C(=O)O—, —S(=O)—, —S(=O)$_2$—, —C(=O)—, —N(R$_7$)C(=O)—, —C(=O)N(R$_7$)—, —N(R$_7$)S(=O)$_2$— or —S(=O)$_2$N(R$_7$)— (in all of these, the right side is the $R_1$ side), wherein $R_7$ represents a hydrogen atom, an alkyl group or a cycloalkyl group;

$R_1$ represents an alkylene group, a cycloalkylene group, an arylene group or a divalent group formed by the combination thereof, and —O—, —C(=O)—, —S(=O)$_2$— or —S— may be inserted between the groups;

$A_1$ represents —SO$_3^-$, —SO$_2$N$^-$SO$_2$R$_8$ or —SO$_2$C$^-$(SO$_2$R$_9$)$_2$, wherein $R_8$ represents an alkyl group, a cycloalkyl group or an aryl group, $R_9$ represents an alkyl group, a cycloalkyl group or an aryl group, and two $R_9$ may be the same or different;

each of $R_2$ and $R_3$ independently represents an alkyl group, an alkenyl group, a cycloalkyl group, an aryl group or a heterocyclic group;

$R_4$ represents a monovalent substituent, $n_1$ represents an integer of 0 to 4, and when $n_1$ is 2 or more, each $R_4$ may be the same as or different from every other $R_4$; and $R_2$ and $R_3$, $R_2$ and $R_4$, $R_3$ and $R_4$, $R_2$ and the benzene ring in formula (Z1), $R_3$ and the benzene ring, or $R_4$ and $R_4$ when $n_1$ is 2 or more, may combine with each other to form a ring, provided that with respect to the benzene ring in formula (Z1), when -$L_1$-$R_1$-$A_1$ is substituted at the para-position relative to sulfonium (S$^+$), $L_1$ is not an oxygen atom (—O—).

2. The actinic ray-sensitive or radiation-sensitive resin composition as claimed in claim 1, wherein the compound represented by formula (Z1) is a compound represented by the following formula (Z2):

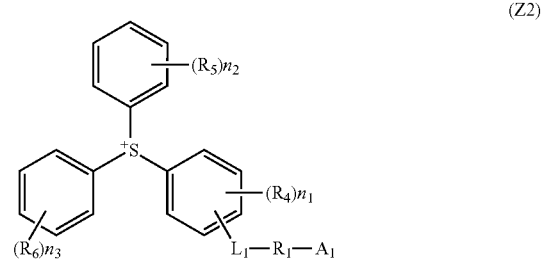

in formula (Z2),
$L_1$, $R_1$, $A_1$, $R_4$ and $n_1$ have the same meanings as $L_1$, $R_1$, $A_1$, $R_4$ and $n_1$ in formula (Z1);

each of $R_5$ and $R_6$ independently represents a monovalent substituent, and each of $n_2$ and $n_3$ independently represents an integer of 0 to 5; and the plurality of $R_4$ when $n_1$ is 2 or more, the plurality of $R_5$ when $n_2$ is 2 or more, or the plurality of $R_6$ when $n_3$ is 2 or more, may be the same or different and may combine with each other to form a ring, $R_4$ and $R_5$, $R_5$ and $R_6$, or $R_4$ and $R_6$ may combine with each other to form a ring, and in this case, each of $R_4$, $R_5$ and $R_6$ may be a single bond;

provided that with respect to the benzene ring in formula (Z2) to which -$L_1$-$R_1$-$A_1$ is bonded, when -$L_1$-$R_1$-$A_1$ is substituted at the para-position relative to S$^+$, $L_1$ is not —O—.

3. The actinic ray-sensitive or radiation-sensitive resin composition as claimed in claim 2,
wherein with respect to the benzene ring in formula (Z2) to which -$L_1$-$R_1$-$A_1$ is bonded, -$L_1$-$R_1$-$A_1$ is substituted at the para-position relative to S$^+$ and $L_1$ is —S—, —OS(=O)$_2$—, —S(=O)$_2$O—, —OC(=O)— or —C(=O)O—.

4. The actinic ray-sensitive or radiation-sensitive resin composition as claimed in claim 2,
wherein with respect to the benzene ring in formula (Z2) to which -$L_1$-$R_1$-$A_1$ is bonded, -$L_1$-$R_1$-$A_1$ is substituted at the meta- or ortho-position relative to S$^+$.

5. The actinic ray-sensitive or radiation-sensitive resin composition as claimed in claim 2,
wherein $A_1$ in formula (Z2) is —SO$_3^-$.

6. The actinic ray-sensitive or radiation-sensitive resin composition as claimed in claim 1,
wherein with respect to the benzene ring in formula (Z1) to which -$L_1$-$R_1$-$A_1$ is bonded, -$L_1$-$R_1$-$A_1$ is substituted at the para-position relative to S$^+$ and $L_1$ is —S—, —OS(=O)$_2$—, —S(=O)$_2$O—, —OC(=O)— or —C(=O)O—.

7. The actinic ray-sensitive or radiation-sensitive resin composition as claimed in claim 1,
wherein with respect to the benzene ring in formula (Z1) to which -$L_1$-$R_1$-$A_1$ is bonded, -$L_1$-$R_1$-$A_1$ is substituted at the meta- or ortho-position relative to S$^+$.

8. The actinic ray-sensitive or radiation-sensitive resin composition as claimed in claim 1,
wherein $A_1$ in formula (Z1) is —SO$_3^-$.

9. The actinic ray-sensitive or radiation-sensitive resin composition as claimed in claim 1, further containing a resin capable of decomposing by an action of an acid to increase the solubility in an alkali developer.

10. The actinic ray-sensitive or radiation-sensitive resin composition as claimed in claim 1, further containing a resin soluble in an alkali developer and an acid crosslinking agent that is caused to crosslink with the resin soluble in an alkali developer by an action of an acid.

11. A resist film formed using the actinic ray-sensitive or radiation-sensitive resin composition claimed in claim 1.

12. A pattern forming method comprising a step of forming a film by using the actinic ray-sensitive or radiation-sensitive resin composition claimed in claim 1, a step of exposing the film, and a step of developing the exposed film.

13. The pattern forming method as claimed in claim 12, wherein the exposure is performed using an X-ray, an electron beam or EUV.

14. A method for manufacturing an electronic device, comprising the pattern forming method claimed in claim 12.

* * * * *